United States Patent [19]
Goyal et al.

[11] Patent Number: 5,964,966
[45] Date of Patent: Oct. 12, 1999

[54] METHOD OF FORMING BIAXIALLY TEXTURED ALLOY SUBSTRATES AND DEVICES THEREON

[75] Inventors: Amit Goyal; Eliot D. Specht; Donald M. Kroeger; Mariappan Paranthaman, all of Knoxville, Tenn.

[73] Assignee: Lockheed Martin Energy Research Corporation, Oak Ridge, Tenn.

[21] Appl. No.: 08/934,328

[22] Filed: Sep. 19, 1997

[51] Int. Cl.[6] .................................................. G22C 19/03
[52] U.S. Cl. .......................... 148/426; 148/427; 148/428; 148/429; 420/441; 420/442; 420/445; 420/447; 420/460
[58] Field of Search .................................... 420/441, 442, 420/445, 457, 460; 148/426–429

[56] References Cited

U.S. PATENT DOCUMENTS

| | | | |
|---|---|---|---|
| 3,770,497 | 11/1973 | Hassler et al. | |
| 5,212,148 | 5/1993 | Roas et al. | 505/1 |
| 5,248,662 | 9/1993 | Yoshida et al. | 505/1 |
| 5,290,761 | 3/1994 | Keating et al. | 505/1 |
| 5,312,804 | 5/1994 | Petitbon et al. | 505/434 |
| 5,372,089 | 12/1994 | Yoshida et al. | 117/98 |
| 5,432,151 | 7/1995 | Russo et al. | 505/474 |
| 5,529,981 | 6/1996 | Holloway | 505/400 |
| 5,739,086 | 4/1998 | Goyal et al. | 505/473 |
| 5,741,377 | 4/1998 | Goyal et al. | 148/512 |

FOREIGN PATENT DOCUMENTS

| | | | |
|---|---|---|---|
| 697916 | 11/1964 | Canada | 75/122 |
| O 1100-818 | 10/1987 | Japan . | |
| O 1100-820 | 10/1987 | Japan . | |
| 6-139848 | 5/1994 | Japan . | |

OTHER PUBLICATIONS

K. Sato, et al., "High-$J_c$ Silver–Sheathed Bi–Based Superconducting Wires", *IEEE Transactions on Magnetics*, 27 (1991) 1231.

K. Heine, et al., "High–Field Critical Current Densities in $Bi_2Sr_2Ca_1Cu_2O_8$+x/Ag Wires", *Applied Physics Letters*, 55 (1989) 2441.

R. Flukiger, et al., "High Critical Current Densities in Bi(2223)/Ag Tapes", *Superconductor Science & Technology*, 5 (1992) S61.

D. Dijkkamp, et al., "Preparation of Y–Ba–Cu Oxide Superconducting Thin Films Using Pulsed Laser Evaporation from High Tc Bulk Material", *Applied Physics Letters*, 51, 619 (1987).

S. Mahajan, et al., "Effects of Target and Template Layer on the Properties of Highly Crystalline Superconducting a–Axis Films of $YBa_2$–$Cu_3$–$O_7$ by DC–Sputtering", *Physica C.*, 213, 445 (1993).

A. Inam, et al., "A–axis Oriented Epitaxial $YBa_2$–$Cu_3$–$O_7$–$PrBa_2Cu_3O_7$ Heterostructures", *Applied Physics Letters*, 57, 2484 (1990).

(List continued on next page.)

*Primary Examiner*—Robert Kunemund
*Assistant Examiner*—Donald L. Champagne
*Attorney, Agent, or Firm*—Quarles & Brady LLP

[57] ABSTRACT

Specific alloys, in particular Ni-based alloys, that can be biaxially textured, with a well-developed, single component texture are disclosed. These alloys have a significantly reduced Curie point, which is very desirable from the point of view of superconductivity applications. The biaxially textured alloy substrates also possess greatly enhanced mechanical properties (yield strength, ultimate tensile strength) which are essential for most applications, in particular, superconductors. A method is disclosed for producing complex multicomponent alloys which have the ideal physical properties for specific applications, such as lattice parameter, degree of magnetism and mechanical strength, and which cannot be fabricated in textured form. In addition, a method for making ultra thin biaxially textured substrates with complex compositions is disclosed.

20 Claims, 52 Drawing Sheets

Ni(93)Cr(7)

OTHER PUBLICATIONS

R.E. Russo, et al., "Metal Buffer Layers and Y–Ba–Cu–O Thin Films on Pt and Stainless Steel Using Pulsed Laser Deposition", *Journal of Applied Physics,* 68, 1354 (1990).

E. Narumi, et al., "Superconducting $YBa_2Cu_3O_{6.8}$ Films on Metallic Substrates Using In Situ Laser Deposition", *Applied Physics Letters,* 56, 2684 (1990).

J.D. Budai, et al."In–Plane Epitaxial Alignment of $YBa2-Cu_3-O_{7-x}$ Films Grown on Silver Crystals and Buffer Layers", *Applied Physics Letters,* 62, 1836 (1993).

T.J. Doi, et al., "A New Type of Superconducting Wire; Biaxially Oriented $Tl_1(Ba_{0.8}Sr_{0.2})_2Ca_2Cu_3O_9$ on [100]<100> Textured Silver Tape", Proceedings of 7th International Symposium on Superconductivity, Fukuoka, Japan, Nov. 8–11, 1994.

D. Forbes, Executive Editor, "Hitachi Reports 1–meter Tl–1223 Tape Made by Spray Pyrolysi", *Superconductor Week,* vol. 9, No. 8, Mar. 6, 1995.

*Recrystallization Grain Growth and Textures,* Papers presented at a seminar of the American Society for Metals, Oct. 16 and 17, 1965, American Society for Metals, Metals Park Ohio. (List of titles=Table of Contents only).

A. Goyal et al., "High Critical Current Density Superconducting Tapes by Epitaxial of $YBa_2Cu_3Ox$ Thick Films on Biaxially Textured Metal Substrates", *Appl. Phys. Lett.,* 69, 1795 (1996).

D. P. Norton et al., "Epitaxial $YBa_2Cu_3O_x$ on Biaxially Textured Biaxially Textured (001) Ni: An Approach to High Critical Current Density Superconducting Tape", *Science,* 274, 755 (1996).

M. Paranphaman et al., "Growth of Biaxially Textured Buffered Layers on Rolled Ni Substrates by Electron Beam Evaporation", *Physica C.,* 275, 266 (1997).

R.P. Reade et al., "Laser Deposition of Biaxially Textured Yttria–stabilized Zirconia Buffer Layers on Polycrystalline Metallic Alloys for High Critical Current Y–Ba–Cu–O Thin Films", *Applied Physical Letters,* 61, 2231–233 (1992).

D. Dimos et al., "Orientation Dependence of Grain–Boundary Critical Currents in $Yba_2Cu_3O_{7-\varsigma}$ Bicrystals", *Physical Review Letters,* vol. 61, No. 2 (Jul. 11, 1988).

D. Dimos et al., "Superconducting Transport Properties of Grain Boundaries in $Yba_2Cu_3O_7$ Bicrystals", *Physical Review B,* 41, 4038 (1990).

Y. Iijima, et al., "Structural and Transport Properties of Biaxially Aligned $YBa_2Cu_3O_{7-x}$ Films on Polycrystaline Ni–Based Alloy with Ion–Beam Modified Buffer Layers", *Journal of Applied Physics,* 74, 1905 (1993).

A. Ginsbach et al., "Growth of C–Axis Oriented YbaCuO Films on Oxidized Textured Ni Sheets and on (100) and (110) Oriented NiO Single Crystals", *IEEE Treansactions on Magnetics,* vol. 27, 1410 (1991).

Ni(93)Cr(7)

Ni(80)Cr(20)

Ni(87)Cr(13)

Ni(95)W(5)

Ni(90)W(10)

Ni(95)Al(5)

Ni(93)Al(7)

Ni(90)Al(10)

Ni(91)Cr(7)Al(2)

Ni(89)Cr(7)Al(4)

Ni(83)Cr(7)Al(10)

Ni(85)Cr(13)Al(2)

Ni(83)Cr(13)Al(4)

Ni(93)W(5)Al(2)

Ni(91)W (5)Al(4)

Ni(70)Cu(30)

METHOD OF FORMING BIAXIALLY TEXTURED ALLOY SUBSTRATES AND DEVICES THEREON

This invention was made with government support under contract DE-AC05-96OR22464, awarded by the United States Department of Energy to Lockheed Martin Energy Research Corporation, and the United States Government has certain rights in this invention.

FIELD OF THE INVENTION

The present invention is related to biaxially textured metallic substrates and articles made therefrom, and more particularly to methods of forming substrates and articles having a biaxial texture.

BACKGROUND OF THE INVENTION

Since the discovery of high oxide superconducting materials having critical temperatures that exceed the temperature of liquid nitrogen, there has been a concerted effort to utilize these materials for various applications. Although many applications are aimed at replacing conventional superconductors in wires and electronic devices, new applications using bulk materials also have been proposed. These applications include, for example, use in energy storage devices such as flywheels, use in current leads for superconducting magnets, and in magnetic bearings, bulk magnets, and magnetic resonance imaging machines (MRI).

For applications such as those noted in the proceeding paragraph, high temperature superconducting materials with large critical current density ($J_c$) are required. One such high temperature superconducting material is a composite oxide of RE, Ba and $Cu_1$ (ReBCO) and in particular, $REBa_2CU_3O_x$ (wherein RE represents at least one of the following rare earth elements: Y, La, Sm, Nd, Eu, Gd, Dy, Ho, Er, Tm, Yb, or Lu).

Current materials research aimed at fabricating high temperature superconducting ceramics in conductor configurations for bulk, practical applications, is largely focused on powder-in-tube methods. Such methods have proven quite successful for the Bi—(Pb)—Sr—Ca—Cu—O (BSCCO) family of superconductors due to their unique mica-like mechanical deformation characteristics. In high magnetic fields, however, this family of superconductors is generally limited to applications below 30° K. In the ReBCO Tl—(Pb, Bi)—Sr—(Ba)—Ca—Cu—O and Hg—(Pb)—Sr—(Ba)—Ca—Cu—O families of superconductors, some of the compounds have much higher intrinsic limits and can be used at higher temperatures.

It has been demonstrated that these superconductors possess high critical current densities ($J_c$) at high temperatures when fabricated as single crystals or in essentially single-crystal form as epitaxial films on single crystal substrates such as $SrTiO_3$ and $LaAlO_3$. These superconductors have so far been intractable to conventional ceramics and materials processing techniques to form long lengths of conductor with a $J_c$ comparable to epitaxial films. This is primarily because of the "weak-link" effect.

It has been demonstrated that with ReBCO, biaxial texture is necessary to obtain high transport critical current densities. High $J_c$'s have been reported in polycrystalline ReBCO in thin films deposited in special substrates on which a biaxially textured non-superconducting oxide buffer layer is first deposited using ion-beam assisted deposition (IBAD) techniques. However, IBAD is a slow, expensive process, and difficult to scale up for production of lengths adequate for many applications.

High $J_c$'s have also been reported in polycrystalline ReBCO melt-processed bulk material which contains primarily small angle grain boundaries. Melt processing is also considered too slow for production of practical lengths.

Thin-film materials having perovskite-like structures are important in superconductivity, ferroelectrics, and electro-optics. Many applications using these materials require, or would be significantly improved by single crystal, c-axis oriented perovskite-like films grown on single-crystal or highly aligned metal or metal-coated substrates. For instance, Y—$Ba_2$—$Cu_3$—O__ (YBCO) is an important superconducting material for the development of superconducting current leads, transmission lines, motor and magnetic windings, and other electrical conductor applications. When cooled below their transition temperature, superconducting materials have no electrical resistance and carry electrical current without heating up.

One technique for fabricating a superconducting wire or tape is to deposit a YBCO film on a metallic substrate. Superconducting YBCO has been deposited on polycrystalline metals in which the YBCO is c-axis oriented, but not aligned in-plane. To carry high electrical currents and remain superconducting, however, the YBCO films must be biaxially textured, preferably c-axis oriented, with effectively no large-angle grain boundaries, since such grain boundaries are detrimental to the current-carrying capability of the material. YBCO films deposited on polycrystalline metal substrates do not generally meet this criterion.

Many electronic, magnetic, or superconductor device applications require control of the grain boundary character of the device materials. For example, grain boundary character is very important in high temperature superconductors. The effects of grain boundary characteristics on current transmission have been clearly demonstrated for certain materials, for example, the material known as Y123. See Dimos, et al. (1988) Phys. Rev. Lett. 61:219; and Dimos, et al. (1990) Phys. Rev. Lett. 41:4038.

For clean, stoichiometric boundaries, the grain boundary critical current ($J_c(gb)$) appears to be determined primarily by grain boundary misorientation. The dependence of $J_c(gb)$ on misorientation angle for Y123 has been determined by Dimos et al., supra, for grain boundary types which can be formed in epitaxial films on bicrystal substrates. These include [001] tilt, [100] tilt, and [100] twist boundaries. In each case, however, high angle boundaries were found to be weak-linked.

Recently, the Dimos work has been extended to artificially fabricated [001] tilt bicrystals in $Tl_2Ba2CaCu_2O_8$ (A. H. Cardona, et al., Appl. Phys. Lett., 62 (4), 411, 1993)), $Nd_{85}Ce_{0.15}CuO_4$, $Tl_2Ba_2Ca_2Cu_3O_x$ (M. Kawasaki, et al., Appl. Phys. Lett., 62 (4), 417 (1993)), and $TlBa_2Ca_2Cu_2O_x$ (T. Nabatame, et al., Appl. Phys. Lett. 65 (6), 776 (1994)). In each of these cases, it was found that, as in the case of Y123, $J_c$ depends strongly on grain boundary misorientation angle. Although no measurements have been made on the material known as Bi-2223, data on current transmission across artificially fabricated grain boundaries in the material termed Bi-2212 indicate that most large angle [001] tilt (M. Kawasaki, et al., Appl. Phys. Lett., 62 (4), 417 (1993)) and twist boundaries are weak links, with the exception of some coincident site lattice (CSL) related boundaries (N. Tomita, et al., Jpn. J. Appl. Phys., 29 (1990) L30; N. Tomita, et al., Jpn. J. Appl. Phys., 31, L942 (1992); J. L. Wang, et al., Physica C, 230, 189 (1994)). It is likely that the variation in $J_c$ with grain boundary misorientation in materials Bi-2212 and Bi-2223 is similar to that observed in the well characterized cases of Y123 and Tl-based superconductors.

Hence, in order to fabricate high temperature superconductors with very critical current densities, it will be necessary to biaxially align all the grains. This has been shown to result in significant improvement in the superconducting properties of YBCO films (Y. Iijima, et al., Appl. Phys., 74, 1905 (1993); R. P. Reade et. al., Appl. Phys. Lett., 61, 2231 (1992); X. D. Wu, et al., Appl. Phys. Lett., 65, 1961 (1994).

In U.S. patent application Ser. No. 08/419,583, now issued as U.S. Pat. No. 5,741,377, which is incorporated by reference herein, we disclosed biaxially textured articles which comprise a rolled and annealed metal surface having a face-centered cubic (FCC), body centered cubic (BCC) or hexagonal close-packed (HCP) crystalline structure and a biaxially textured layer of an electronic device on a surface thereof. For example Cu with a sharp cube texture was obtained by deforming Cu by large amounts (90%) followed by recrystallization. However, this was possible only in high purity Cu, Ni or Al. Even small amounts of impurity elements (e.g., 0.0025% P, 0.3% Sb, 0.18% Cd, 047% As, 1% Sn, 0.5% Be, or the like) can severely suppress the formation of the cube texture.

When a polycrystalline material is subjected to the rolling process, plastic flow causes reorientation of the lattice of individual grains of the polycrystalline material and tends to develop a texture or preferred orientation of the lattice in the grains. The progress of reorientation is gradual; the orientation change proceeds as plastic flow continues, until a texture is reached that is stable against indefinite continued flow of a given type. The nature of the stable deformation texture and the manner in which it is approached is characteristic of the material and of the nature of the flow throughout the deformation process (i.e., the magnitude of the three principal strains at all points within the specimen and at successive times during the process). The texture development is strongly influenced by temperature, particularly if the temperature of deformation is high enough for recrystallization to take place. Other effects of temperature include variation of the stacking fault energy and hence the operative deformation mechanisms. In general, plastic strains near the surface of a rolled specimen may differ from those in the interior and may produce textures that vary with depth below the surface. Hence specific rolling procedures, which are described herein below, are used to ensure reasonably consistent textures through the thickness of the work piece.

While forward rolling alone may result in homogeneous texture through the thickness of the sheet, we have found that reverse rolling (rolling direction is reversed after each pass) produces much better results in most materials. In most of what is described below, reverse rolling is preferred over forward rolling. The rolling speed and reduction per pass are also important parameters. While rolling speed may be important in the texture development, its effect is not dominating. In general, higher rolling speeds are desirable for economical purposes. Reduction per pass during rolling is also important for texture development. Generally, less than 30% reduction per pass is desirable, although in some cases higher reductions per pass may also be required. The lubrication employed during rolling is also an important variable. Depending on the texture desired, either no lubricant or some lubricant like light mineral oil, heavy mineral oil, kerosene, etc. are employed to ensure homogeneous texture development. Grain size of the starting material and prior heat treatments and deformation history is also important in determining the texture development. In general, prior to rolling, a fine grain size is desired and the initial heat treatments and deformations are designed to give a random texture in the starting material.

The development of an annealing texture involves several fundamental mechanisms. An annealing texture may develop from recovery without recrystallization (in which case it would be expected to duplicate the texture present before annealing), from primary recrystallization, or from grain growth subsequent to recrystallization. Grain size distribution can remain normal throughout the process, or a few grains may grow very large while the rest remain approximately unchanged until devoured by the large ones. The latter type of grain growth, referred to as "secondary recrystallization" or "discontinuous", is generally considered to be abnormal.

It is known that the critical current density through a grain boundary may be reduced significantly for misorientation angles greater than 5°–10°. It is thus desirable to obtain superconducting deposits in which the number of grain boundaries with misorientation angles greater than 5°–10° is minimized. For conductors in which the superconducting deposit is epitaxial with an underlying metallic or oxide buffer layer or substrate, it is desirable to minimize the number of grain boundaries with misorientations greater than 5°–10°. This is accomplished if the texture of the substrate is so sharp that grain orientations vary by no more than 5°–10°. Useful superconducting layers may be obtained using substrates with larger spread in grain orientation, but the better the substrate texture, the better the properties of the superconductor deposit are expected to be.

In a cube texture, the cube plane, (100), lies parallel to the plane of the sheet and a cube edge, [001], is parallel to the rolling direction, i.e. {100}<001>. This texture resembles a single crystal with subgrains, but may contain a minor amount of material in twin relation to the principal orientation. A fully developed cube texture, as described herein, has been developed with biaxial alignment with x-ray diffraction peak width of 8–30° full width at half maximum.

A method to produce biaxially textured substrates has been proposed to produce a sharp cube texture on FCC metals like copper (Cu) or nickel (Ni). In this process, the metal is first thermomechanically textured, followed by epitaxial growth of additional metal or ceramic layers. Epitaxial YBCO films grown on such substrates resulted in high critical current $J_c$. However, the nature of the substrate was inadequate for being useful in many applications such as superconductors.

The preferred substrate used in the prior process comprised high purity Ni. Since Ni is ferromagnetic, the substrate as a whole is magnetic, which can cause significant problems in practical applications involving superconductors. In addition, the thermal expansion of the Ni substrate used in the process dominates that of most ceramic layers desired for practical applications. This mismatch can result in cracking which can limit its usefulness. Closer matching of the lattice parameter of the Ni and the ceramic layer material can prevent cracking and other stress related defects, as well as effects (e.g. delamination), in the ceramic films. However, this would require modification of the lattice parameter to be closer to that of the ceramic layers. Lastly, annealed, well textured, high purity Ni is very weak. For most applications involving superconducting tapes or wires, the conductor should be able withstand certain Lorentz forces during operation. Significant improvements in strain tolerance, handleability and strength of the textured substrates are required.

Thus, there is a need to provide new biaxially textured substrates for use in many applications, such as superconductors, and methods of making such substrates.

For further background information, refer to the following publications:

1. K. Sato, et al., "High-$J_c$ Silver-Sheathed Bi-Based Superconducting Wires", JEFE Transactions on Magnetics, 27 (1991) 1231.
2. K. Heine, et al., "High-Field Critical Current Densities in $Bl_2Sr_2Ca_1Cu_2O_8$+x/Ag Wires", Applied Physics Letters, 55 (1991) 2441.
3. R. Flukiger, et al., "High Critical Current Densities in Bi(2223)/Ag Tapes", Superconductor Science & Technology, 5 (1992) S61.
4. D. Dijkkamp, et al., "Preparation of Y—Ba—Cu Oxide Superconducting Thin Films Using Pulsed Laser Evaporation from High Te Bulk Material", Applied Physics Letters, 51, 619 (1987).
5. S. Mahajan, et al., "Effects of Target and Template Layer on the Properties of Highly Crystalline Superconducting a-Axis Films of $YBa_2$—$Cu_3$—$O_7$ by DC-Sputtering", Physica C., 213, 445 (1993).
6. A. Inam, et al., "A-axis Oriented Epitaxial $YBa_2$—$Cu_3$—$O_7$—$PrBa_2Cu_3O_7$ Heterostructures", Applied Physics Letters, 57, 2484 (1990).
7. R. E. Russo, et al., "Metal Buffer Layers and Y—Ba—Cu—O Thin Films on Pt and Stainless Steel Using Pulsed Laser Deposition", Journal of Applied Physics, 68, 1354 (1990).
8. E. Narumi, et al., "Superconducting $YBa_2Cu_3O$_ Films on Metallic Substrates Using In Situ Laser Deposition", Applied Physics Letters, 56, 2684 (1990).
9. J. D. Budai, et al. "In-Plane Epitaxial Alignment of YBa2—$Cu_3$—$O_7$ Films Grown on Silver Crystals and Buffer Layers", Applied Physics Letters, 62, 1836 (1993).
10. T. J. Doi, et al., "A New Type of Superconducting Wire; Biaxially Oriented $Tl1(Ba_{0.8}Sr_{0.2})_2Ca_2Cu_3O_7$ on [100]<100> Texture Silver Tape", Proceedings of 7th International Symposium on Superconductivity, Fukuoka, Japan, Nov. 8–11, 1994.
11. D. Forbes, Executive Editor "Hitachi Reports 1-meter Tl-1 223 Tape Made by Spray Pyrolysis", Superconductor Week, Vol. 9, No. 8, Mar. 6, 1995.
12. Recrystallization Grain Growth and Textures, Papers presented at a seminar of the American Society for Metals, Oct. 16 and 17, 1965, American Society for Metals, Metals Park, Ohio.
13. A. Goyal et al., "High Critical Current Density Superconducting Tapes by Epitaxial of $YBa_2Cu_3O_x$ Thick Films on Biaxially Textured Metal Substrates", Appl. Phys. Lett., 69, 1795 (1996).
14. D. P. Norton et al., "Epitaxial $YBa_2Cu_3O_x$ on Biaxially Textured Biaxially Textured (001) Ni: An Approach to High Critical Current Density Superconducting Tape", Science, 274, 755 (1996).
15. M. Paranthaman et al., "Growth of Biaxially Textured Buffered Layers on Rolled Ni Substrates by Electron Beam Evaporation" Physica C., 275, 266(1997).

BRIEF SUMMARY OF THE INVENTION

It is an object of the present invention to provide biaxially textured metallic substrates of specific Ni alloys comprising a particular atomic percent (at %) of a Group VB metal, a Group VIB metal, and, titanium (Ti), tin (Sn), aluminum (Al), copper (Cu) and zinc (Zn).

It is a further object to disclose biaxially textured substrates comprising substrates of a binary Ni alloy having a specific percentage of W, Cu, Al, Ti, molybdenum (Mo), chromium (Cr), vanadium (V), tantalum (Ta), Sn, or Zn.

It is another object to disclose biaxially textured substrates of Ni alloys having a stacking fault frequency parameter (SFFP) less than 0.01.

The preferred substrates of the present invention are biaxially textured articles comprised of an alloy of Ni and a Group VB metal containing up to 15 at % of the Group VB metal and an alloy of Ni and a Group VIB metal containing up to 20 at % of the Group VIB metal. Other substrates of the present invention are those comprising an alloy selected from the group consisting of an alloy of Ni and Cu containing up to 55 at % Cu, an alloy of Ni and Sn containing no more than 10 at % Sn; an alloy of Ni and Al containing up to 10 at % Al, an alloy of Ni and Zn containing up to 25 at % Zn, and an alloy of Ni and Ti containing up to 12 at % Ti. Besides the binary alloys described above, ternary alloys or alloys containing any of the elements listed above in amounts less than that stated for the binary alloys are included in this invention.

By controlling the composition of the alloys, the biaxially textured substrates of this invention can be made to have certain degrees of magnetism, mechanical strength, lattice parameter and thermal expansion. The biaxially textured alloys can then be used as a substrate on which various epitaxial layers including oxides, nitrides, or an epitaxial electronic device layer can be deposited.

It also is an object of the present invention to provide novel methods for fabricating biaxially textured sheets of alloys with desirable compositions for use in devices employed in certain electronics, magnetic, or superconductor applications. Since not all compositions of alloys can be rolled and annealed to produce a sharp biaxial texture, a unique method to fabricate biaxially textured substrates without mechanical deformation is disclosed.

It is yet another object of the subject invention to provide a method for depositing an epitaxial layer on a biaxially textured alloy substrate wherein the method comprises using high rate evaporation of multi component alloys from a single source by electron beam evaporation through W to deposit the epitaxial layer.

Still further, the subject invention includes methods for forming very thin biaxially textured article substrates for use in applications where a small cross-sectional area is desired, i.e., for high engineering critical current density applications for superconducting wires.

The biaxially textured articles of the present invention can provide for the production of a suitable substrate with desired physical properties for various electromagnetic applications.

Further objects of the invention will become apparent from the description and figures provided herein.

Cr-4% Al ternary alloy sample. The 0.5% offset yield stress is slightly over 220 MPa and the ultimate tensile stress is 657 MPa.

Figure 38:
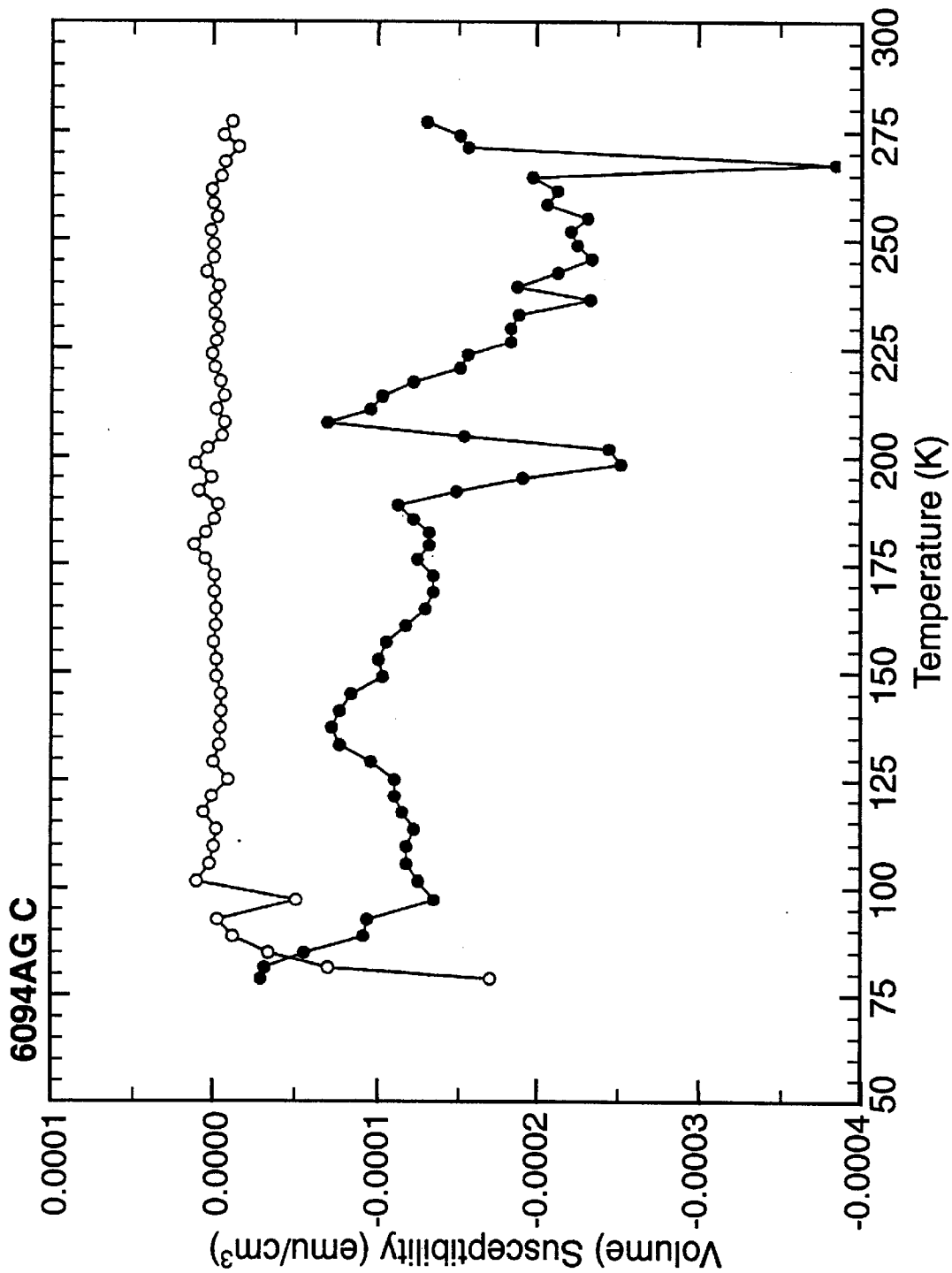

FIG. 38 shows magnetic susceptibility data for a cube textured Ni-13% Cr-10% Al ternary alloy sample. Open circles are imaginary components and closed circles are real components of the susceptibility. The sample is essentially non-magnetic above 77 K.

Figure 39:
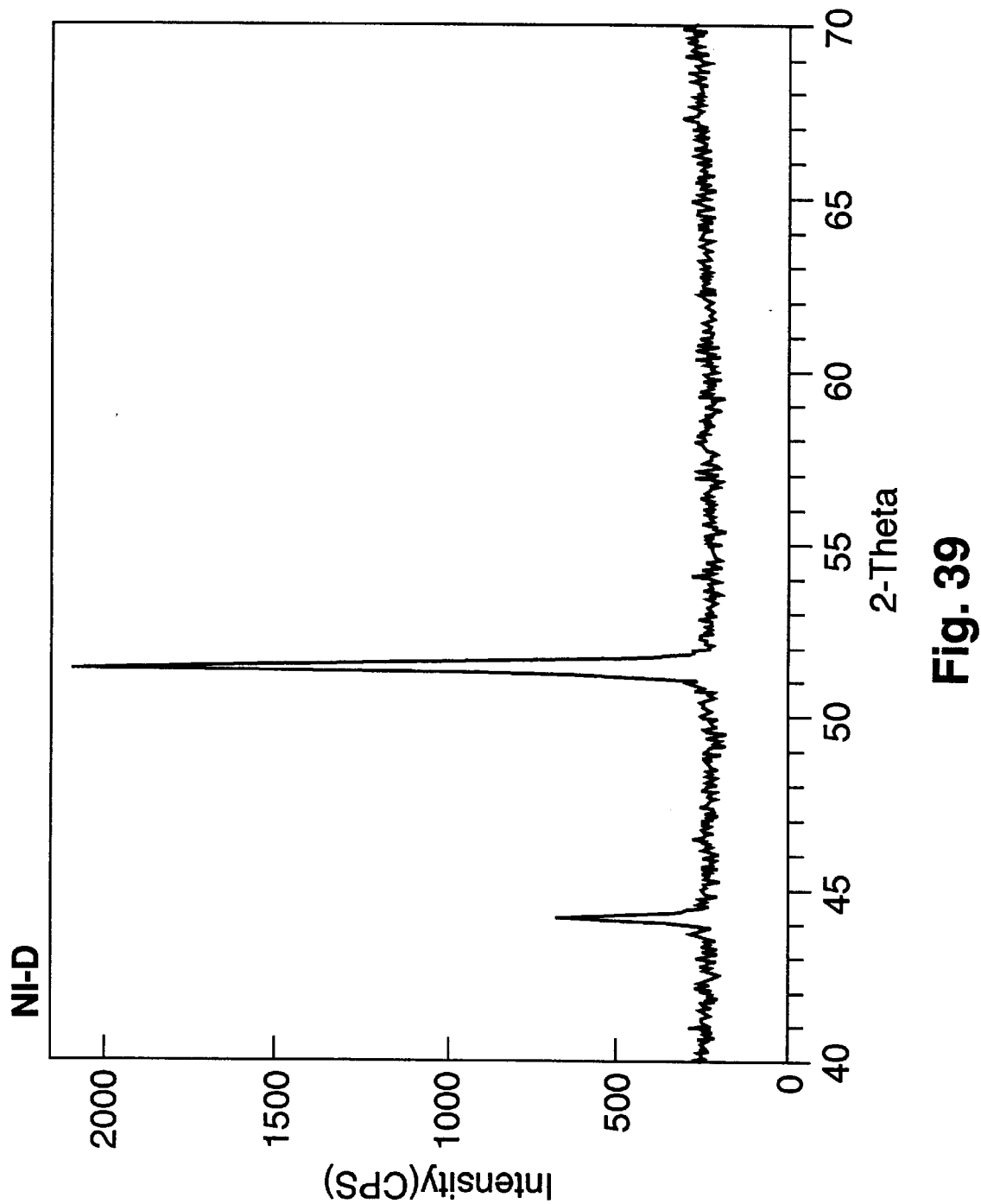

FIG. 39 shows a θ-2θ plot for a Ni-13% Cr-10% Al ternary alloy, rolled to a deformation of ~95% and annealed at 900° C. for 2 hrs. No cube texture is present.

Figure 40:
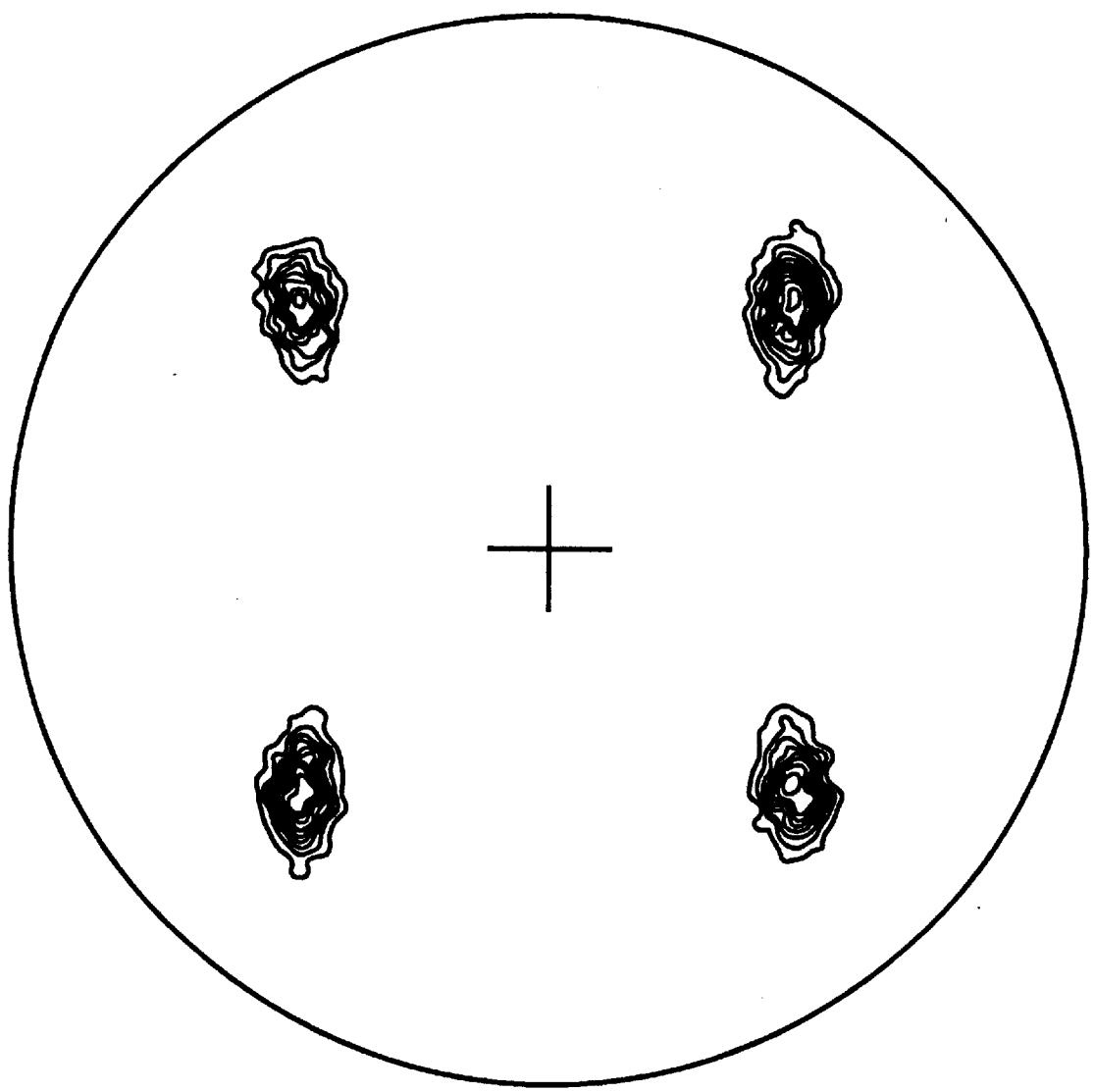

FIG. 40 shows a (111) X-ray pole figure for a cube textured Ni-5% W-2% Al ternary alloy, deformed to reduction of ~95% by rolling followed by annealing at 900° C. for 2 hrs.

Figure 41:
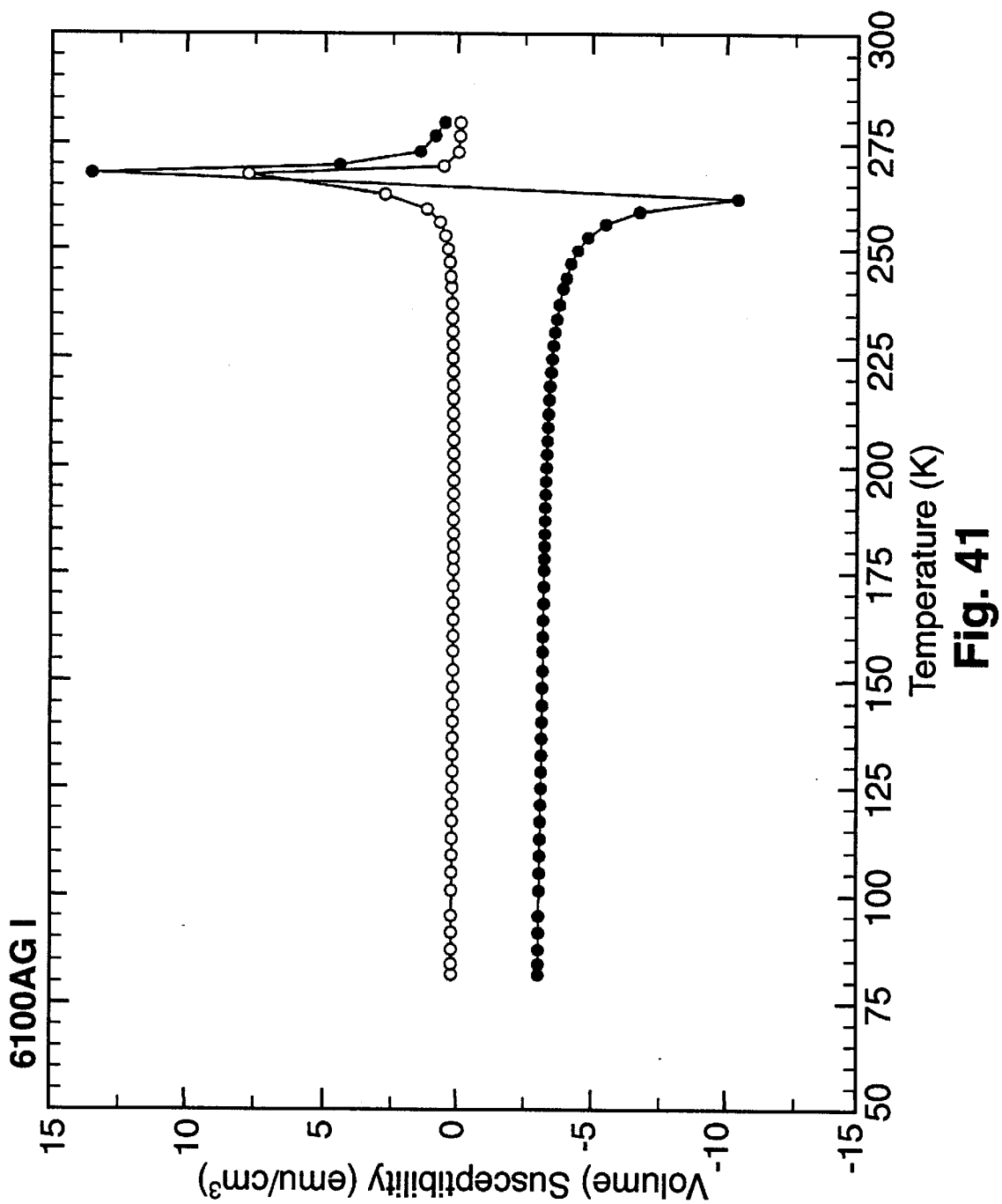

FIG. 41 shows magnetic susceptibility data for the sample shown in FIG. 40. Open circles are imaginary components and closed circles are real components of the susceptibility. The Curie point has been reduced to around 260 K.

Figure 42:
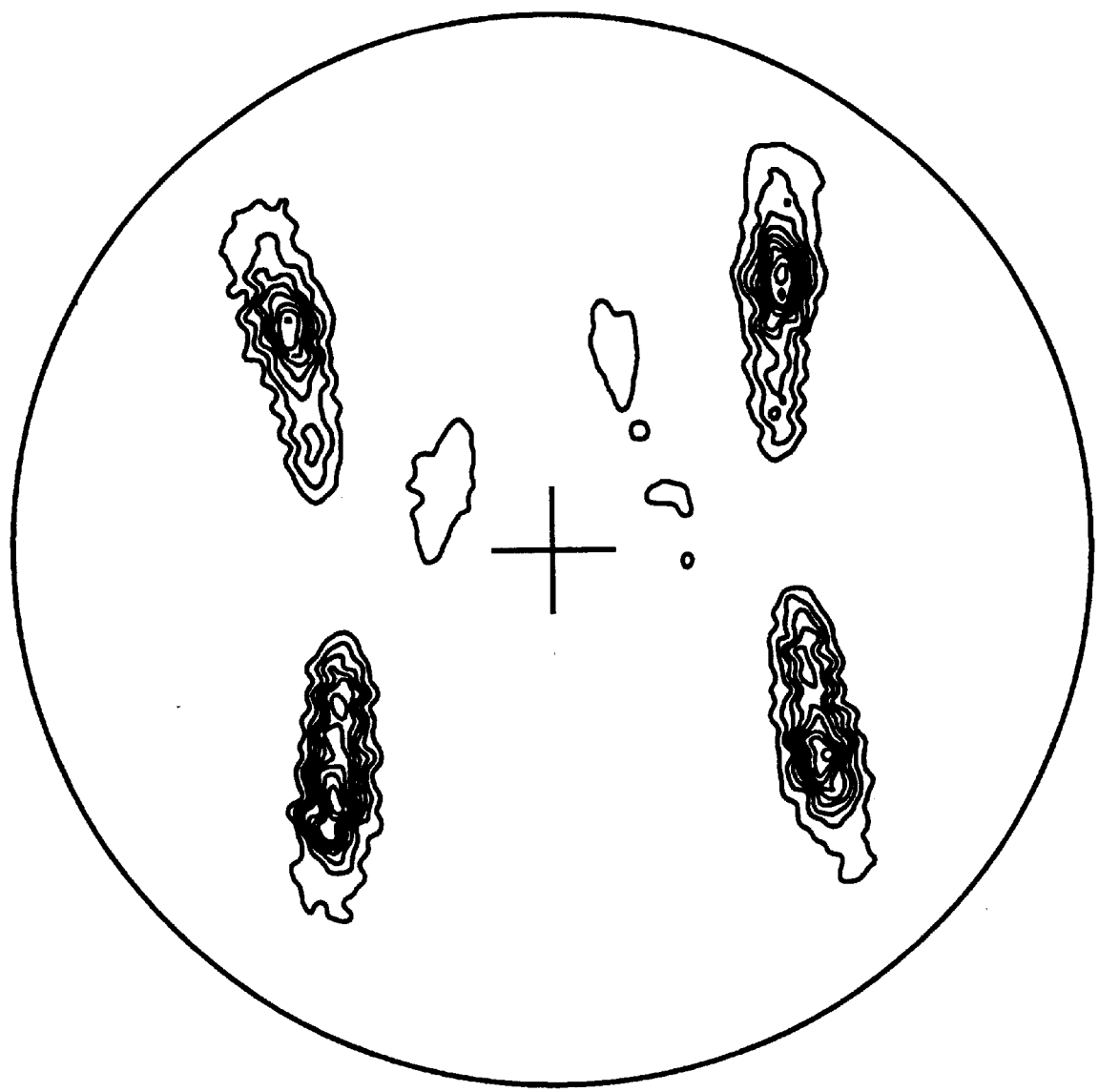

FIG. 42 shows a (111) X-ray pole figure for a cube textured Ni-5% W4% Al ternary alloy, deformed to reduction of ~95% by rolling followed by annealing at 900° C. for 2 hrs.

Figure 43:
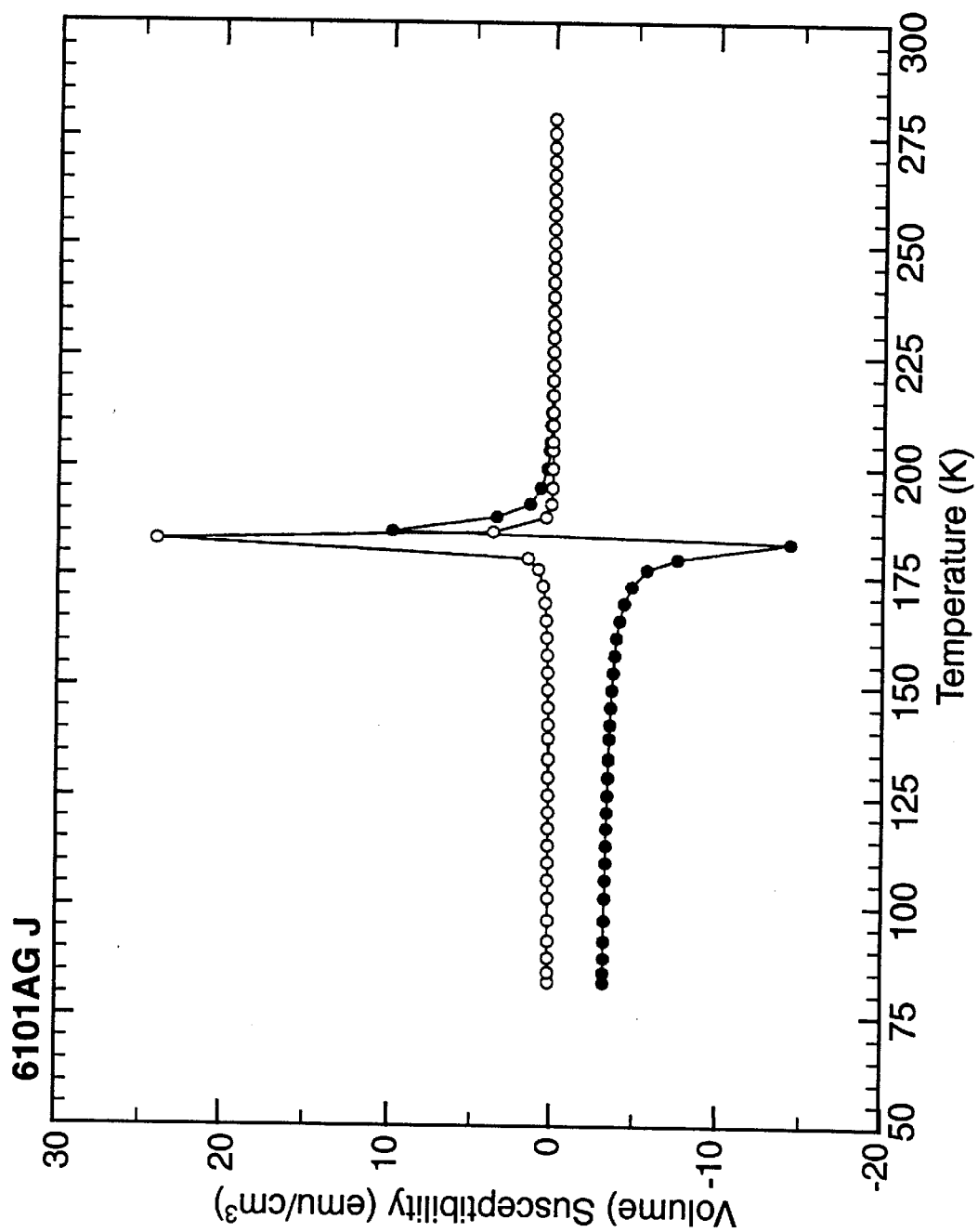

FIG. 43 shows magnetic susceptibility data for the sample shown in FIG. 42. Open circles are imaginary components and closed circles are real components of the susceptibility. The Curie point has been reduced to around 180 K.

Figure 44:
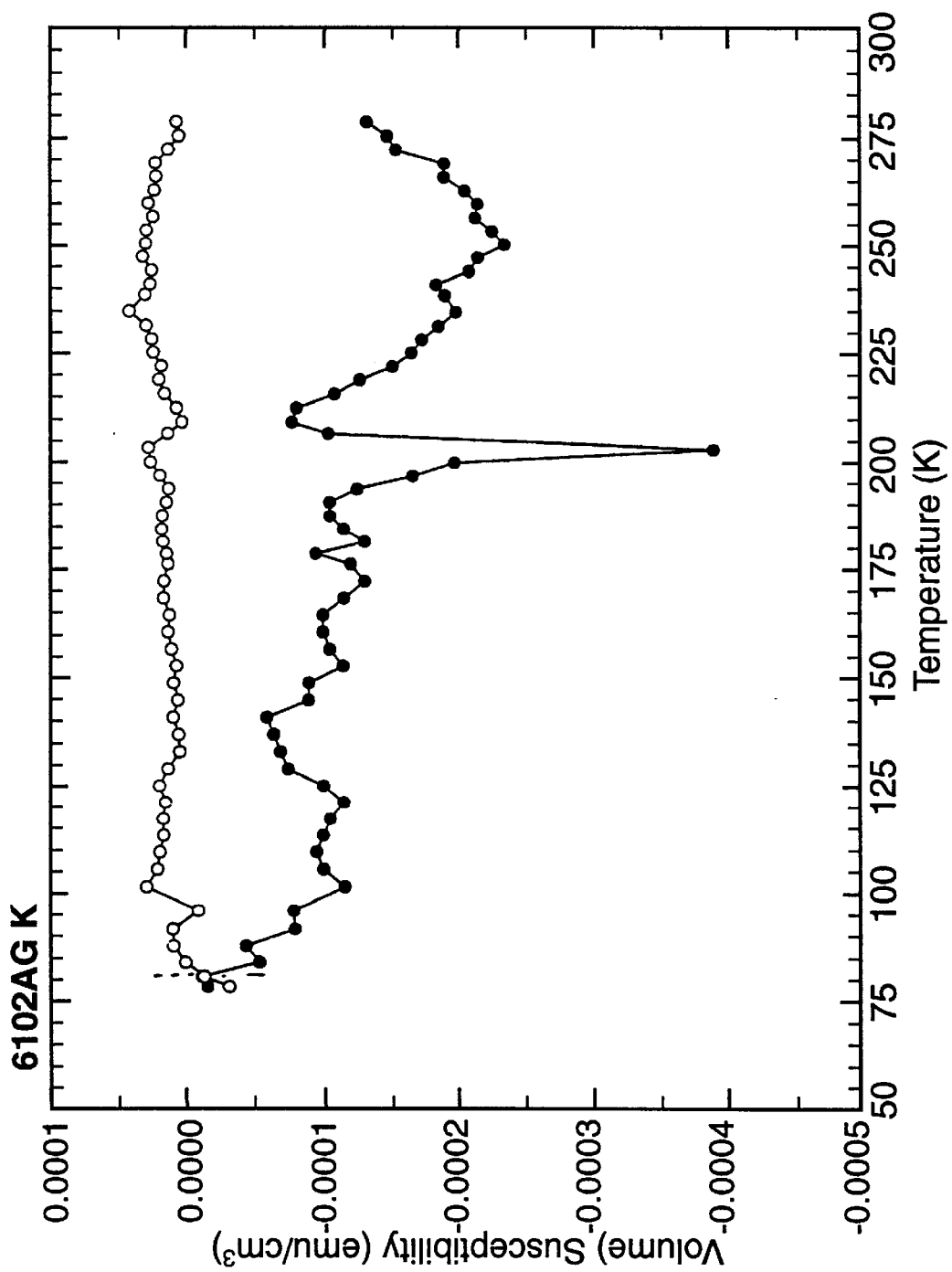

FIG. 44 shows magnetic susceptibility data for a rolled and annealed Ni-10% W-2% Al sample. Open circles are imaginary components and closed A circles are real components of the susceptibility. The sample is essentially non-magnetic at 77 K.

Figure 45:
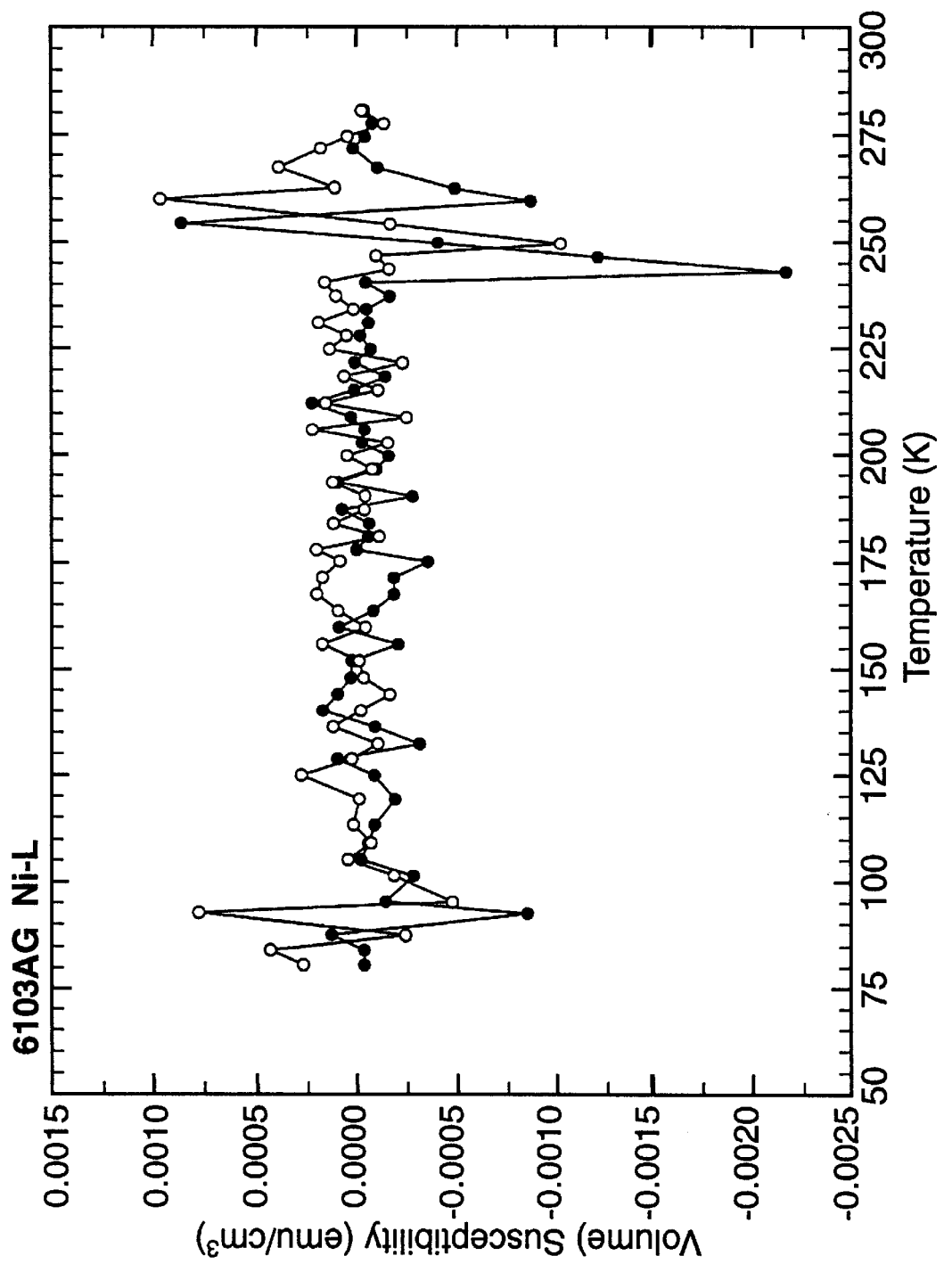

FIG. 45 shows magnetic susceptibility data for a rolled and annealed Ni-10% W-4% Al sample. Open circles are imaginary components and closed circles are real components of the susceptibility. The sample is essentially non-magnetic at 77 K.

Figure 46:
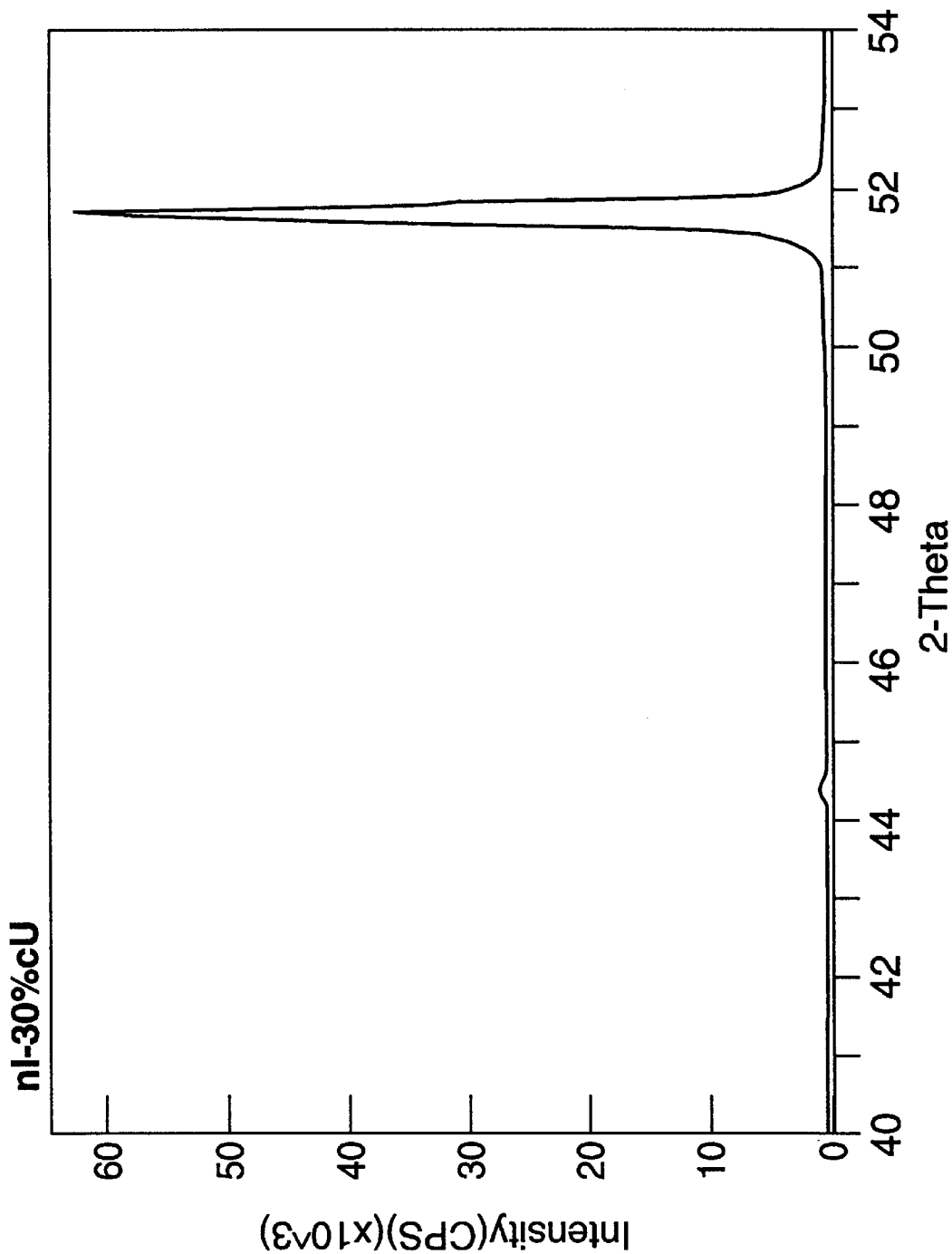

FIG. 46 shows a θ-2θ plot for a Ni-30% Cu ternary alloy, rolled to a deformation of ~95% and annealed at 900° C. for 2 hrs. No cube texture is present.

Figure 47:
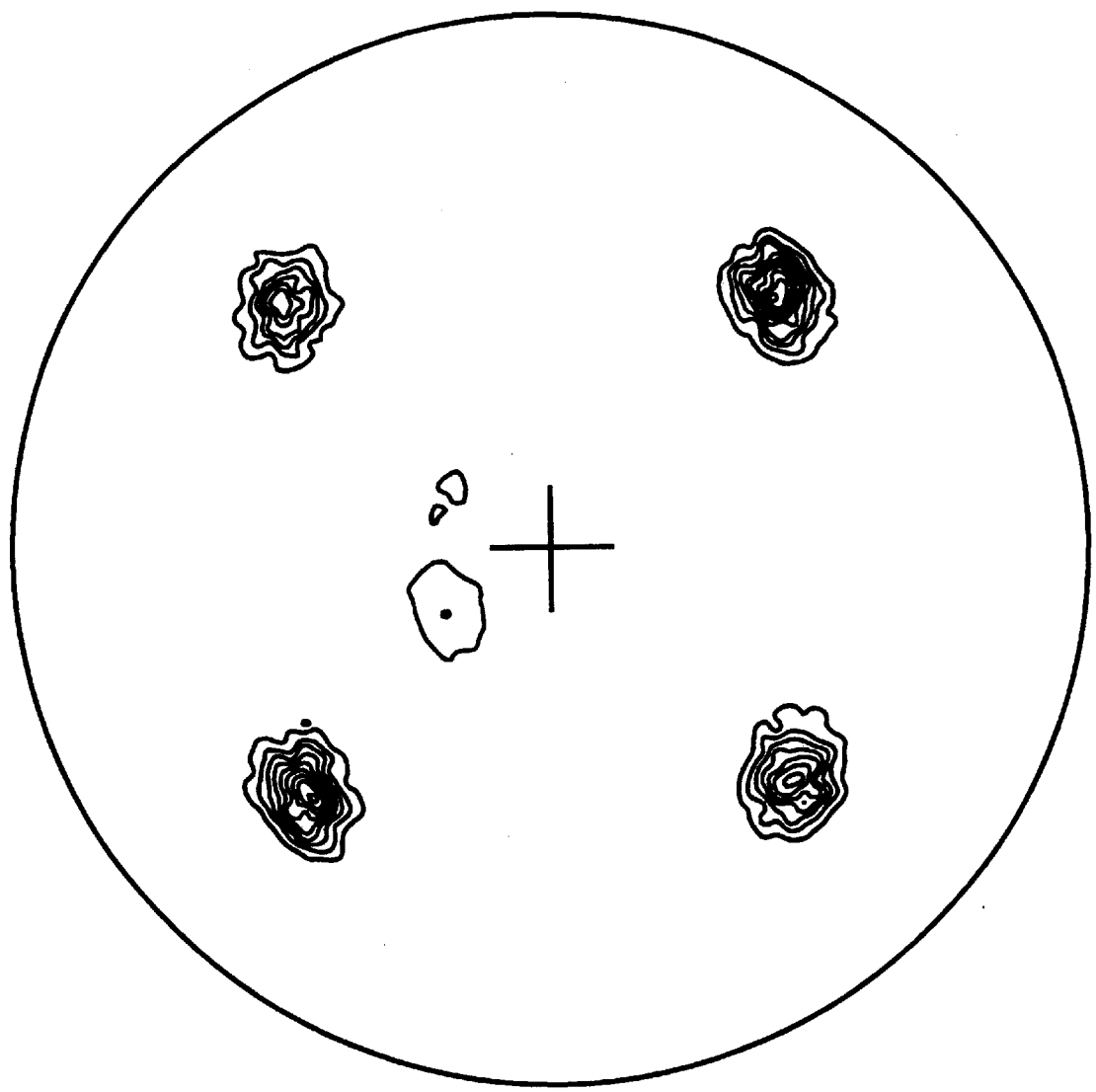

FIG. 47 shows a (111) X-ray pole figure for the sample shown in FIG. 46, indicating a strong cube texture.

Figure 48:
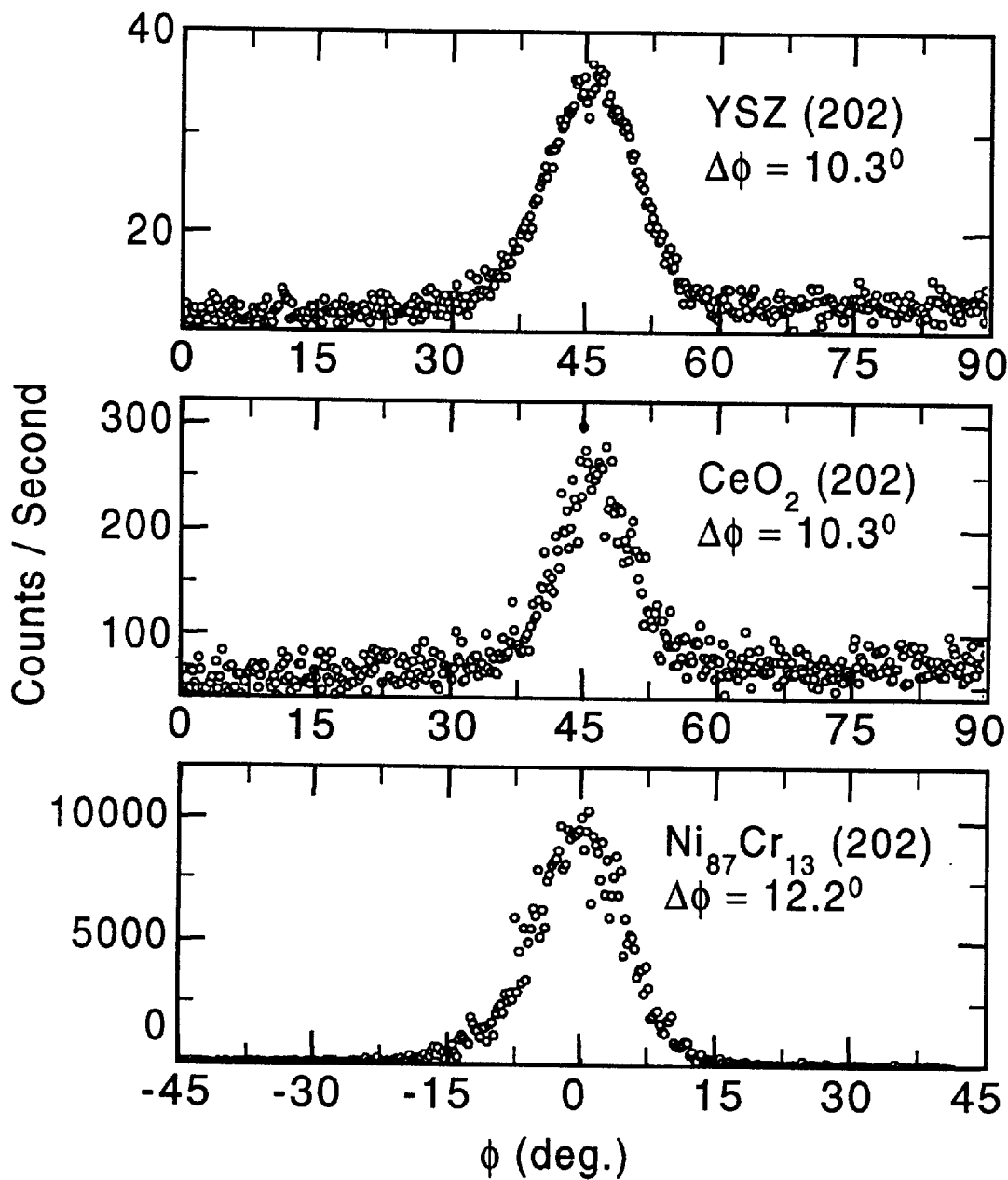

FIG. 48 show X-ray phi-scans of buffer layers deposited on a cube textured Ni-13% Cr sample using electron beam evaporation. Conditions used in the deposition are similar to those employed for depositing the same layers on Ni as disclosed in M. Paranphaman et al., "Growth of Biaxially Textured Buffered Layers on Rolled Ni Substrates by Electron Beam Evaporation" Physica C., 275, 266 (1997). Note that both the CeO$_2$ as well as the YSZ layers are completely cube textured.

Figure 49:
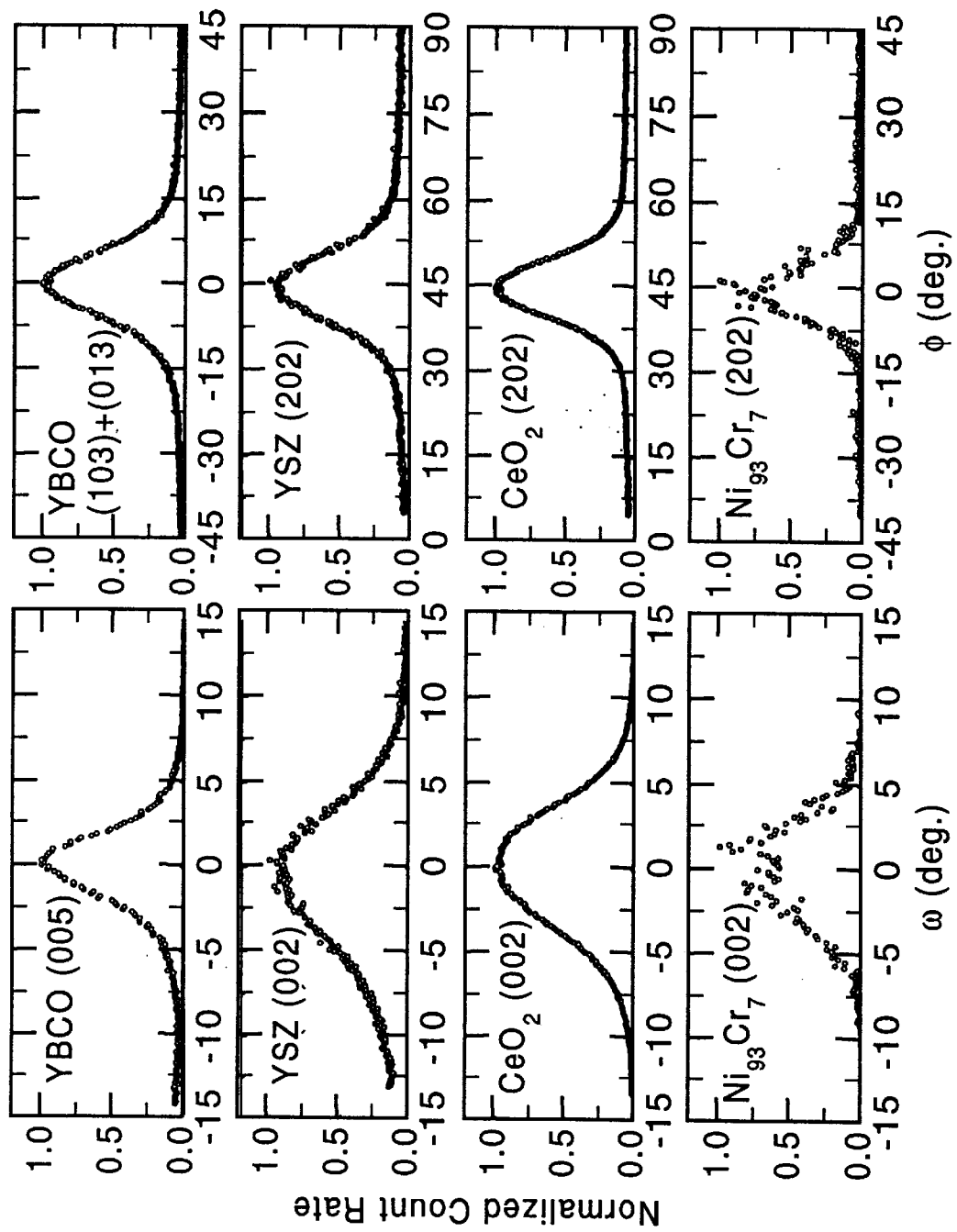

FIG. 49 show X-ray phi-scans of buffer layers and YBCO superconducting films deposited on a cube textured Ni-7% Cr sample using laser ablation as described in reference 14. Conditions used in the deposition are similar to those employed for depositing the same layers on Ni. Note that all the oxide layers are completely epitaxial with the texture alloy substrate. The in-plane texture for all the layers is ~10 degrees.

Figure 50:
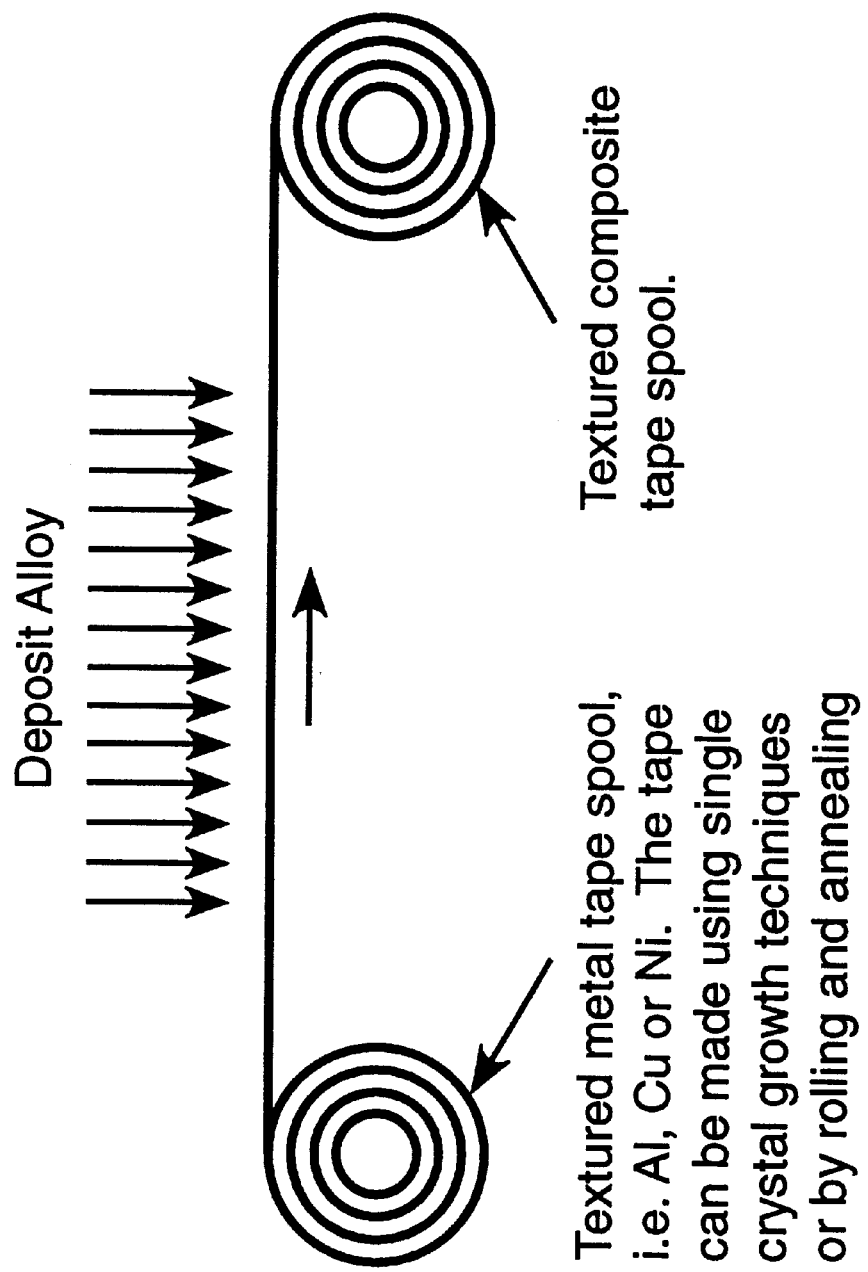

FIG. 50 shows a schematic of a process to make substrates with desired physical properties having compositions in which biaxial texture cannot be easily produced by thermomechanical processing.

Figure 51:
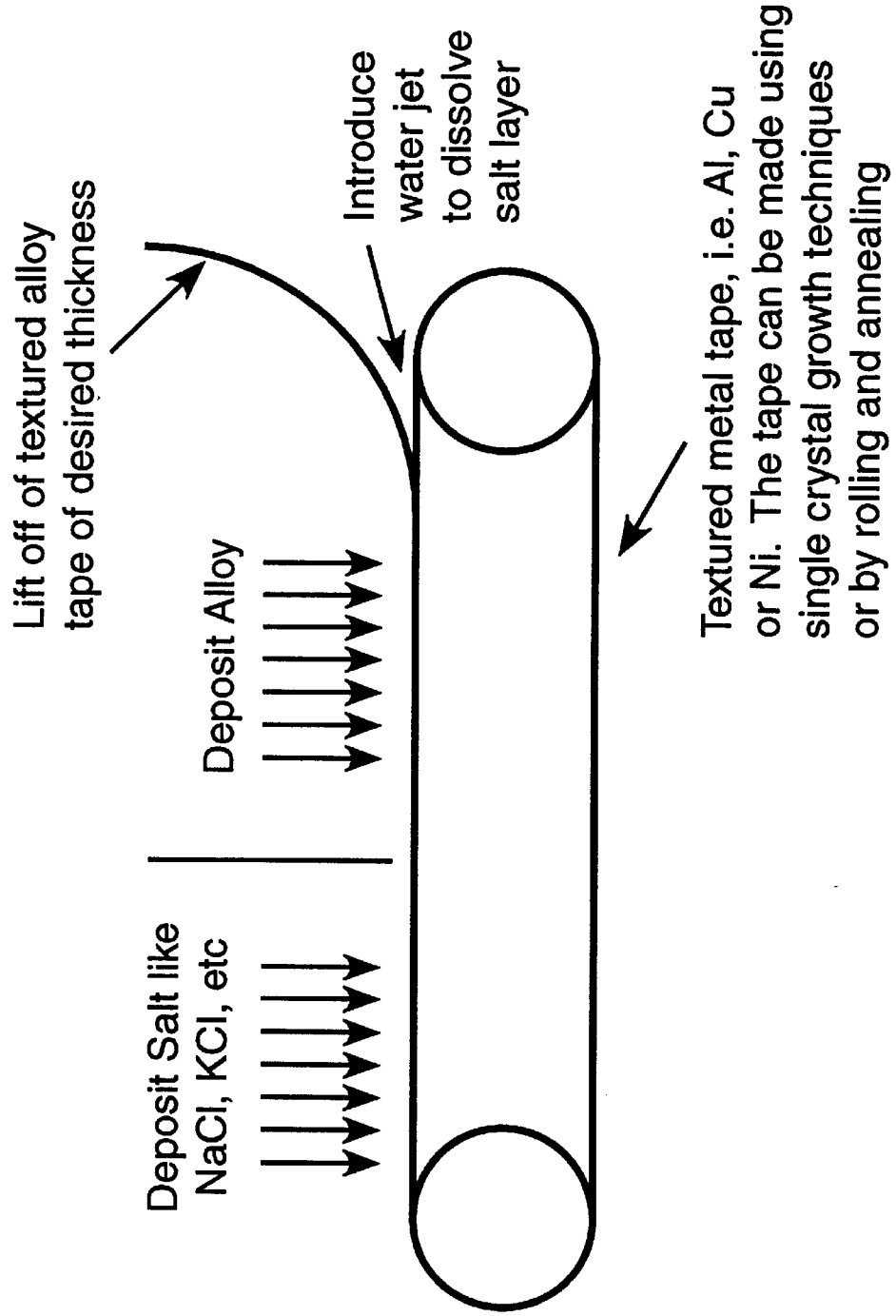

FIG. 51 shows a schematic of a process to make biaxially textured substrates with desired compositions which are difficult to fabricate with sharp biaxial textures and in thin enough cross-sections.

Figure 52:
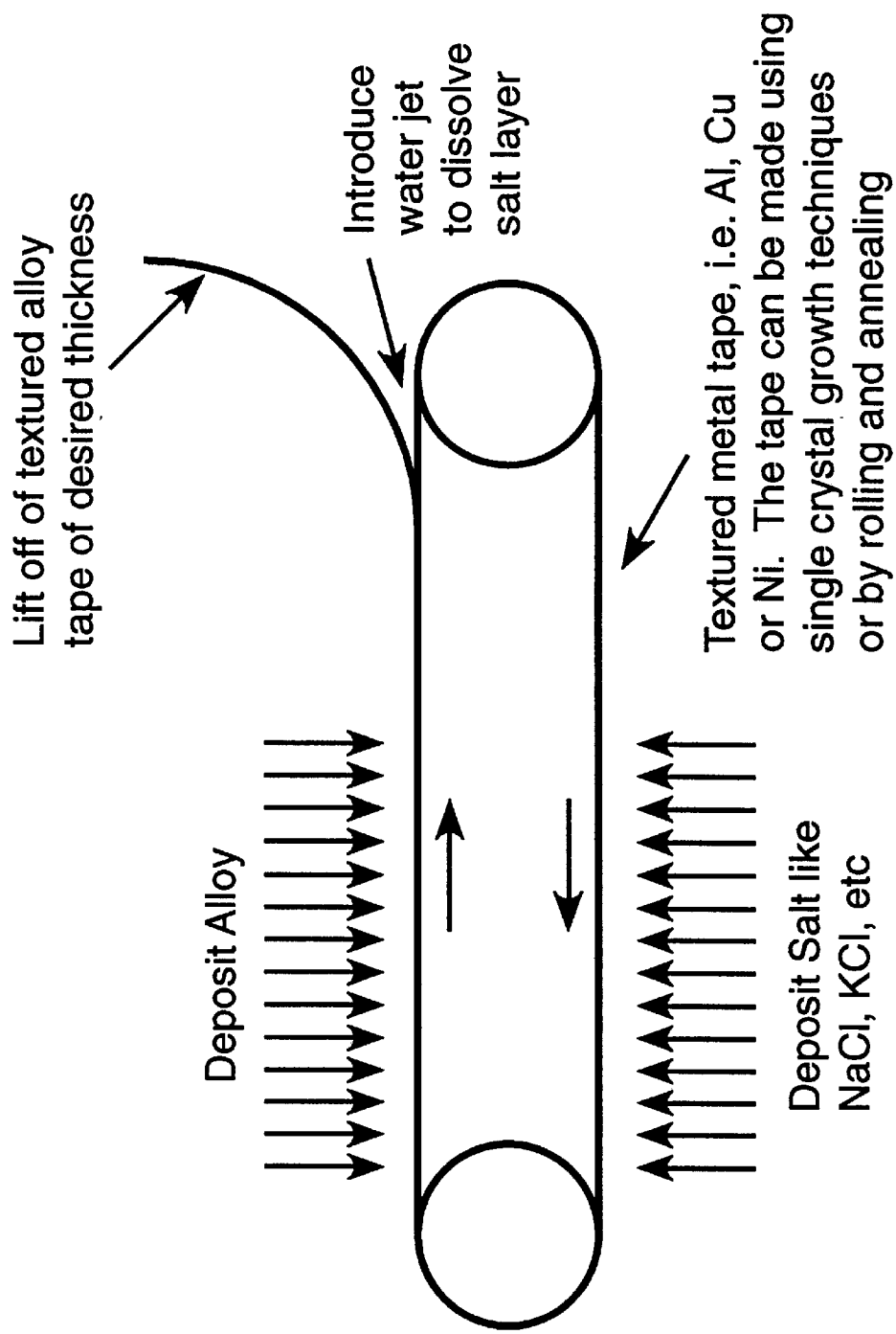

FIG. 52 shows a variation of the process shown in FIG. 51.

DETAILED DESCRIPTION OF THE INVENTION

The subject invention can provide FCC metal, such as Ni, Cu, and Al, based substrates with biaxial texture and desired physical properties, in particular, lattice constant, thermal expansion, strength, or magnetic properties. Such physical properties are advantageous for growth of high quality electronic devices and materials, such as superconductors. The alloys described herein are not limited to a specific number of alloying additions unless the alloy is specifically described as a binary, ternary, or quaternary alloy.

The preferred compositions of the present invention are biaxially textured articles, such as sheets, comprised of an alloy selected from the group consisting of an alloy of Ni and a Group VB metal containing up to 15 at % of the Group VB metal; and an alloy of Ni and a Group VIB metal containing up to 16 at % of the Group VIB metal. A Group VB metal in the Periodic Table of Elements is Vanadium (V), Niobium (Nb), Tantalum (Ta), Praseodymium (Pr), and Protractinium (Pa). A Group VIB metal in the Periodic Table of Elements is Chromium (Cr), Molybdenum (Mo), Tungsten (W), Neodymium (Nd), and Uranium (U). Other preferred biaxially textured articles of the subject invention are those which comprise an alloy of Ni having 10 at % or less of Sn, comprise an alloy of Ni having 12 at % or less of Ti, an alloy of Ni having 10 at % or less of Al, an alloy of Ni having 55 at % or less of Cu, or an alloy of Ni having 25 at % or less of Zn. These alloys can be deformed to deformations greater than 90% prior to a final annealing step by employing a rolling process wherein a thickness of less than 20 mils is achieved. Said rolled and annealed sheet can be used as a substrate for epitaxial growth of oxides and nitrides.

The biaxially textured articles of the present invention are those made of a Ni alloy having a stacking fault frequency parameter, which is at least less than 0.01 at deformations greater than 60%. After rolling to deformation greater than 90% and annealing above the recrystallization temperature, biaxially textured articles of the present invention can be characterized by an x-ray diffraction phi scan peak of no more than 30 full width at half maximum (FWHM).

The stacking fault frequency parameter can be determined by procedures that are known in the art. For example, M. S. Paterson, J. of Appl. Phys., 23, 805 (1952); and B. E. Warren, Progr. Metal Phys., 8, 178 (1958) have shown that deformation faulting will produce peak shifts of the powder line reflections. From the change in the peak separations (Δ2θ) of two neighboring reflections of a deformed specimen, as compared with that of a fully annealed specimen, the stacking fault frequency parameter or probability, α, can be calculated from the following equation:

$$(\Delta 2\theta)=\{[90\sqrt{3}\alpha\tan\theta]/[\pi(\mu+b)h_o^2]\}\Sigma_b(\pm)L_o \qquad (1)$$

where values $\Sigma_b (\pm)L_o/[\pi(\mu+b)h_o^2]$ are constants depending upon the (hkl) of the diffracting plane.

Hence the change in peak separations between {111}–{200}, {200}–{220}, {220}–{311} and {222}–{400} are given by the respective equations, (2)–(5), given below:

$$\Delta(2\theta_{200}-2\theta_{111})=-(45\sqrt{3}\alpha/\pi^2)[\tan\theta_{200}+(\tfrac{1}{2})\tan\theta_{111}] \quad (2)$$

$$\Delta(2\theta_{220}-2\theta_{200})=(45\sqrt{3}\alpha/\pi^2)[(\tfrac{1}{2})\tan\theta_{220}+\tan\theta_{220}+\tan\theta_{200}] \quad (3)$$

$$\Delta(2\theta_{311}-2\theta_{220})=-(45\sqrt{3}\alpha/\pi^2)[(\tfrac{1}{11})\tan\theta_{311}+(\tfrac{1}{4})\tan\theta_{220}] \quad (4)$$

$$\Delta(2\theta_{400}-2\theta_{222})=(45\sqrt{3}\alpha/\pi^2)[(\tfrac{1}{2})\tan\theta_{400}+(\tfrac{1}{4})\tan\theta_{222}] \quad (5)$$

As shown by the above equations, the change in peak separations between {111}–{200} reflections and between {220}–{311} have a negative sign, indicating that these peak positions shift toward each other due to the presence of stacking faults. Similarly, the peak separation between {200}–{220} and {400}–{222} reflections is increased due to stacking faults, hence there is a positive change in peak separation as compared to that in a fully annealed specimen. In this invention α is referred to not as the stacking fault frequency but a stacking fault frequency parameter, since some peak shift is also associated with internal stress build up during deformation. Never-the-less experimental observations suggest a close link between the parameter, α, and capability of the material to produce the desired cube texture.

Alloys can be designed and fabricated such that their stacking fault frequency parameter, α, is less than 0.01 at deformations greater than 50%. The α can be determined by X-ray diffraction as detailed above. If α is greater than 0.01, then the composition can be modified such that α is less than 0.01. Once that is achieved the alloy can be rolled under conditions detailed below. If it is not possible to achieve α less than 0.01 at room temperature by compositional variation, then the temperature can be increased to achieve it. The rolling then must be performed at this temperature. The rolling conditions in all cases are such that the total deformation is greater than 90%, the direction of rolling is preferably reversed at each pass and the annealing temperature is higher than the recrystallization temperature of the alloy.

The biaxially textured articles of the present invention, such as those of Ni containing from 1 at % to 16 at % Cr, can be made by a method which comprises rolling an alloy sheet to mechanically effect a deformation in excess of 95% and a grain size of less than 1000 μm (preferably 5 μm) followed by annealing at a temperature above 800° C. to produce a sharp texture. The deformation conditions are preferably reversed at each pass, and are carried out at an annealing temperature higher than the recrystallization temperature. The deformation can also be carried out at higher temperatures.

An advantage of the above method is that it enables fabrication of long lengths of biaxially textured materials which can exhibit sufficient high temperature strength, e.g., to withstand stresses imposed on the substrate, for deposition and epitaxial growth of oxides, nitrides or other materials. Improved low temperature strength will also be important for strain tolerance and for withstanding high Lorentz forces.

The resulting biaxially textured sheets of alloys have desirable properties for use in devices employed in certain electronics, magnetic, or superconductor applications. Preferably, the alloys are thermal expansion and lattice parameter matched. By using the methods described herein, devices having high quality films with good epitaxy and minimal microcracking can be produced. This method can result in biaxially textured substrates that have a stacking fault frequency of less than 0.01. The above described method is useful for producing other alloys described herein.

Another embodiment of the invention comprises an alloy of Ni with any BCC metal such that the total concentration of any one alloying addition is 16 at % or less. Alloys below this limit can be cube textured by rolling to deformations greater than 90% prior to final annealing. Deformations can be carried out at room temperature or at temperatures greater than room temperature. An alloy of Ni with any BCC metal such that the total concentration of any one alloying addition is 16 at % or less can achieve a stacking fault frequency of less than 0.01.

The rolling and annealing method is especially useful for forming a binary Ni alloy comprising less than 16 at % Cr into biaxially textured substrates and subsequently depositing epitaxial coatings thereon. Advantageously, these alloys have decreased magnetism and increased strength as compared to Ni or certain other Ni alloys. The addition of Cr and W to Ni greatly suppresses the Curie point of Ni. Also, binary Ni—W alloys in which the W content is no greater than 10 at % W and binary Ni—Cr alloys in which the Cr content is no greater than 16 at % Cr can be cube textured following the above procedures described in this invention. Hence alloys of these compositions could be used for applications. See example 1 and 2 for details.

Another embodiment of the subject invention comprises a binary alloy of 10 at % or less of Al, 55 at % or less of Cu, 10 at % or less of Ti, 12 at % or less of molybdenum (Mo), 15 at % or less of V, 10 at % or less of Ta, 10 at % or less of Sn, or 20 at % or less of Zn. These alloys can be cube textured by rolling to deformations greater than 90% prior to final annealing. Said rolled and annealed article can be used as a substrate for epitaxial growth of oxides and nitrides and electromagnetic devices.

It is not possible to deform alloys of certain compositions to the reductions required to produce sharp biaxial textures required for applications. Hence the present invention also includes a new method which uses a biaxially textured metal strip of an FCC or BCC metal, e.g., Cu or Fe, as a starting template. Alloys with desired properties are deposited on the starting template at high rates using vapor deposition techniques such as sputtering or electron beam evaporation. The alloy can grow epitaxially on the metal strip under a range of deposition temperatures. For example, if a biaxially textured alloy with a specific composition of Hasteralloy C is desired, which has an ideal lattice parameter, thermal expansion coefficient, high temperature strength, no magnetism, and cannot be biaxially textured by rolling and annealing, then it can be deposited on a thin strip of biaxially textured Cu. The alloy can be deposited on all sides of the Cu template and the resulting material is a biaxially textured substrate with the ideal physical properties. This method provides a biaxially textured alloy by a means other than a method employing the techniques of rolling and annealing as described herein.

In a preferred embodiment, Cu or Al can be used as the starting template. An alloy can then be deposited by physical vapor deposition as a coating on the textured Cu or Al to form an epitaxial layer. This alloy has the desired characteristics comprising two or more elements and has a Curie point below that of Ni and a strength greater than that of pure Ni.

Deposition of the alloy can be done a variety of ways known in the art, including high rate sputtering or electron beam evaporation. A particularly preferred method employs electron beam evaporation of the multicomponent alloy through W or other high melting refractory metals like Mo. In this method the alloy to be deposited is superheated until all the constituents of the alloy are in vapor phase under a lid of molten W. The vapor diffuses through the W layer and deposits on the template. Composition control and high rates of deposition can be achieved by this method. The use of evaporation through W has not been heretofore described to make epitaxial films of substrates which are biaxially textured or are single crystals. Rates in excess of 25 μm/min can be easily achieved.

Preferably, depositions using this technique are done in a non-equilibrium manner to avoid instabilities which result when depositions are done in equilibrium using co-evaporation. The subject method comprises a step wherein the alloy pool is flash evaporated at a temperature above its sublimation point using very high power electron beams. By doping the pool with a major component such as W, which has a very low vapor pressure at its melting point compared to all the other components of the molten alloy, the pool is able to accept the energy without splatter and the W does not contribute to the vapor. The W forms a medium through which the alloy is carried, brought to a very high temperature, and finally vaporized from the surface. Equilibrium in terms of Raults Law is not achieved. Hence, multicomponent alloys comprised of elements with very different vapor pressures can be deposited homogeneously.

Another method of preparing useful biaxially textured, thin substrates can be carried out as follows: Starting with a textured Ni, Cu, or Al substrate, epitaxially deposit on the substrate a thin layer of a salt, like NaCl, KCl, etc., using a high rate process, such as described herein. Single salt crystals have been epitaxially grown on FCC metals such as Ni, Ag, Pd, Pt, and Cu. Once the thin layer of salt is deposited on the substrate, an alloy of the desired composition is deposited on the salt. In a subsequent step the salt is dissolved in an aqueous medium like water and a thin textured alloy is obtained. The thickness of the alloy can be controlled depending on the engineering critical current density requirements.

It is possible to achieve thin substrates in an alternate configuration wherein a near single crystal belt of an FCC metal is used. A near single crystal belt of an FCC metal can be obtained by thermal gradient processing or by the many methods used to make metal single crystals. As the belt of an FCC metal rotates like a conveyor belt, a layer of a salt is deposited epitaxially on the bottom side of the belt. When the layer of salt comes to the top side of the rotating belt, the desired alloy is deposited epitaxially. The alloy is then removed from the assembly by dissolving the salt. The advantage of this method is that substrates with essentially no grain boundaries can be obtained.

A simple process variation of this method is accomplished by making both the depositions in series on the same side. Many other variations are possible and would be readily recognized by those of ordinary skill in the art in view of the description provided herein.

The above described method can be used to make thin (e.g., <5 μm) substrates for superconductivity applications which require high engineering critical current density. Critical current density is determined by the formula: (critical current/total area of cross-section of substrate +superconductor). Thus, the thickness of the alloy substrate can be controlled depending on the engineering critical current density requirements.

EXAMPLES

Following are examples which illustrate procedures for practicing the invention. These examples should not be construed as limiting. All percentages are by weight and all solvent mixture proportions are by volume unless otherwise noted.

Example 1

Ni—Cr Alloys

A study of Ni—Cr alloys having different percentages of Cr illustrates how the composition of the alloy can affect stacking fault frequency parameter. The methodology and results of these studies are presented herein. An alloy having a stacking fault frequency parameter less than 0.01 is capable of developing a cube texture. With an increase in Cr content, the Curie temperature of Ni decreases significantly, and a 20% Cr alloy is completely non-magnetic, which can be advantageous for superconductivity applications.

Figure 1:
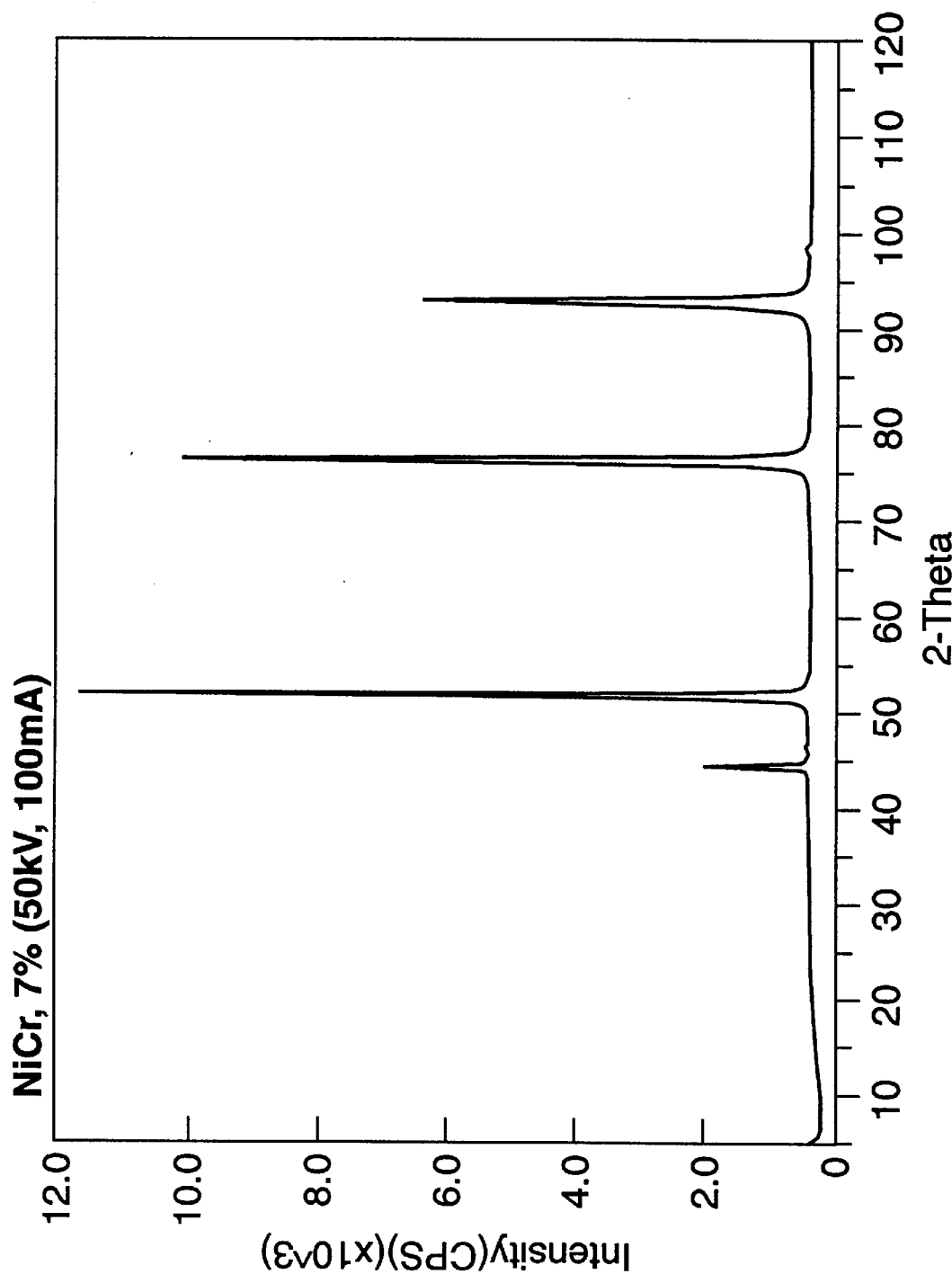
FIG. 1 shows a x-ray diffraction θ-2θ plot for an as-rolled Ni-7% Cr alloy, deformed by ~95%.
Figure 2:
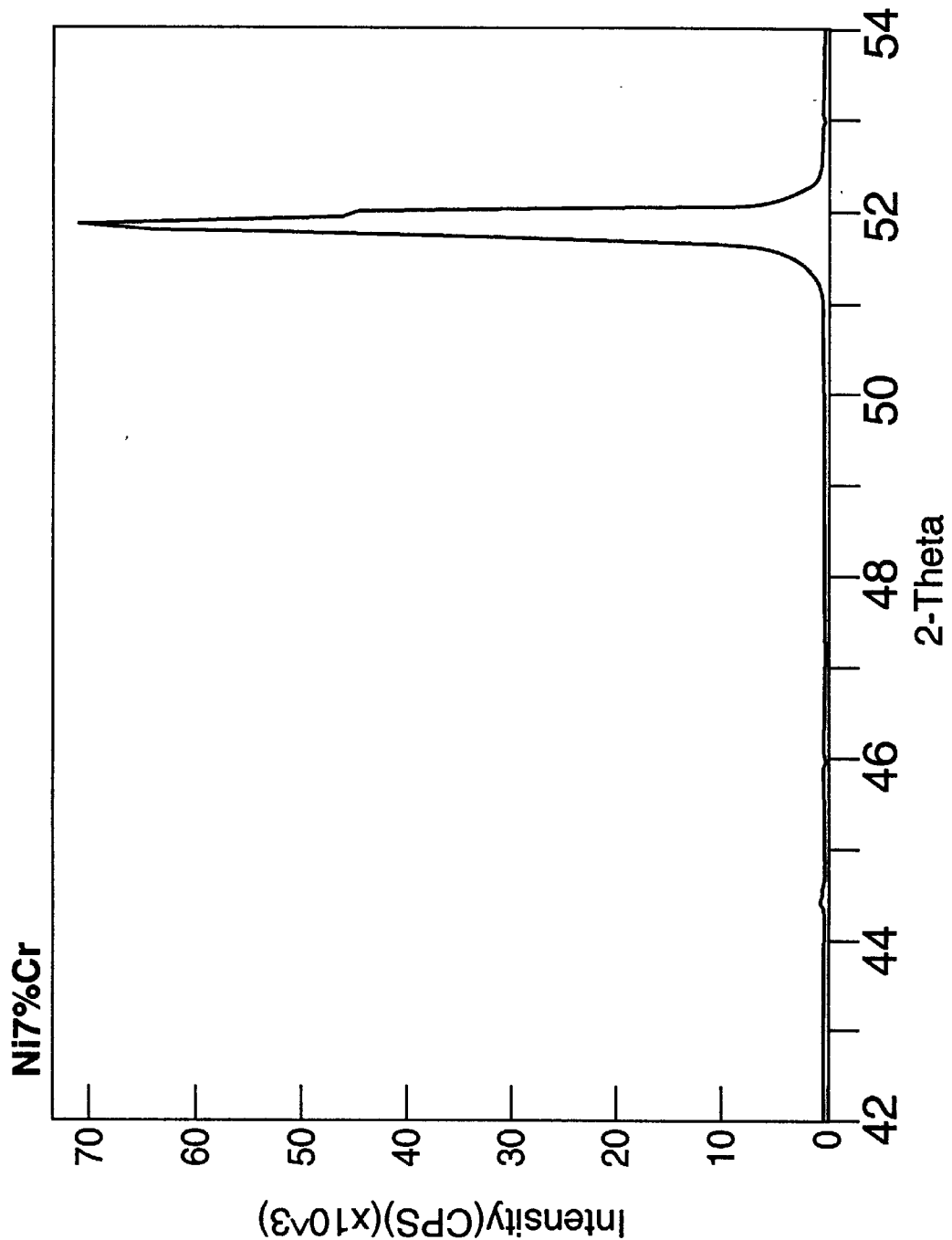
FIG. 2 shows a θ-2θ plot for a Ni-7% Cr alloy, annealed at 900° C. for 2 hrs. Note that only a (200) reflection is observed indicating a sharp texture.

Two Ni—Cr alloys, one of 6.75% Cr and one of 20% Cr, were studied. Both were deformed greater than 90%, either by pressing or rolling. FIG. 1 and 2 show x-ray diffraction θ-2θ plot for an as-rolled Ni-7% Cr alloy and a Ni-20% Cr alloy, deformed by ~95%. Comparing this X-ray pattern to an undeformed and annealed alloy of the same composition, the stacking fault energies were then measured. The stacking fault frequencies were then calculated using the equations described herein, accounting for the change in lattice parameter of Ni due to Cr addition.

A) Ni/20% Cr Alloy

The alloy was deformed at room temperature (total deformation: >95%) according to the following schedule Reduction per pass: 10% initially till 70% deformation, 5% thereafter. The exact reduction per pass is not critical to the invention and is essentially dependent on how strain hardened the material is at a given point in the deformation.

Lubricant: kerosene.

Rolling direction was reversed at each pass.

The alloy was subsequently annealed at 750° C. for 10 hours.

Average lattice parameter=a=3.551±0.0005

For the 111 peak, $(2\theta)_{111}$=44.188 and the $(2\theta)_{calculated}-(2\theta)_{observed}$=−0.041

For the 200 peak, $(2\theta)_{200}$=51.377 and the $(2\theta)_{calculated}-(2\theta)_{observed}$=0.024

Then using the following equation:

$$(2\theta_{200}-2\theta_{111}) = -(45\ 3/2)[\tan\theta_{200}+(\tfrac{1}{2})\tan\theta_{111}]$$

the stacking fault frequency, α, is calculated to be 0.012.

B) Ni/6.75% Cr alloy

Using the formulas in Example 2(A) above, the stacking fault frequency, α, is calculated to be 0.001.

Figure 3:
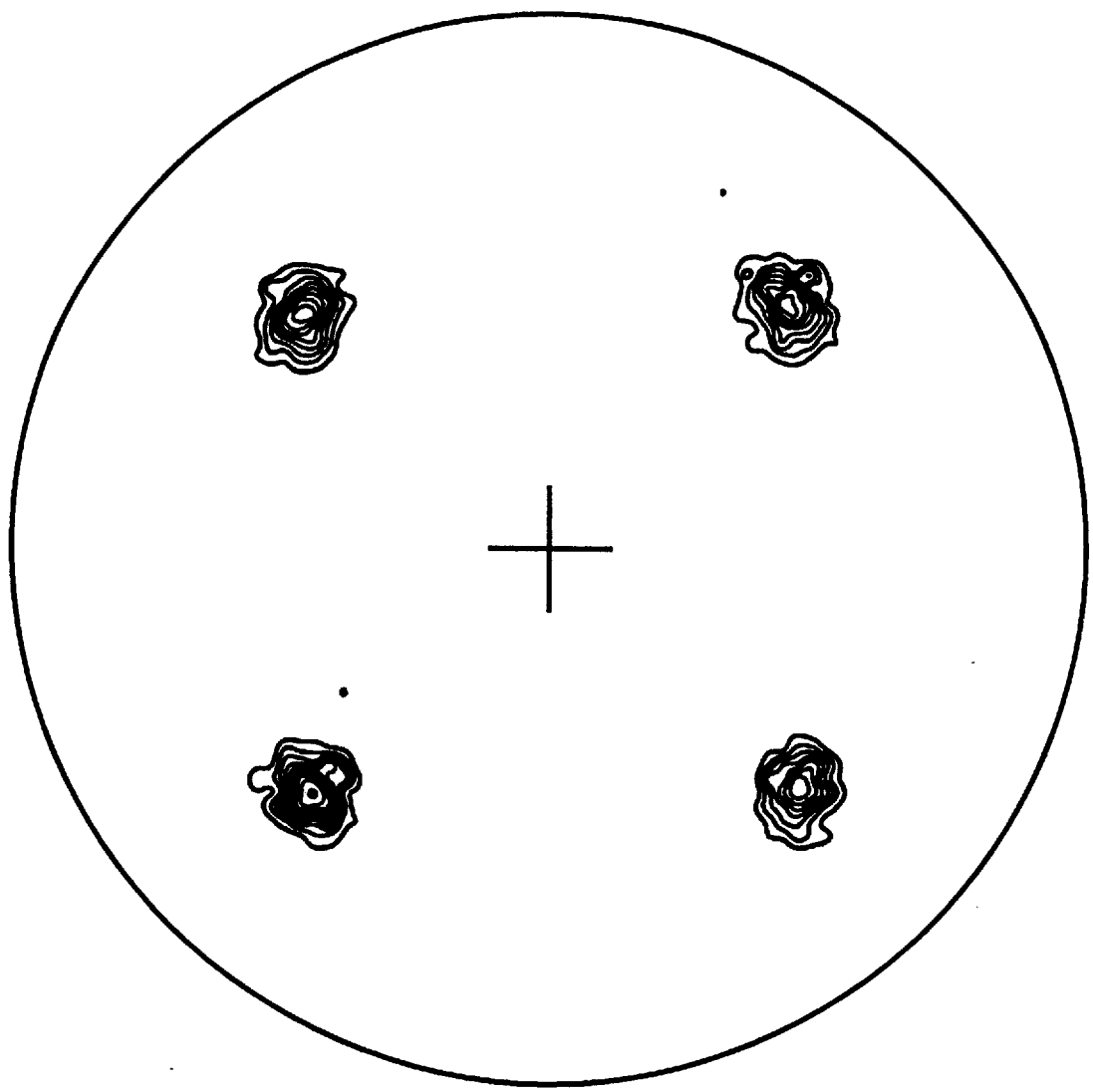
FIG. 3 shows a (111) X-ray pole figure for the sample shown in FIG. 2 indicating a fully developed cube texture of orientation {100}<100>.
Figure 4:
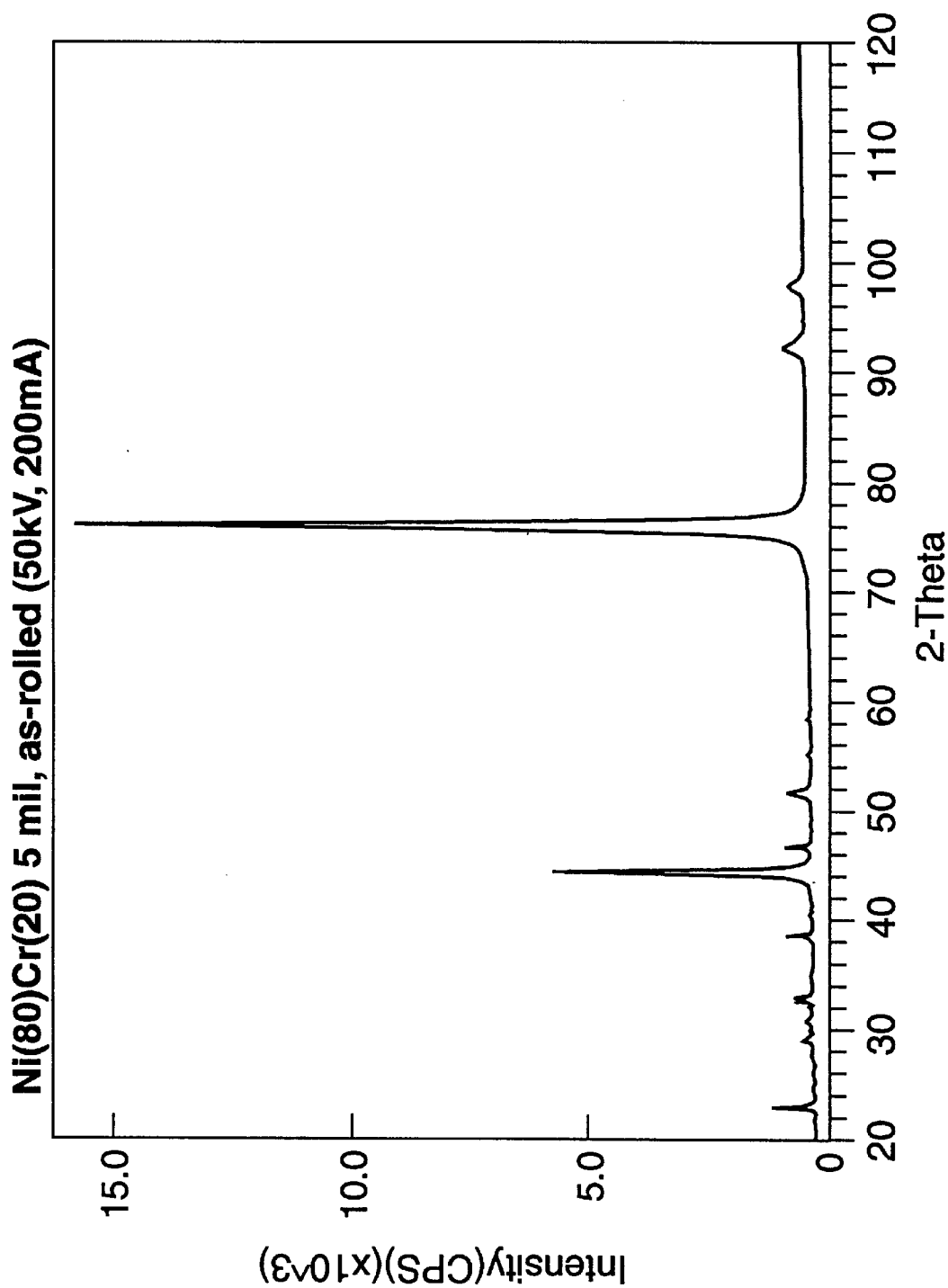
FIG. 4 shows a x-ray diffraction θ-2θ plot for an as-rolled Ni-20% Cr alloy, deformed by ~95%.
Figure 5:
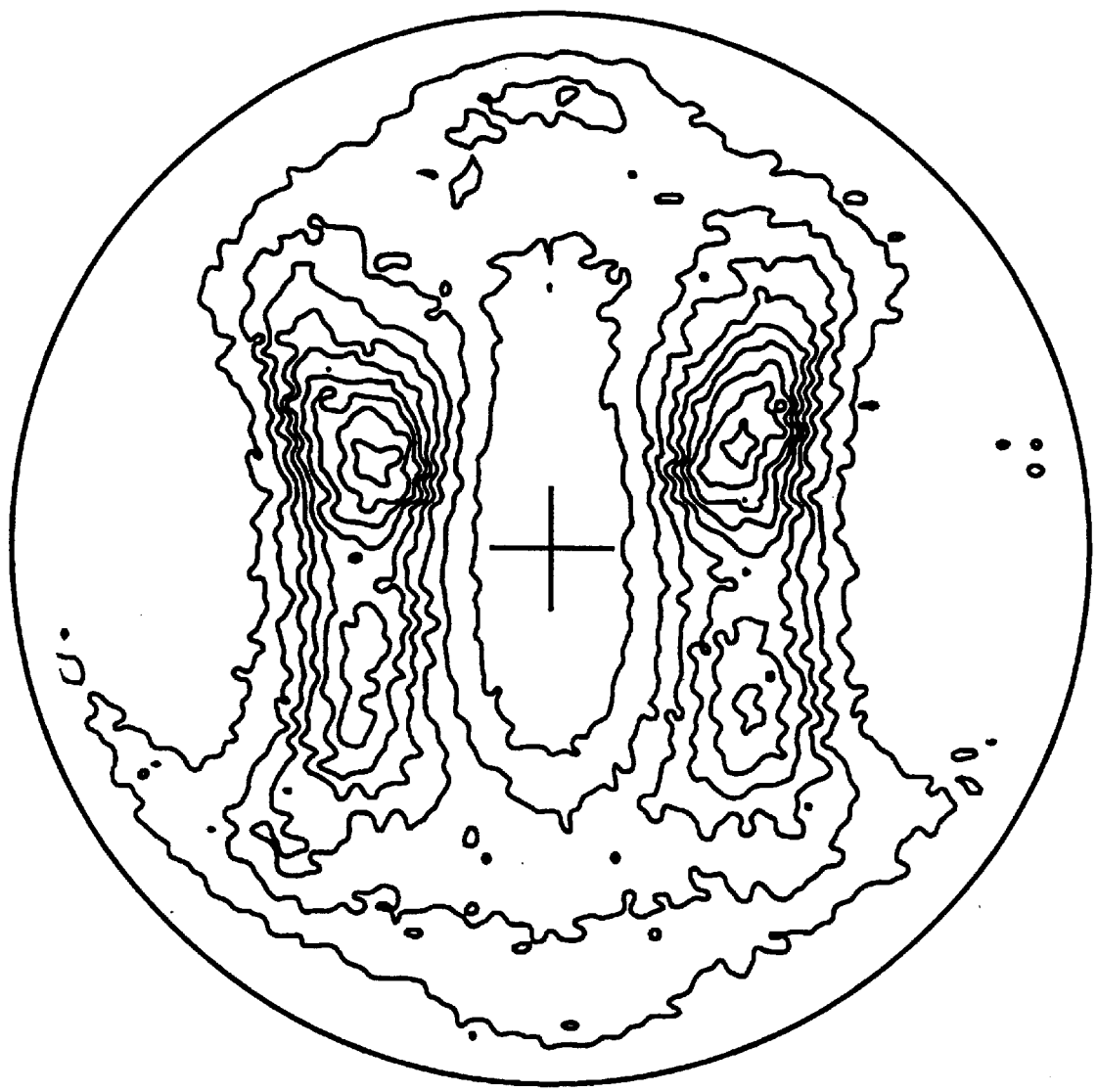
FIG. 5 shows a (111) X-ray pole figure for the sample shown in FIG. 2 indicating that a cube texture is not formed in this sample.

Therefore, the 6.75% Cr, having a stacking fault frequency significantly less than 0.01 results in a strong cube texture on rolling and annealing above the recrystallization temperature. FIG. 2 shows a θ-2θ plot for a Ni-7% Cr alloy, annealed at 900° C. for 2 hrs. Note that only a (200) reflection is observed indicating a sharp texture. FIG. 3 shows a (111) X-ray pole figure for the sample shown in FIG. 2 indicating a fully developed cube texture of orientation {100}<100>. The Ni/20% Cr alloy was deformed and annealed under similar conditions to the Ni/6.75% Cr alloy. The 20% Cr alloy having a stacking fault frequency of more than 0.01 did not have a strong cube texture for deformation carried out at room-temperature. FIG. 4 shows a θ-2θ plot for an as-rolled Ni-20% Cr sample deformed by ~95%. FIG. 5 shows a pole figure for a Ni-20% Cr sample annealed at 800° C. No cube texture is developed.

Clearly, the crossover in the stacking fault frequency occurs somewhere in between 6.75% and 20%. If a 20% Cr alloy is desired then the temperature of deformation has to be increased. The appropriate temperature can be determined by measurements of stacking fault frequencies in samples hot-deformed (i.e. by hot-pressing, etc.) at various temperatures. At the lowest temperature where the stacking fault frequency is below 0.01, texture formation can be attained using the subject method as described herein in view of the information readily available to one of ordinary skill in the art.

Figure 6:
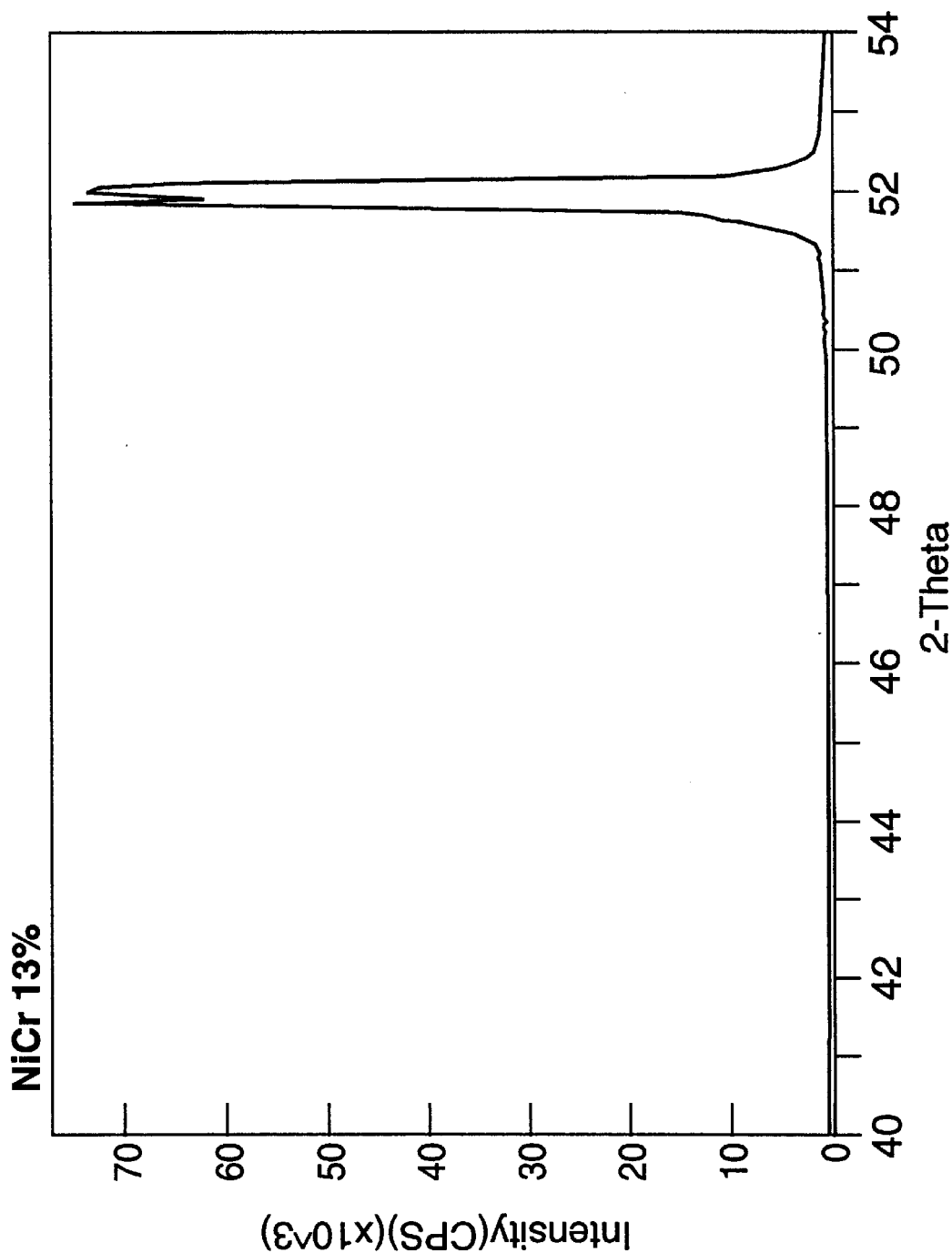
FIG. 6 shows a θ-2θ plot for a Ni-13% Cr alloy, rolled to a deformation of ~95% and annealed at 900° C. for 2 hrs. Note that only a (200) reflection is observed indicating a sharp texture.
Figure 7:
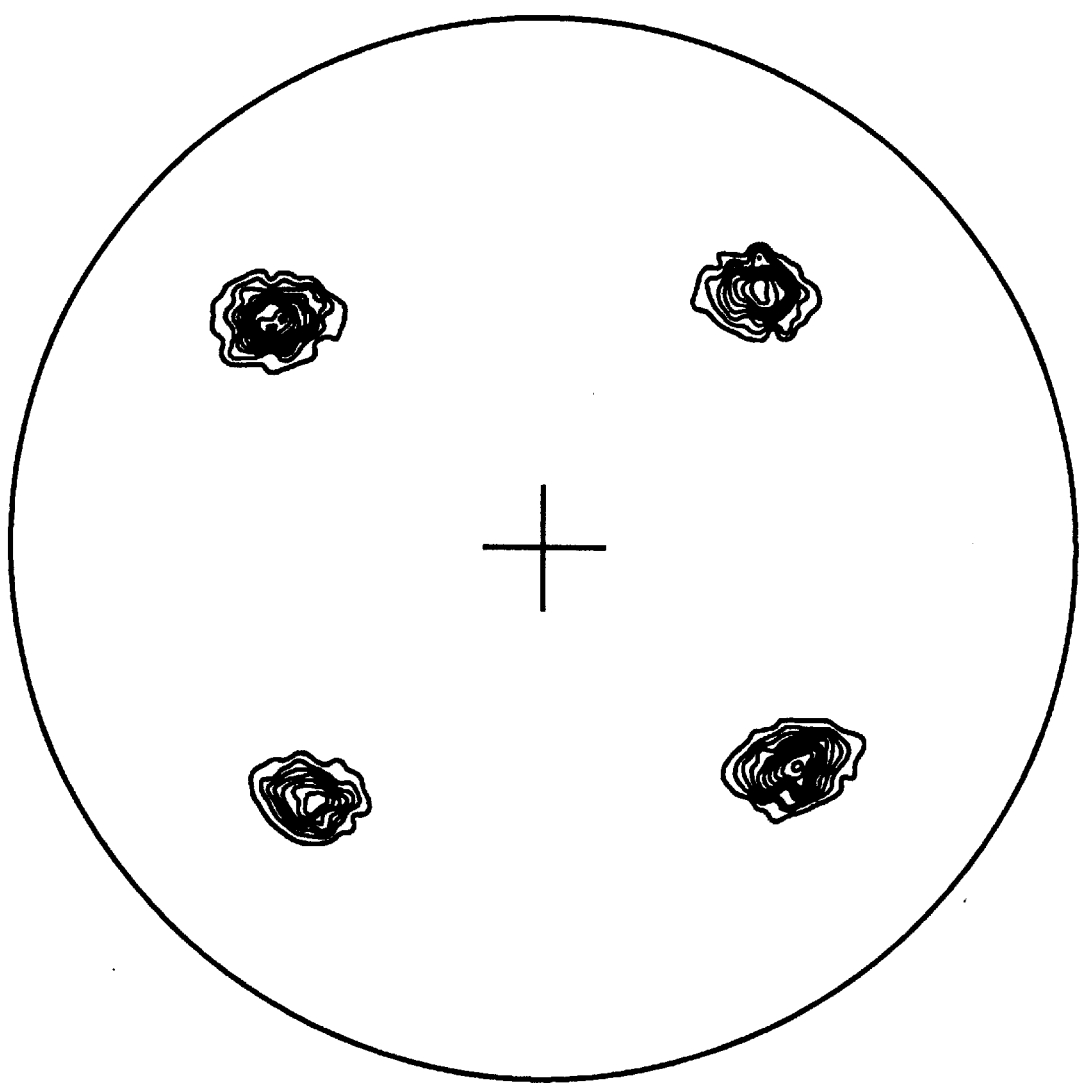
FIG. 7 shows a (111) X-ray pole figure for the sample shown in FIG. 6 indicating a fully developed cube texture of orientation {100}<100>.
Figure 8:
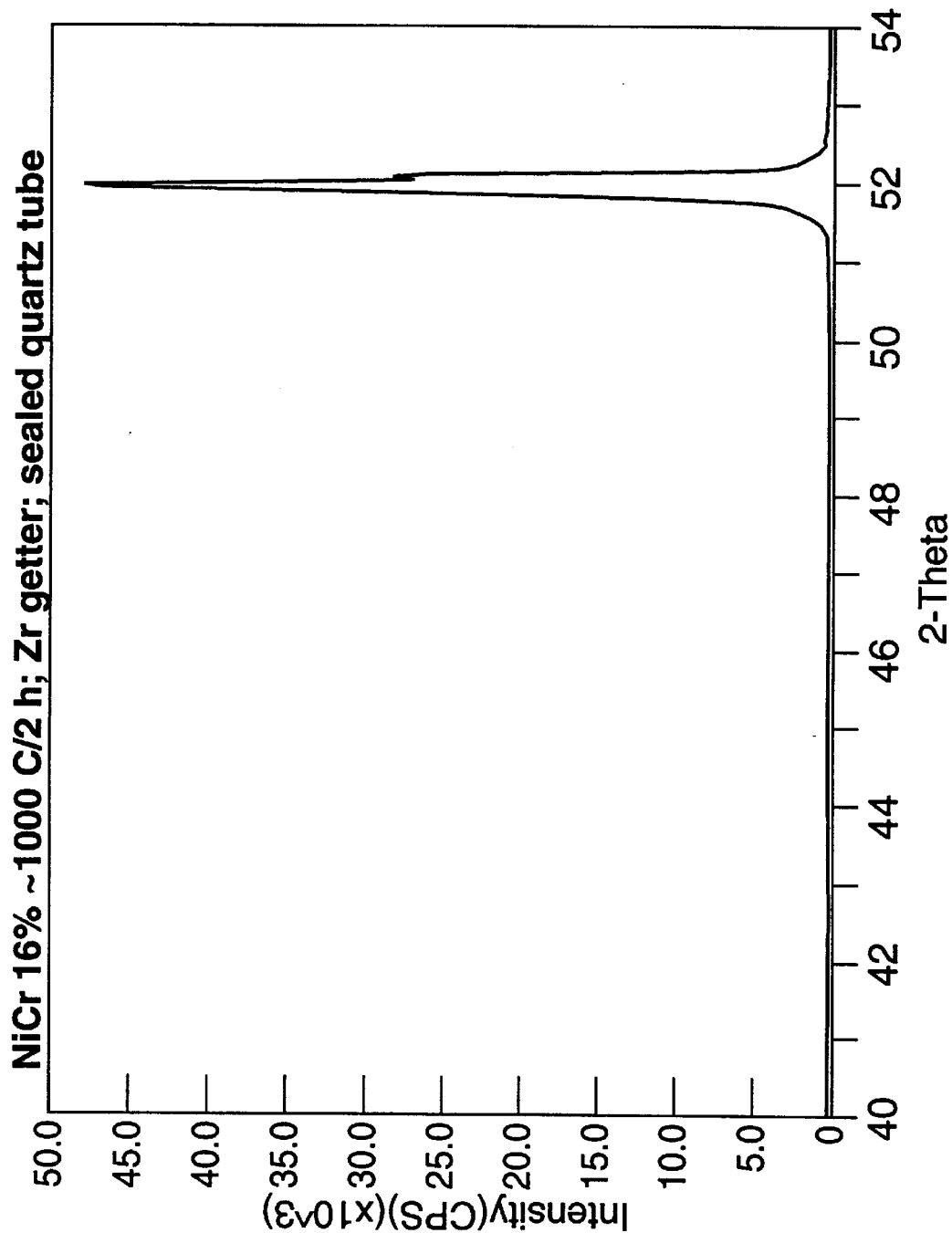
FIG. 8 shows a θ-2θ plot for a Ni-16% Cr alloy, rolled to a deformation of ~95% and annealed at 900° C. for 2 hrs. Note that only a (200) reflection is observed indicating a sharp texture.

A method of texturing Ni with up to 16% Cr to form a completely cube textured alloy can be done under the following conditions: Grain size <1000 µm, preferably 5 µm; Reverse rolling, % total deformation: >90%; Annealing temperature >400° C. Following this method, data is presented in FIGS. 6–8 showing the fabrication of highly textured substrates. FIG. 6 shows a θ-2θ plot for a Ni-13% Cr alloy, rolled to a deformation of ~95% and annealed at 900° C. for 2 hrs. Note that only a (200) reflection is observed indicating a sharp texture. FIG. 7 shows a (111) X-ray pole figure for the sample shown in FIG. 6 indicating a fully developed cube texture of orientation {100}<100>. FIG. 8 shows a θ-2θ plot for a Ni-16% Cr alloy, rolled to a deformation of ~95% and annealed at 900° C. for 2 hrs. Note that only a (200) reflection is observed indicating a sharp cube texture.

Figure 9:
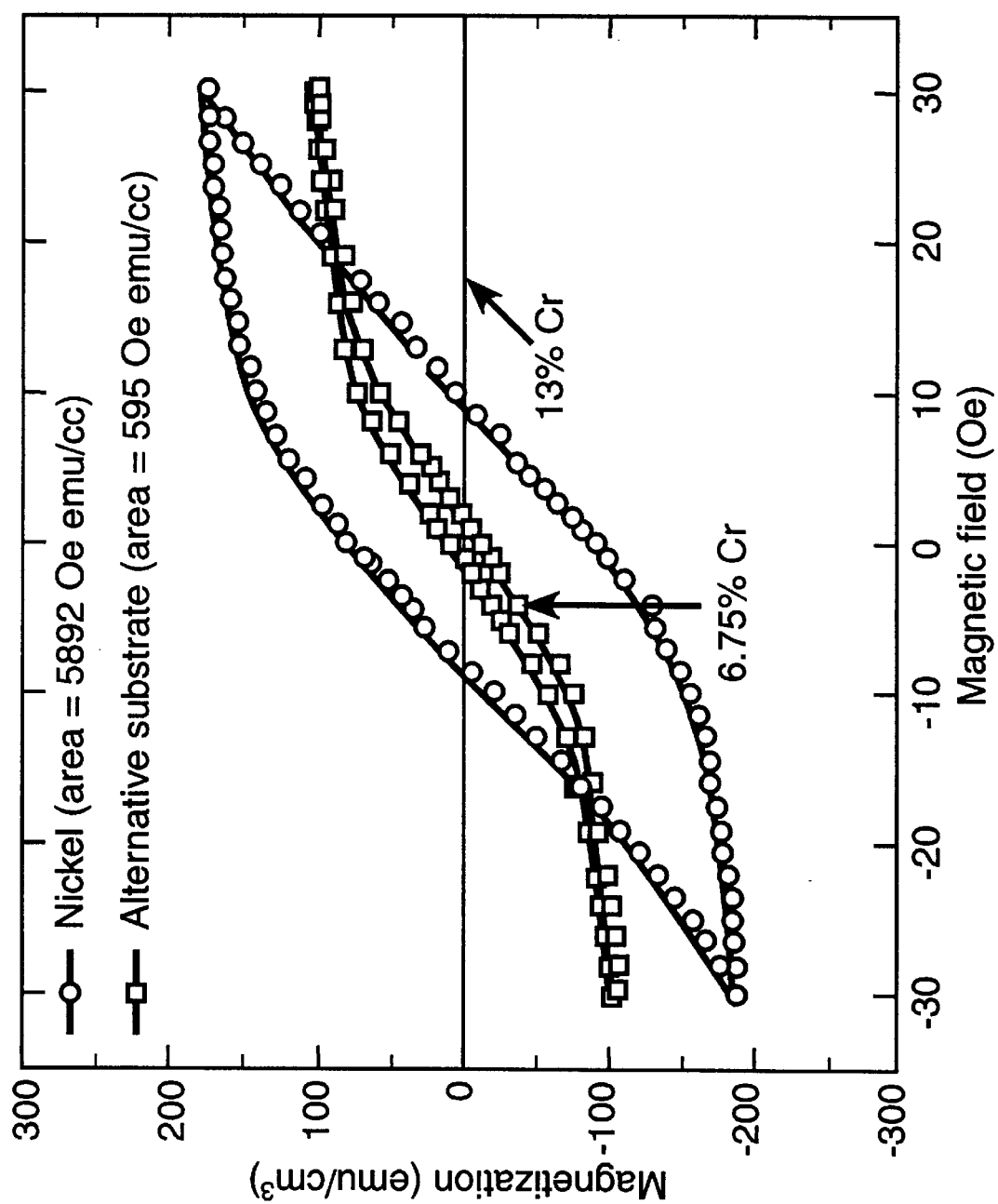
FIG. 9 shows DC magnetization loops taken at 77 K for cube textured, pure Ni sample, Ni-7% Cr and a Ni-13% Cr sample. All the samples have the same dimensions, hence the hysteresis in the magnetization loop indicated the relative amounts of magnetization effects in the sample. Note that the Ni-13% Cr is completely non-magnetic at 77 K.
Figure 10:
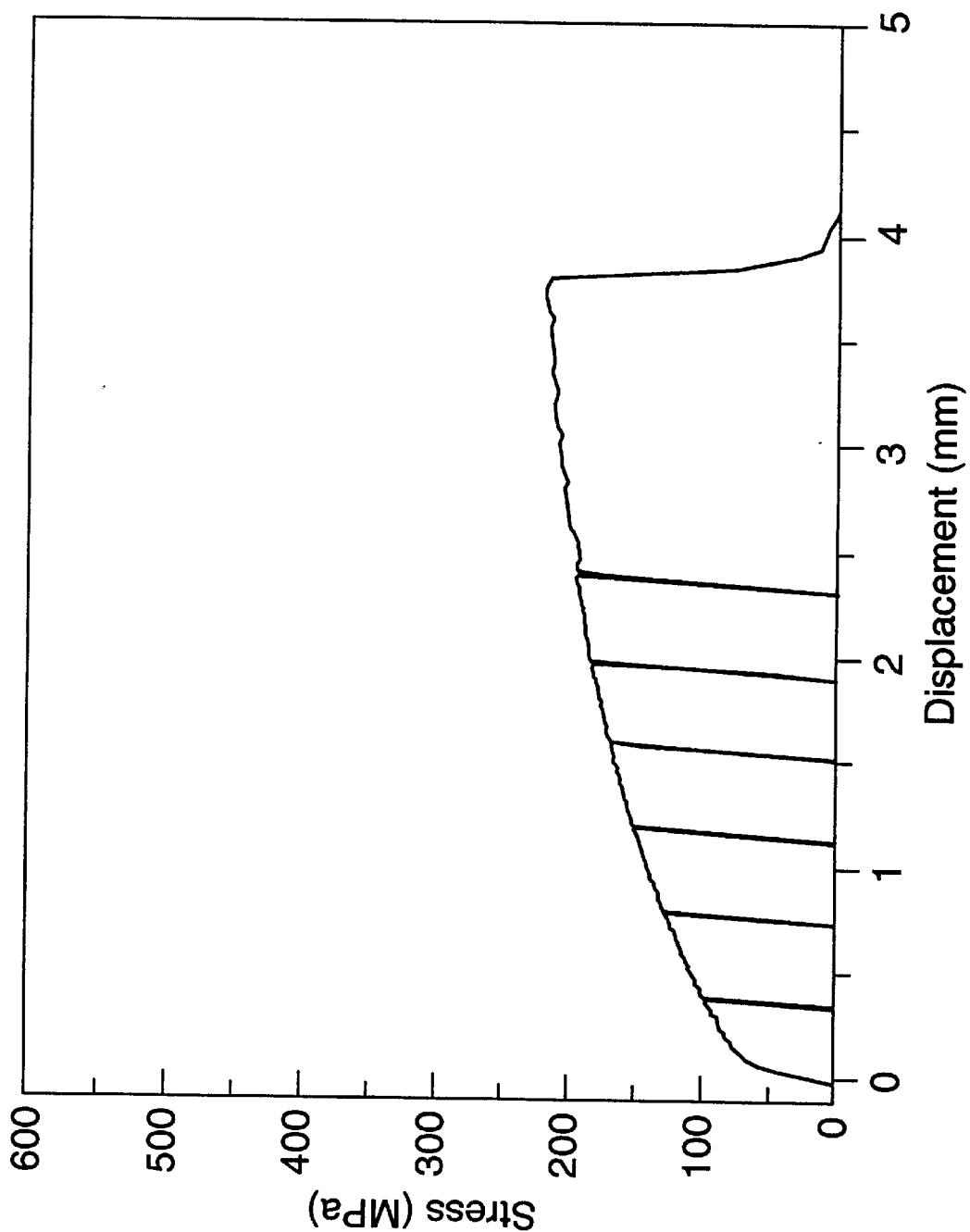
FIG. 10 shows a stress-displacement curve taken in tension on a standard dog bone, tensile, cube textured Ni sample. The 0.5% offset yield stress is slightly over 50 MPa and the ultimate tensile stress is 221 MPa.
Figure 11:
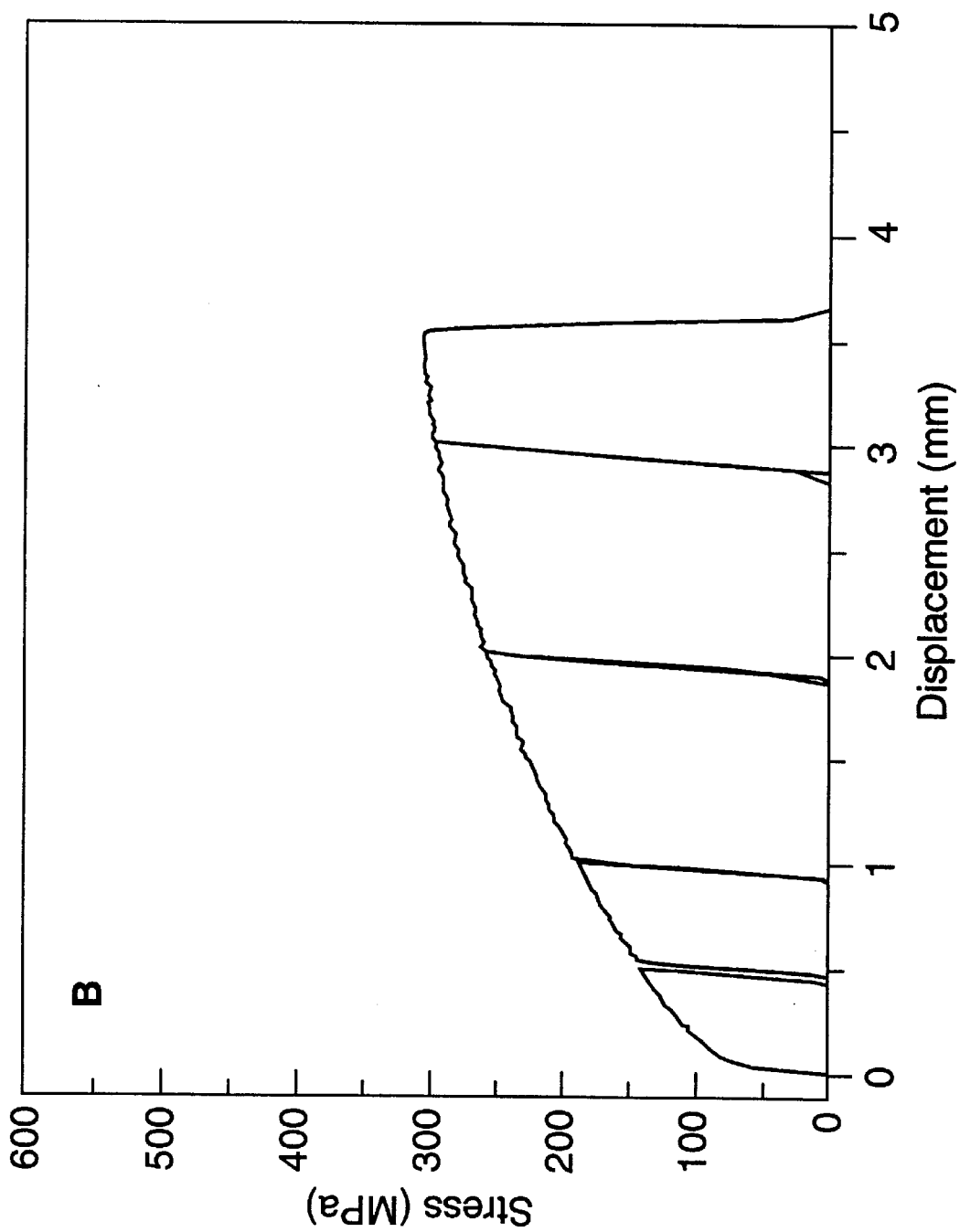
FIG. 11 shows a stress-displacement curve taken in tension on a standard dog bone, tensile, cube textured Ni-7% Cr sample. The 0.5% offset yield stress is slightly over 70 MPa and the ultimate tensile stress is 304 MPa.
Figure 12:
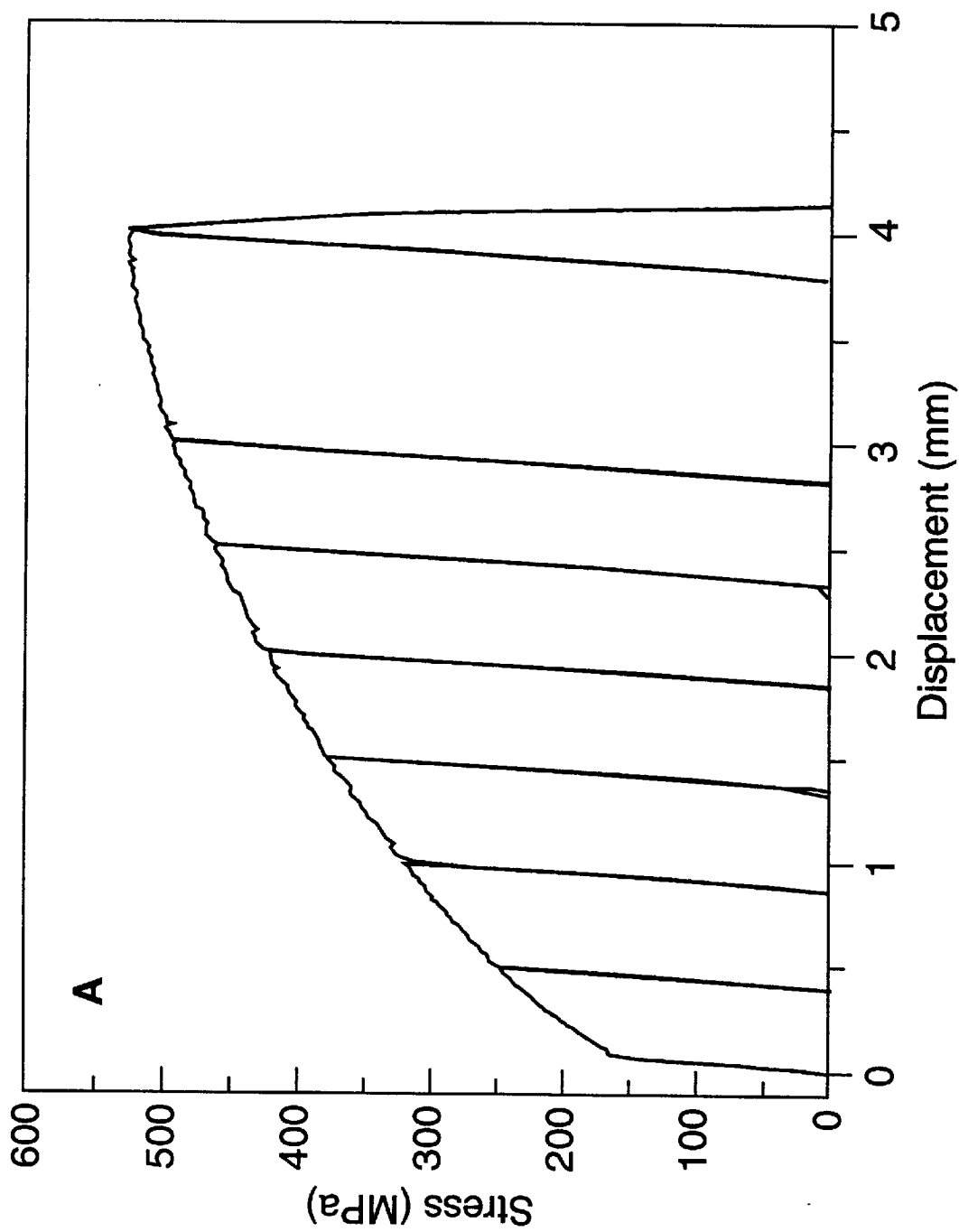
FIG. 12 shows a stress-displacement curve taken in tension on a standard dog bone, tensile, cube textured Ni-13% Cr sample. The 0.5% offset yield stress is slightly over 160 MPa and the ultimate tensile stress is 525 MPa.

These alloy substrates have reduced magnetism and have significantly increased yield strength and ultimate tensile strength. FIG. 9 shows DC magnetization loops taken at 77 K for cube textured, pure Ni sample, Ni-7% Cr and a Ni-13% Cr sample. All the samples have the same dimensions, hence the hysteresis in the magnetization loop indicated the relative amounts of magnetization effects in the sample. Note that the Ni-13% Cr is completely non-magnetic at 77 K. This is the temperature of operation for superconducting applications. FIG. 10 shows a stress-dispacement curve taken in tension on a standard dog bone, tensile, cube textured Ni sample. The sample was formed to a dog bone shape using laser machining procedures. A low strain rate was employed during the testing. Several unloadings were incorporated into the testing curve to get a good estimate of the slope of the stress-strain curve. The slope is then used with an off-set criteria to obtain the value of the yield stress. For pure Ni, the 0.5% offset yield stress is slightly over 50 MPa and the ultimate tensile stress is 221 MPa. FIG. 11 shows the stress-displacement data for a cube textured Ni-7% Cr sample. The 0.5% offset yield stress is slightly over 70 MPa and the ultimate tensile stress is 304 MPa. FIG. 12 shows a stress-dispacement for a cube textured Ni-13 % Cr sample. The 0.5% offset yield stress is slightly over 160 MPa and the ultimate tensile stress is 525 MPa. Clearly as is evident, addition of Cr and performing thermomechanical processing as described above results in a substrate which is cube textured, is non-magnetic at 77 K and is significantly stronger than Ni. Epitaxial growth of oxides, nitrides, or other buffer layers and then electronic materials can then be performed on these substrates.

Example 2

Ni—W Alloys

Figure 13:
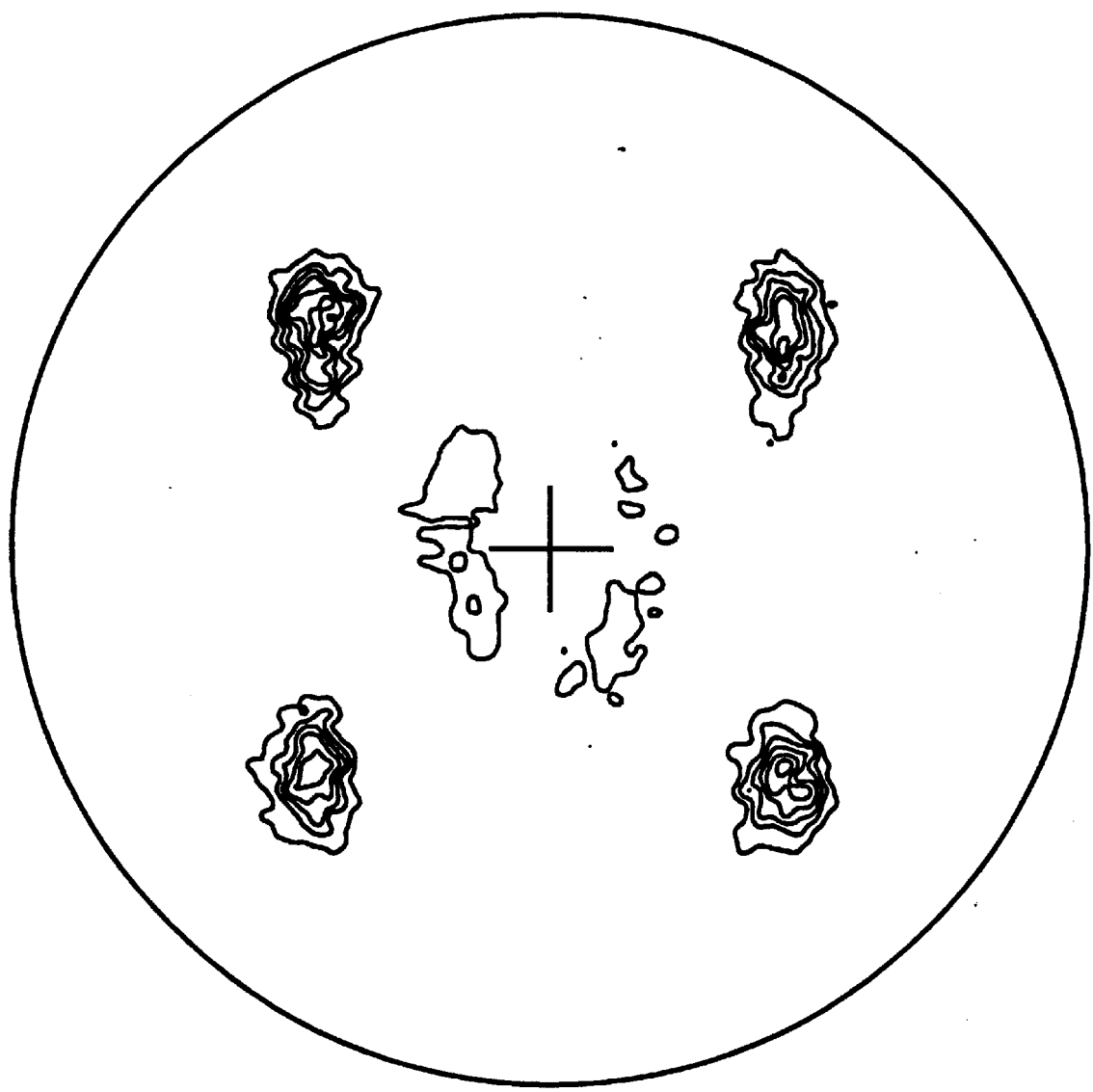
FIG. 13 shows a (111) X-ray pole figure for a Ni-5% W sample deformed by 95% using rolling and annealed at 900° C., indicating a fully developed cube texture of orientation {100}<100>.
Figure 14:
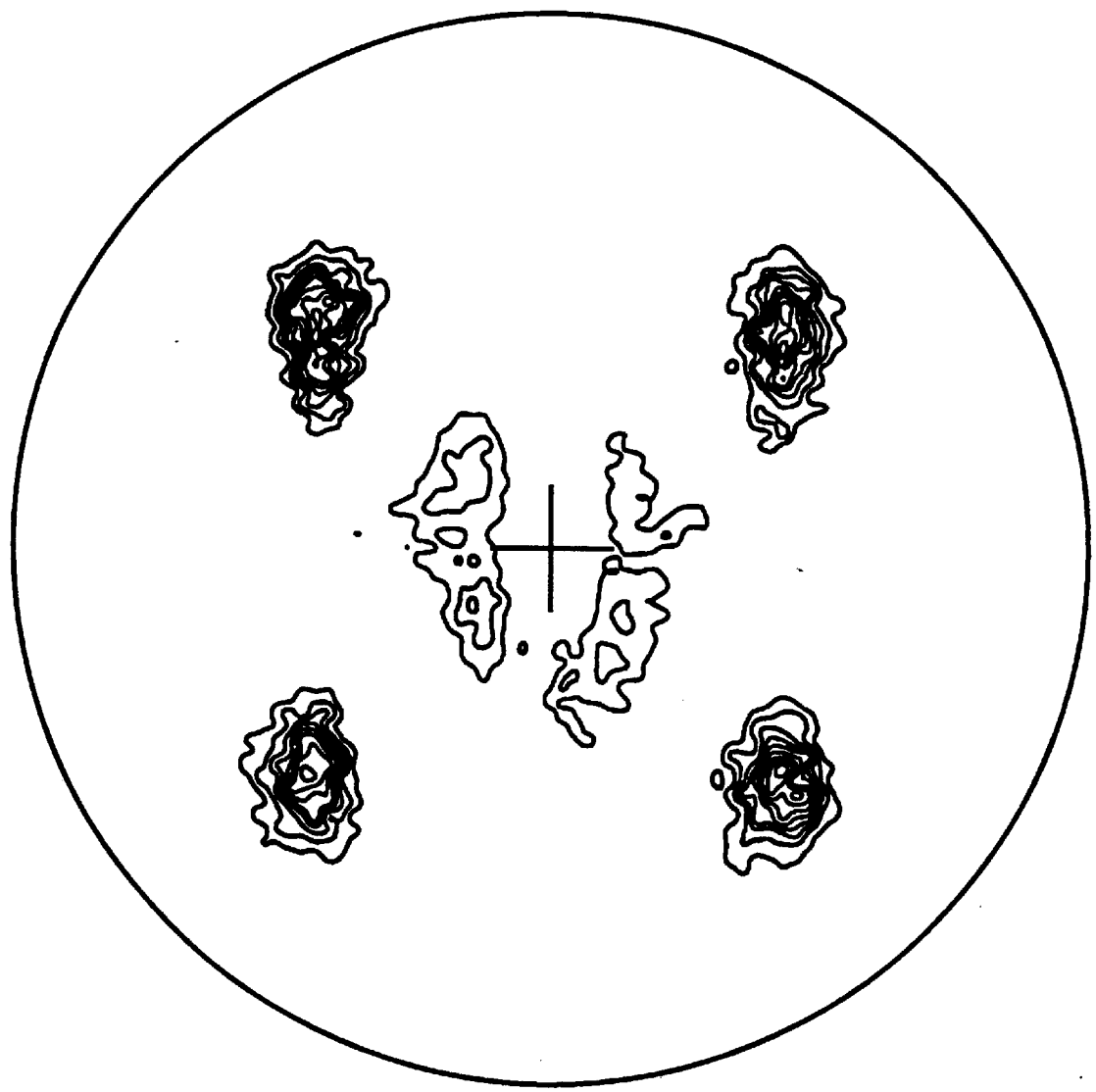
FIG. 14 shows a (111) X-ray pole figure for a Ni-10% W sample deformed by 95% using rolling and annealed at 900° C., indicating a strong cube texture of orientation {100}<100>.
Figure 15:
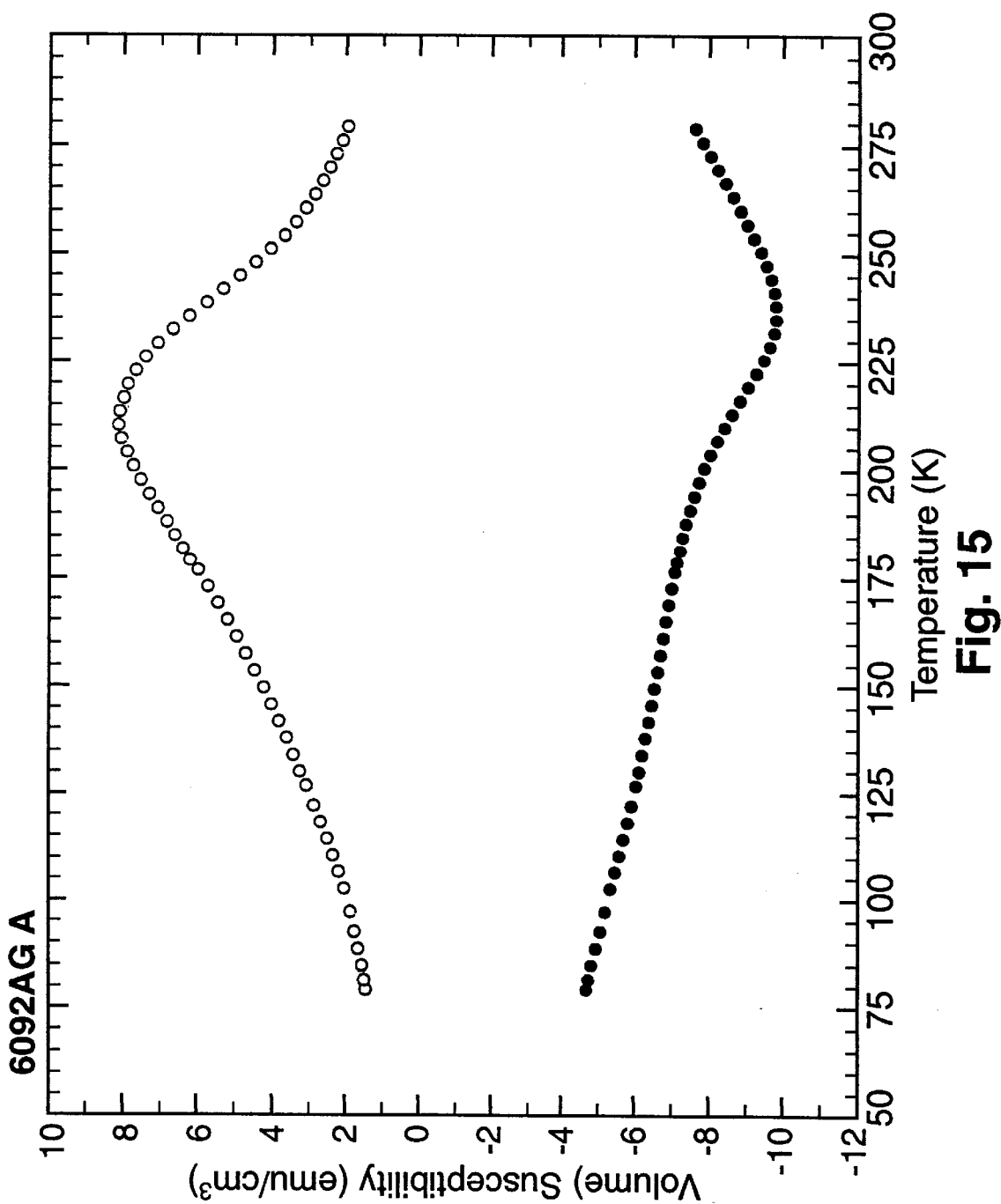
FIG. 15 shows magnetic susceptibility data for a cube textured, pure Ni sample. Open circles are imaginary components and closed circles are real components of the susceptibility. At all temperatures measured Ni is ferromagnetic as expected.
Figure 16:
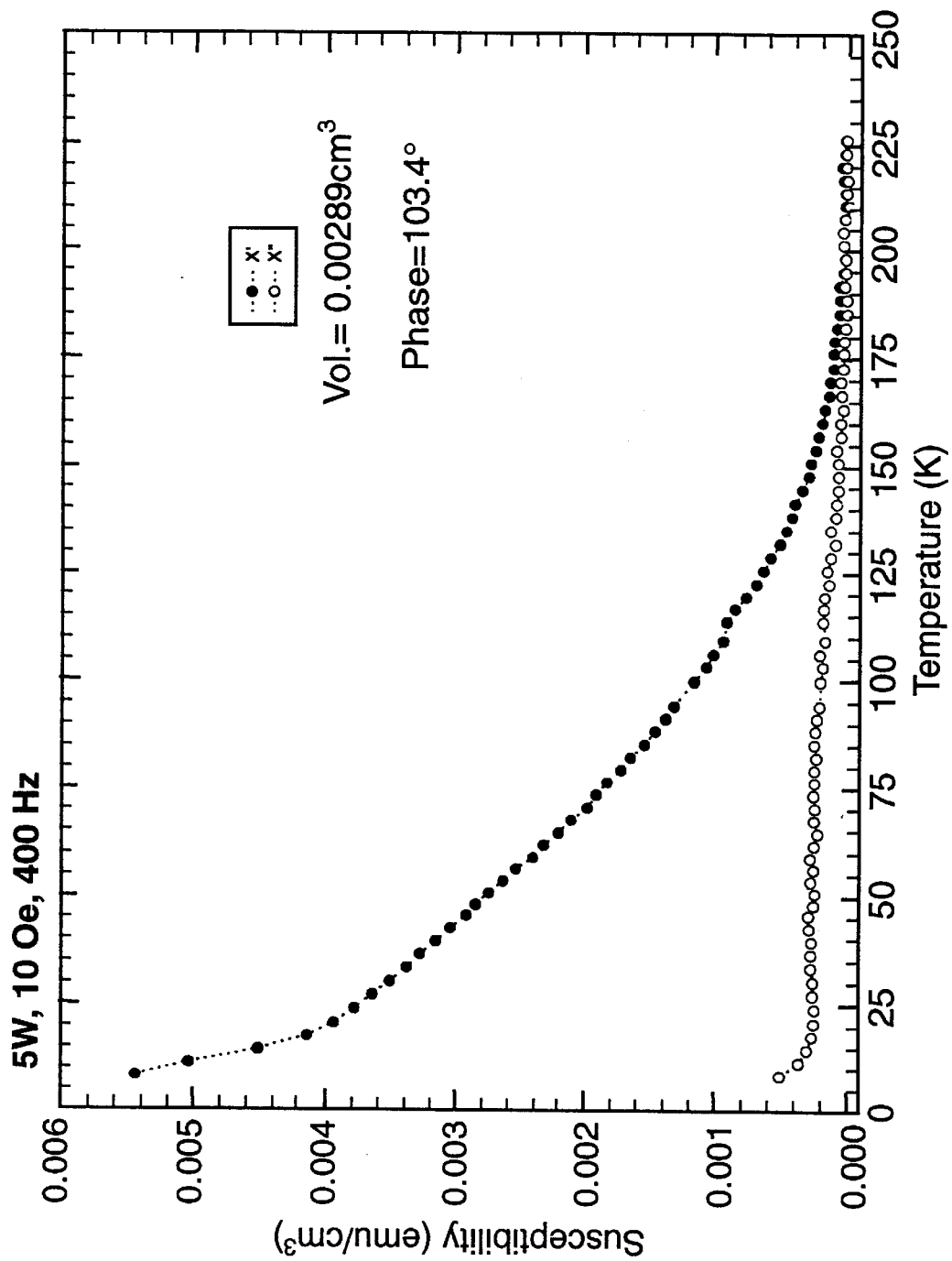
FIG. 16 shows magnetic susceptibility data for a cube textured, Ni-5% W sample. Open circles are imaginary components and closed circles are real components of the susceptibility. The Curie temperature above which the material is ferromagnetic has dropped below 200 K. Also note that the total magnetic moment is now much smaller compared to that of pure Ni shown in FIG. 15.

A method of texturing Ni with up to 10% W was performed using the following conditions: Grain size <1000 µm, preferably 5 µm; Reverse rolling; Percentage deformation: >95%; Annealing temperature >800° C. FIG. 13 shows a (111) X-ray pole figure for a Ni-5% W alloy, rolled to a deformation of ~95% and annealed at 900° C. for 2 hrs. FIG. 14 shows a (111) X-ray pole figure for a Ni-10% W sample deformed by 95% using rolling and annealed at 900° C., indicating a strong cube texture of orientation {100}<100>. In both cases a sharp texture is obtained. Such substrates are also stronger than pure Ni and have reduced magnetic moments. FIG. 15 shows magnetic susceptibility data for a cube textured, pure Ni sample. Open circles are imaginary components and closed circles are real components of the susceptibility. At all temperatures measured Ni is ferromagnetic as expected. FIG. 16 shows magnetic susceptibility data for a cube textured, Ni-5% W sample. Open circles are imaginary components and closed circles are real components of the susceptibility. The Curie temperature above which the material is ferromagnetic has dropped below 200 K. Also note that the total magnetic moment is now much smaller compared to that of pure Ni shown in FIG. 15. Epitaxial growth of oxides, nitrides, or other buffer layers and then electronic materials can then be performed on these substrates.

Example 3

Ni—Al Alloys

Figure 17:
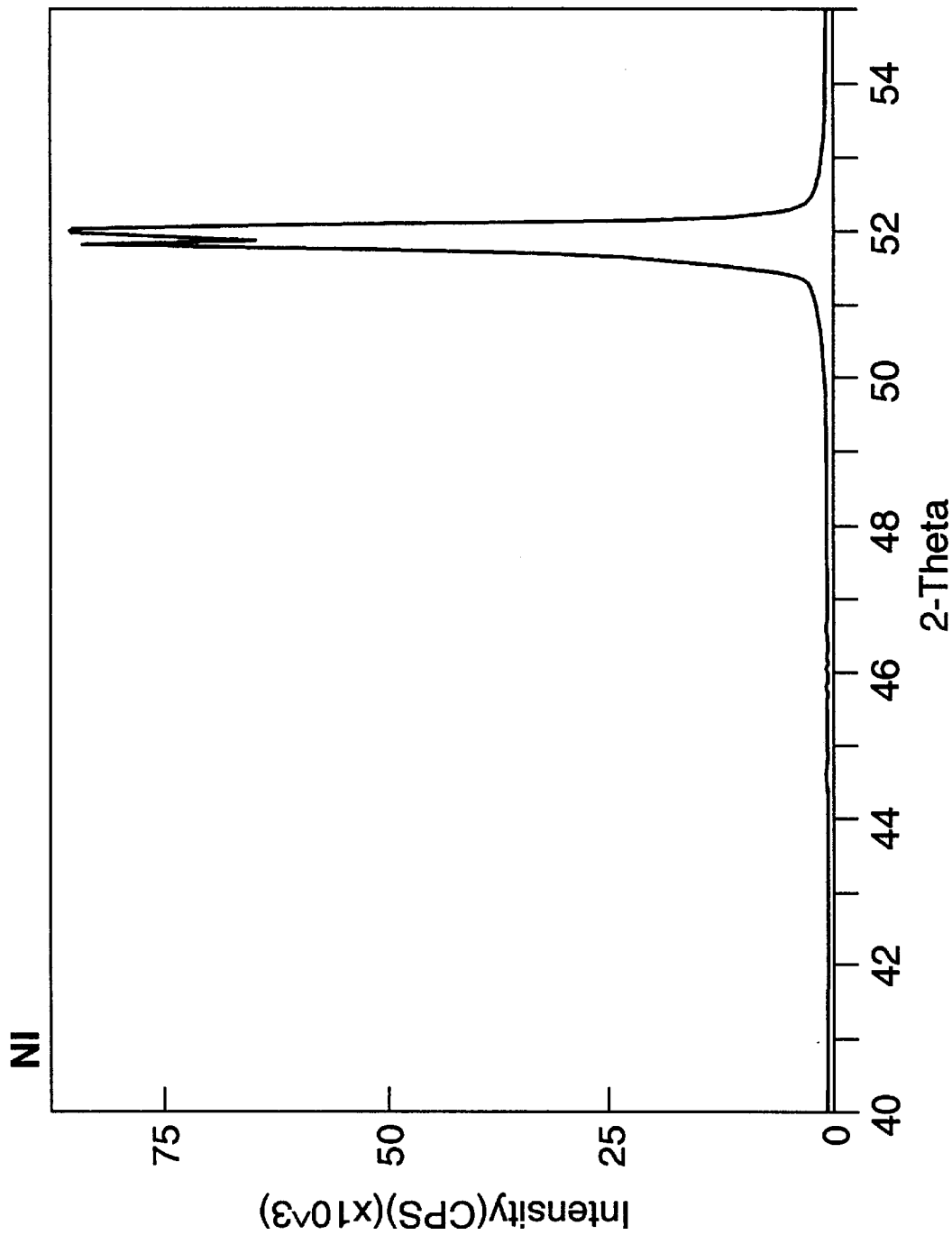
FIG. 17 shows a θ-2θ plot for a Ni-5% Al alloy, rolled to a deformation of ~95% and annealed at 900° C. for 2 hrs. Note that only a (200) reflection is observed indicating a sharp texture.
Figure 18:
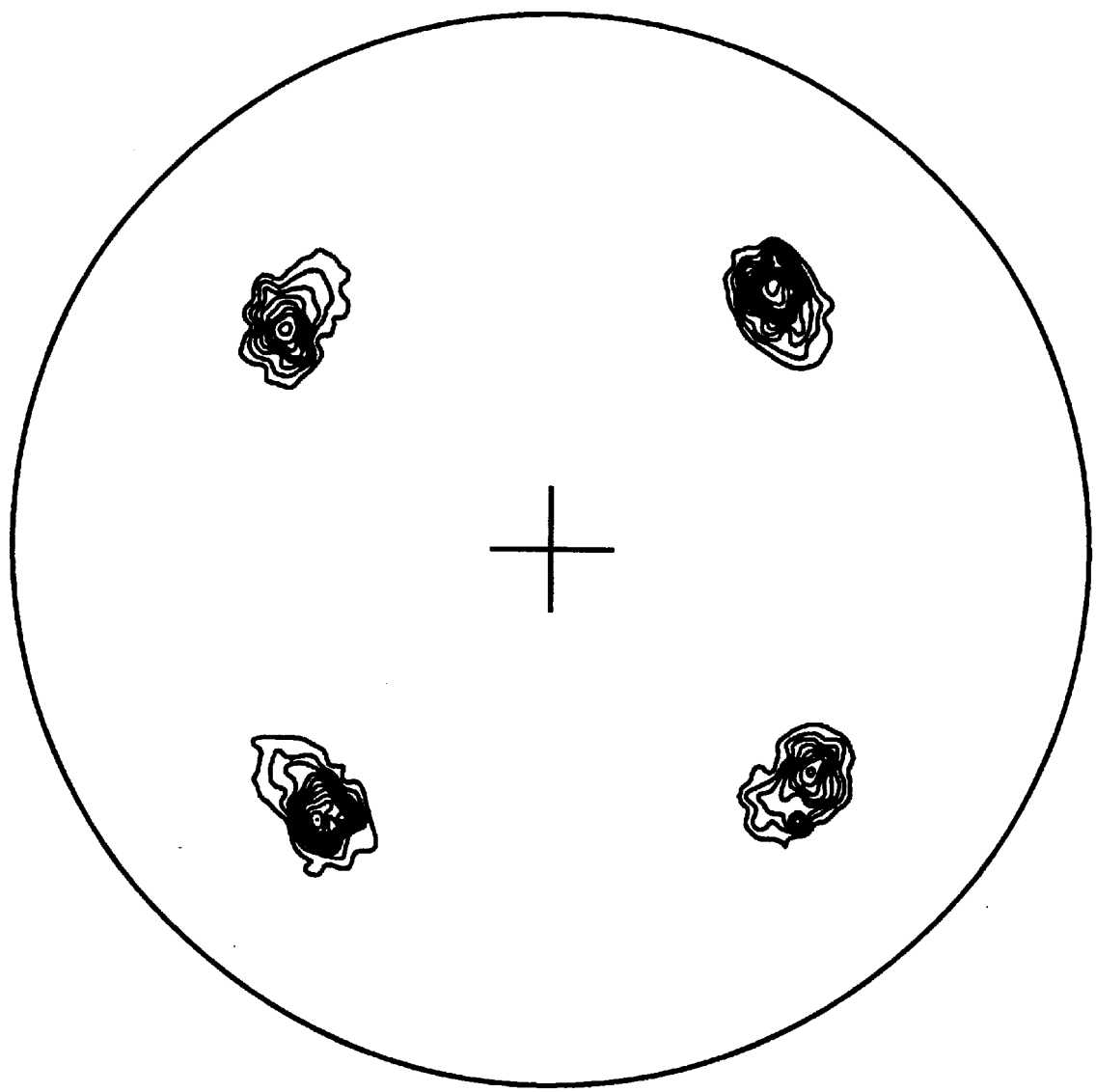
FIG. 18 shows a (111) X-ray pole figure for the sample shown in FIG. 17 indicating a fully developed cube texture of orientation {100}<100>.
Figure 19:
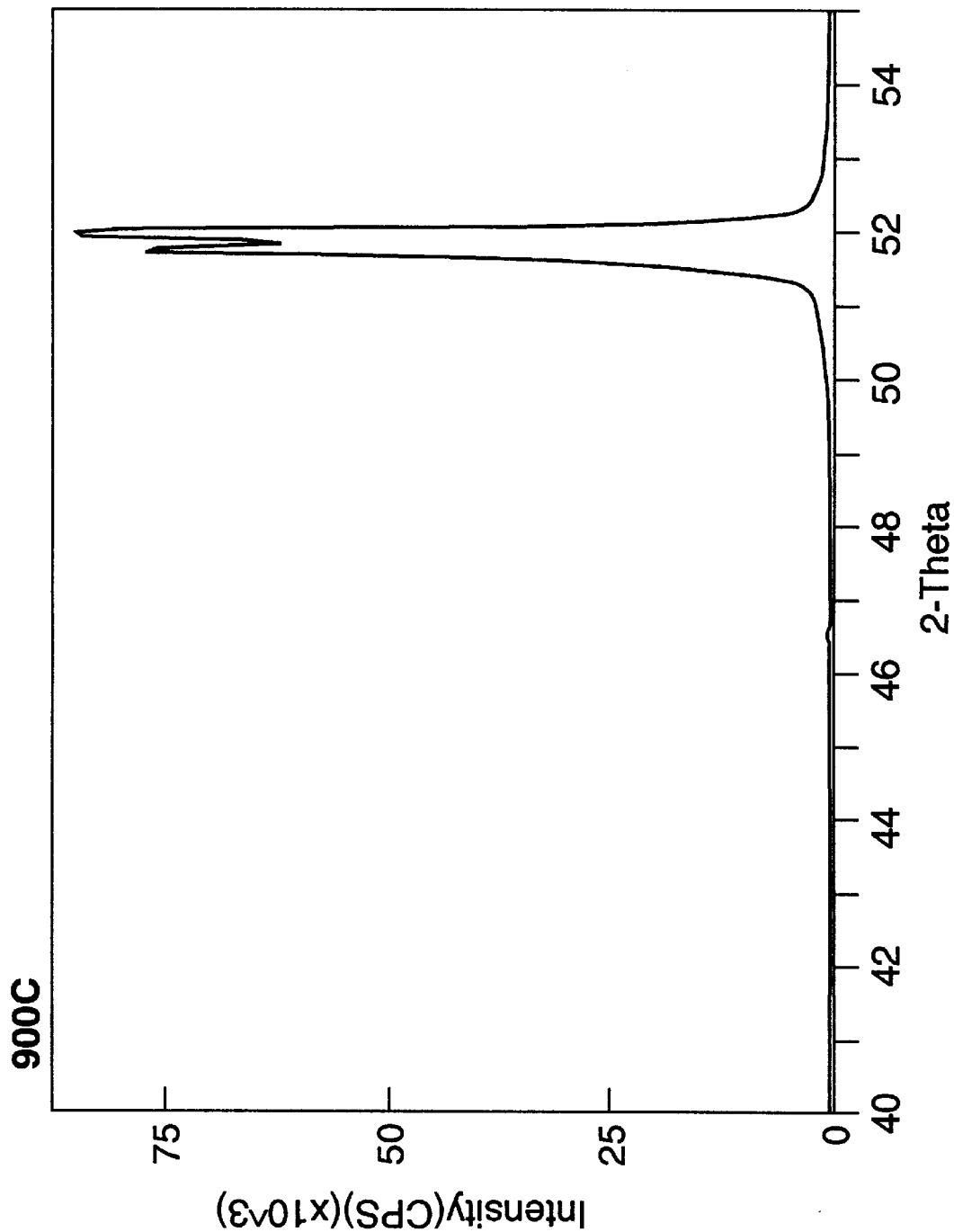
FIG. 19 shows a θ-2θ plot for a Ni-7% Al alloy, rolled to a deformation of ~95% and annealed at 900° C. for 2 hrs. Note that only a (200) reflection is observed indicating a sharp texture.
Figure 20:
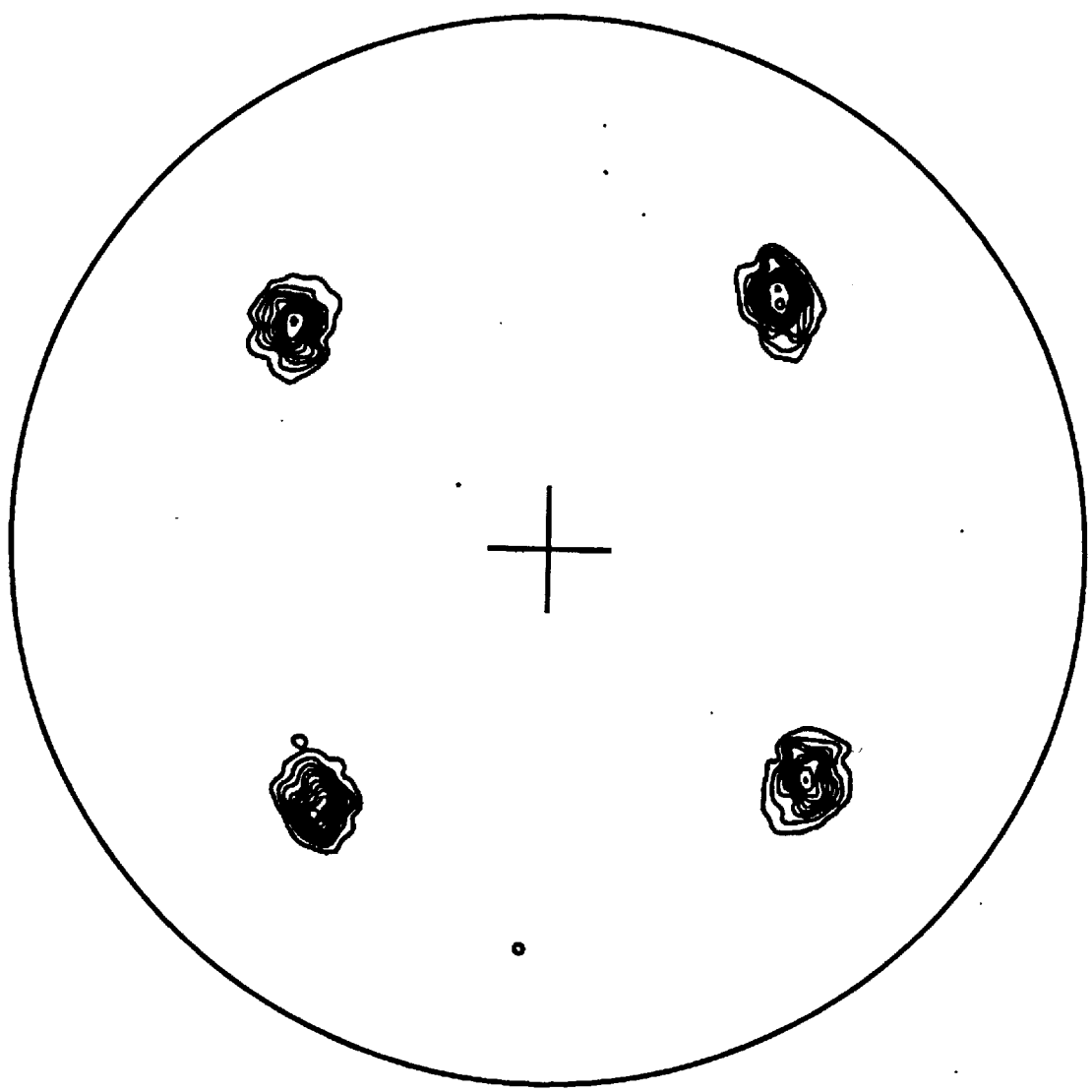
FIG. 20 shows a (111) X-ray pole figure for the sample shown in FIG. 19 indicating a fully developed cube texture of orientation {100}<100>.
Figure 21:
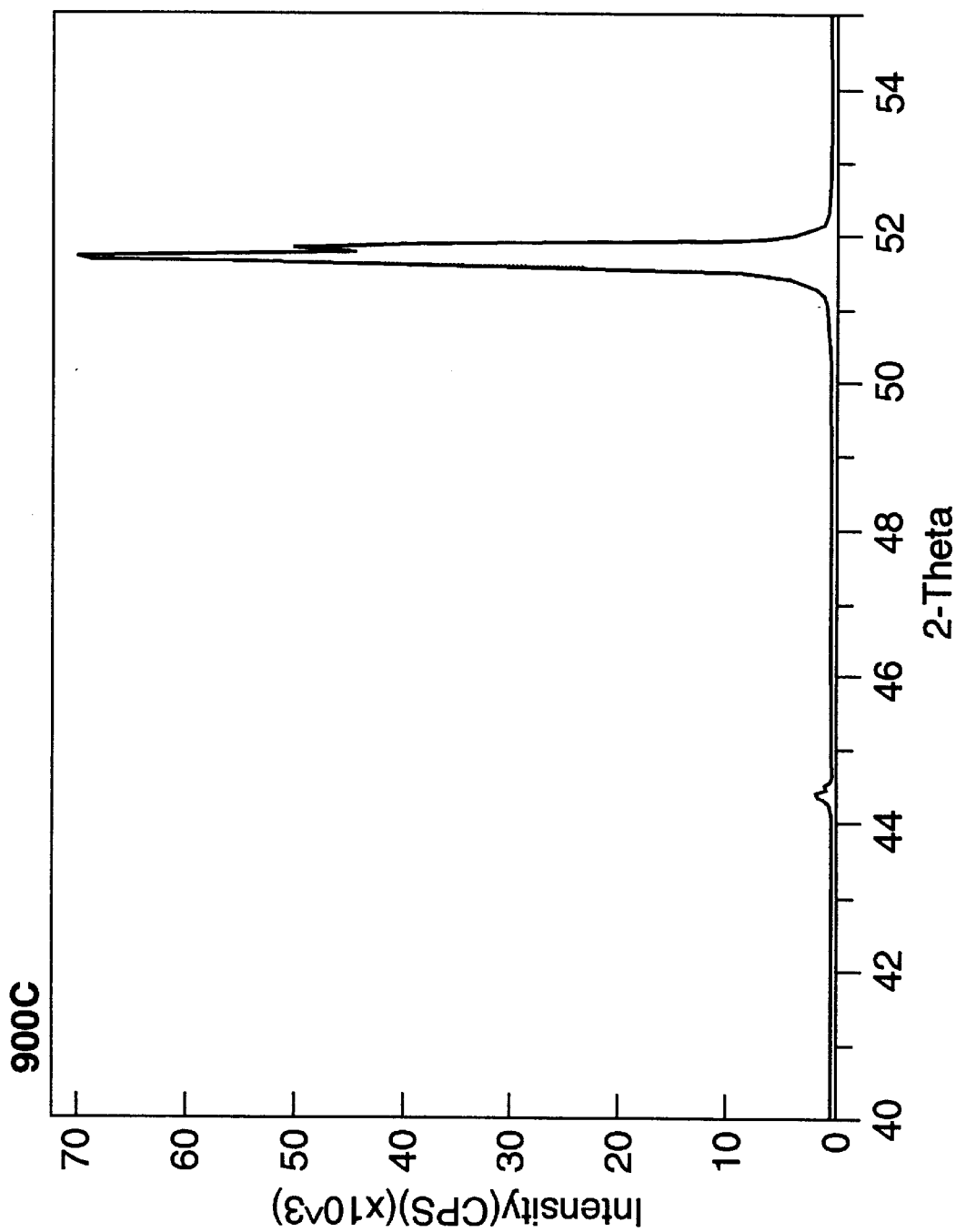
FIG. 21 shows a θ-2θ plot for a Ni-10% Al alloy, rolled to a deformation of ~95% and annealed at 900° C. for 2 hrs. Note that only a (200) reflection is observed indicating a sharp texture.
Figure 22:
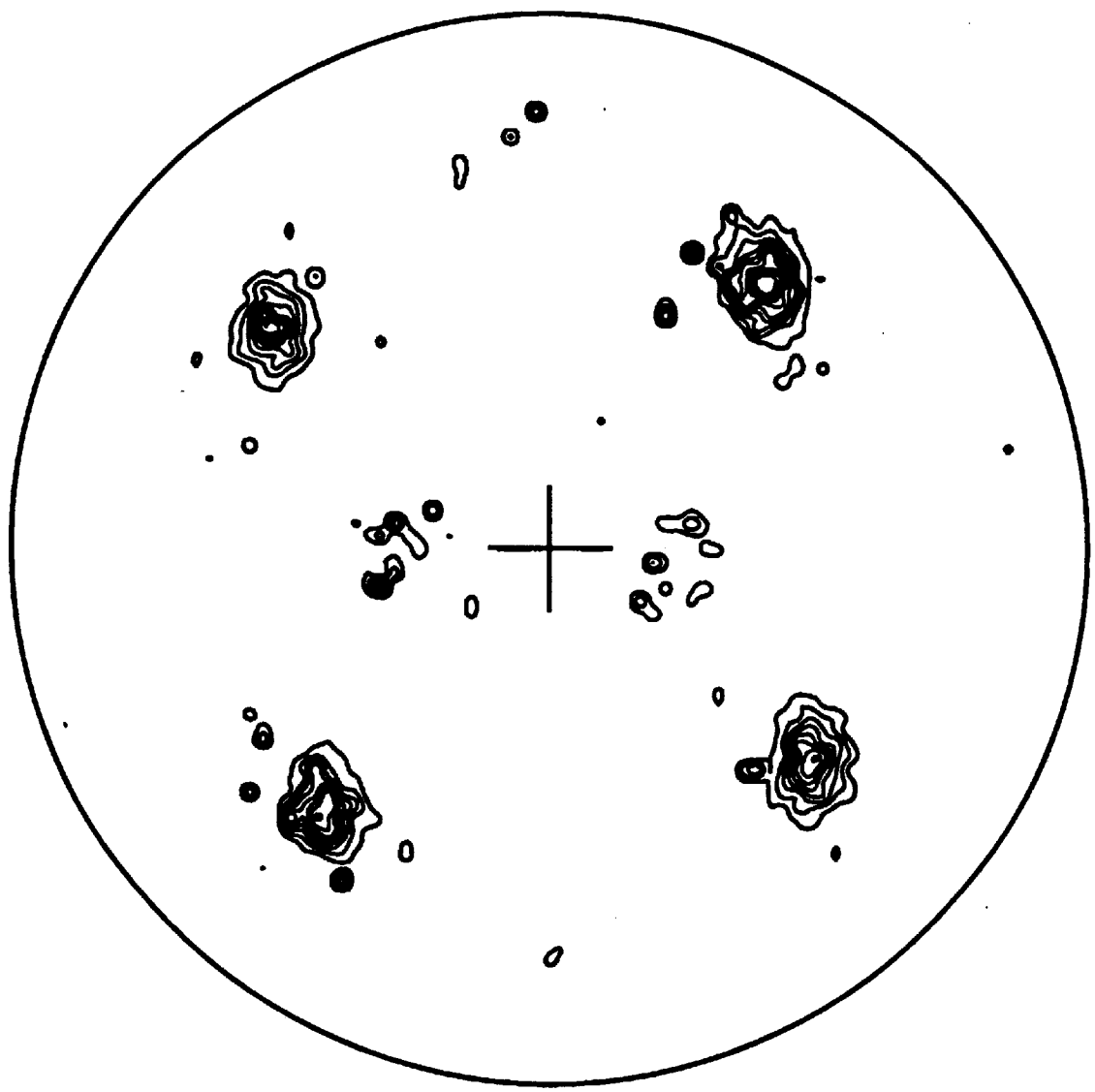
FIG. 22 shows a (111) X-ray pole figure for the sample shown in FIG. 21 indicating a strong cube texture of orientation {100}<100>.

A method of texturing Ni with up to 10% Al was performed using the following conditions: Grain size <1000 µm, preferably 5 µm; Reverse rolling; Percentage deformation: >95%; Annealing temperature >800° C. FIG. 17 shows a θ-2θ for a Ni-5% Al sample deformed by 95% using rolling and annealed at 900° C., indicating a fully developed cube texture of orientation {100}<100>. FIG. 18 shows a (111) X-ray pole figure for the Ni-5% Al sample annealed at 900° C., indicating a fully developed cube texture of orientation {100}<100>. FIG. 19 shows a θ-2θ plot fora Ni-7% Al alloy, rolled to a deformation of ~95% and annealed at 900° C. for 2 hrs. FIG. 20 shows a (111 ) X-ray pole figure for the Ni-7% Al sample annealed at 900° C., indicating a fully developed cube texture of orientation {100}<100>. FIG. 21 shows a θ-2θ plot for a Ni-10% Al alloy, rolled to a deformation of ~95% and annealed at 900° C. for 2 hrs. FIG. 22 shows a (111) X-ray pole figure for the Ni-10% Al sample annealed at 900° C., indicating a strong cube texture of orientation {100}<100>. The cube texture is however not as sharp as that for Ni-5% Al and Ni-7% Al indicating that 10% Al may be approaching a limit for Al additions. Aluminum additions decrease the Curie point of Ni as well as greatly increase the mechanical strength. Epitaxial growth of oxides, nitrides, or other buffer layers and then electronic materials can then be performed on these substrates.

Example 4

Ni—Cr—Al Alloys

Figure 23:
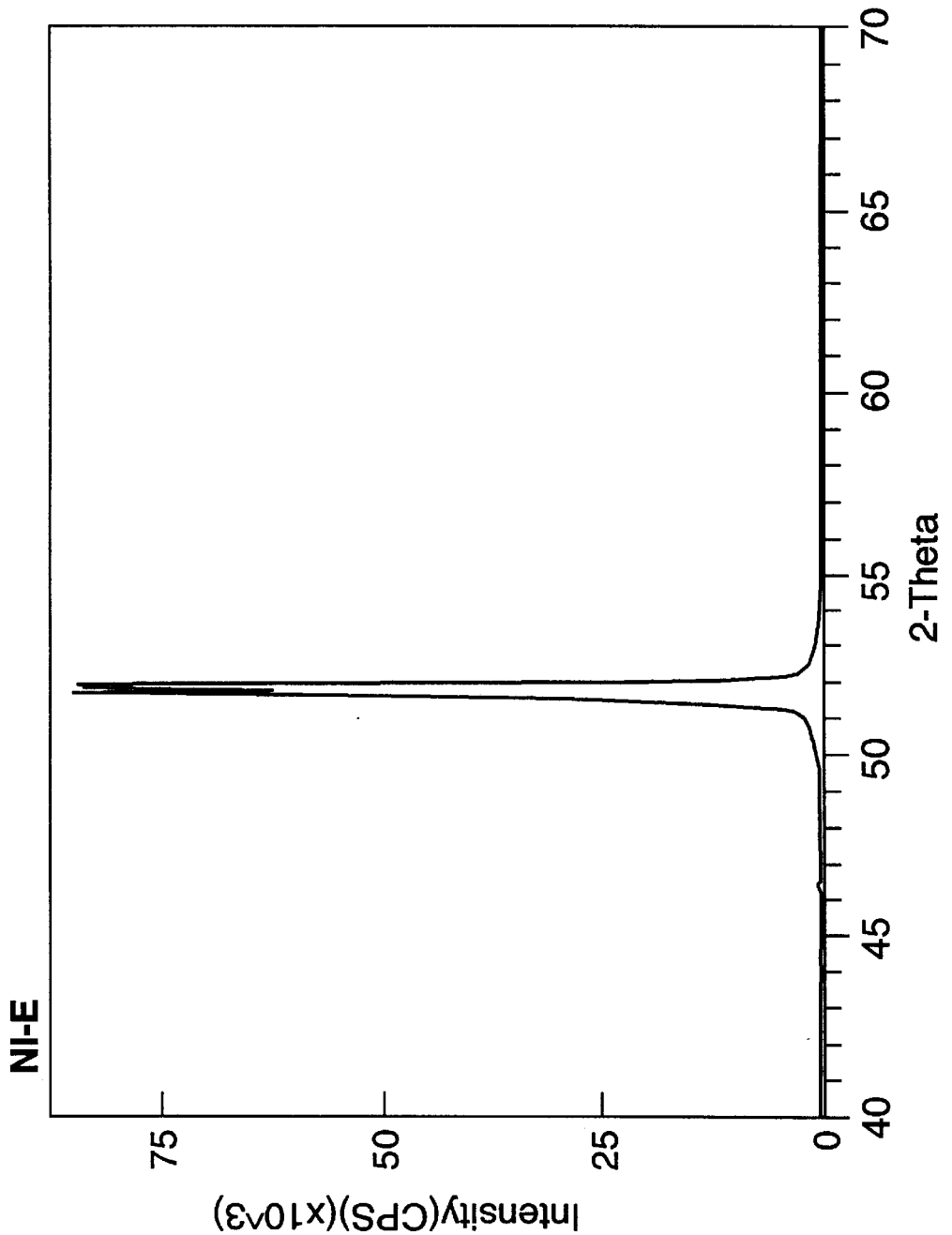
FIG. 23 shows a θ-2θ plot for a Ni-7% Cr-2% Al ternary alloy, rolled to a deformation of ~95% and annealed at 900° C. for 2 hrs. Note that only a (200) reflection is observed indicating a sharp texture.
Figure 24:
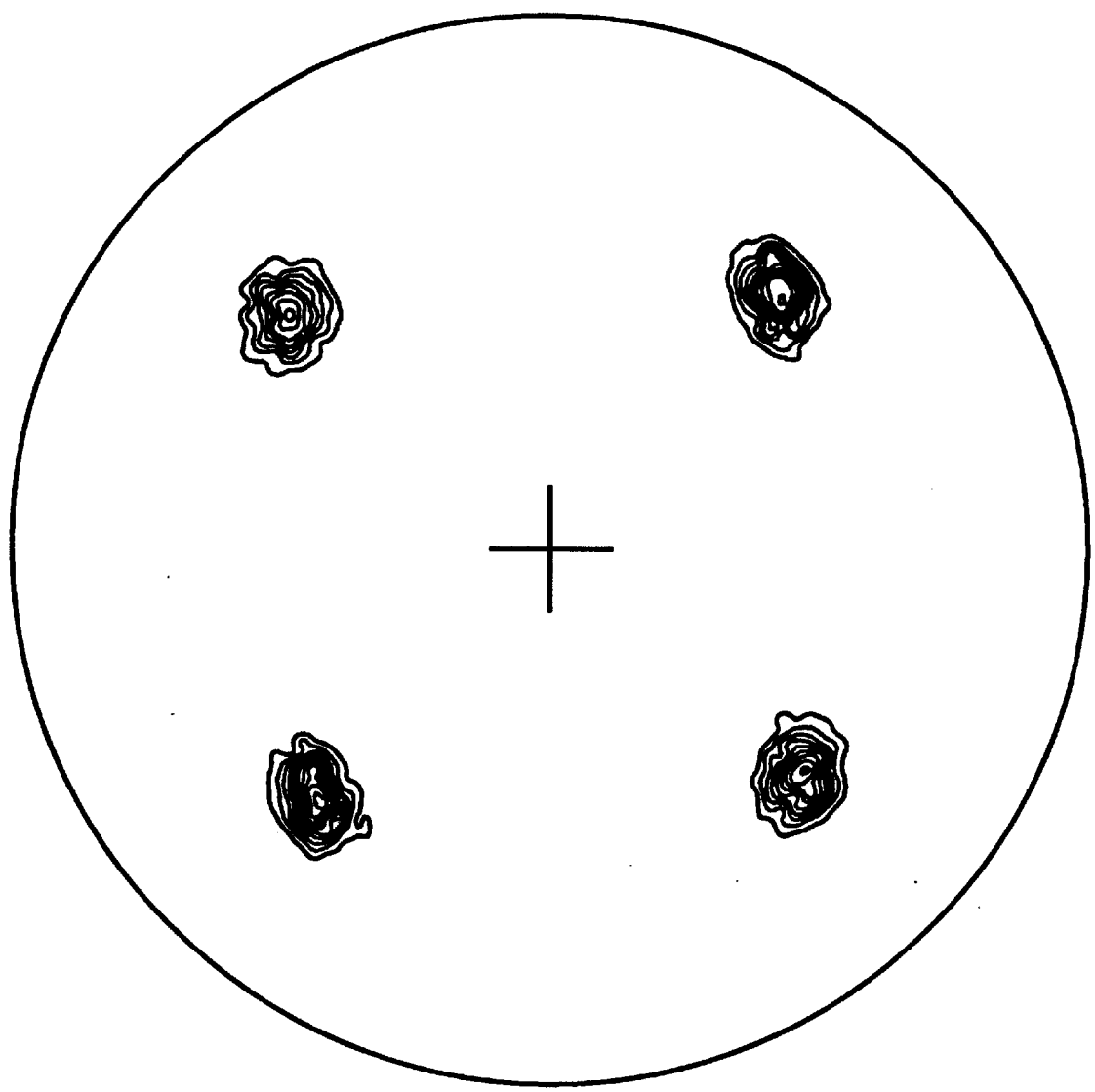
FIG. 24 shows a (111) X-ray pole figure for the sample shown in FIG. 23 indicating a fully developed cube texture of orientation {100}<100>.
Figure 25:
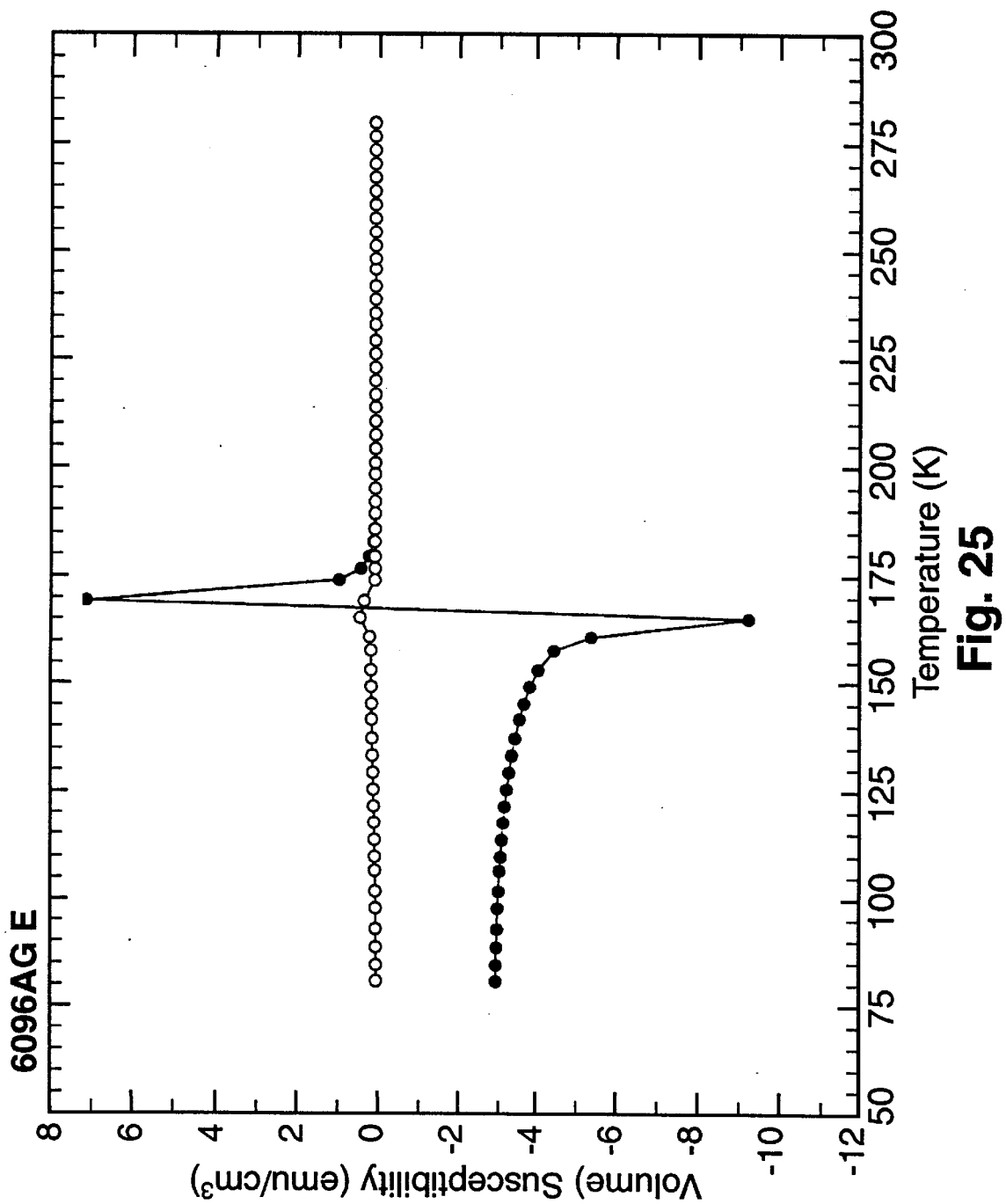
FIG. 25 shows magnetic susceptibility data for a cube textured Ni-7% Cr-2% Al ternary alloy sample. Open circles are imaginary components and closed circles are real components of the susceptibility. The Curie temperature above which the material is ferromagnetic has dropped to ~175 K.
Figure 26:
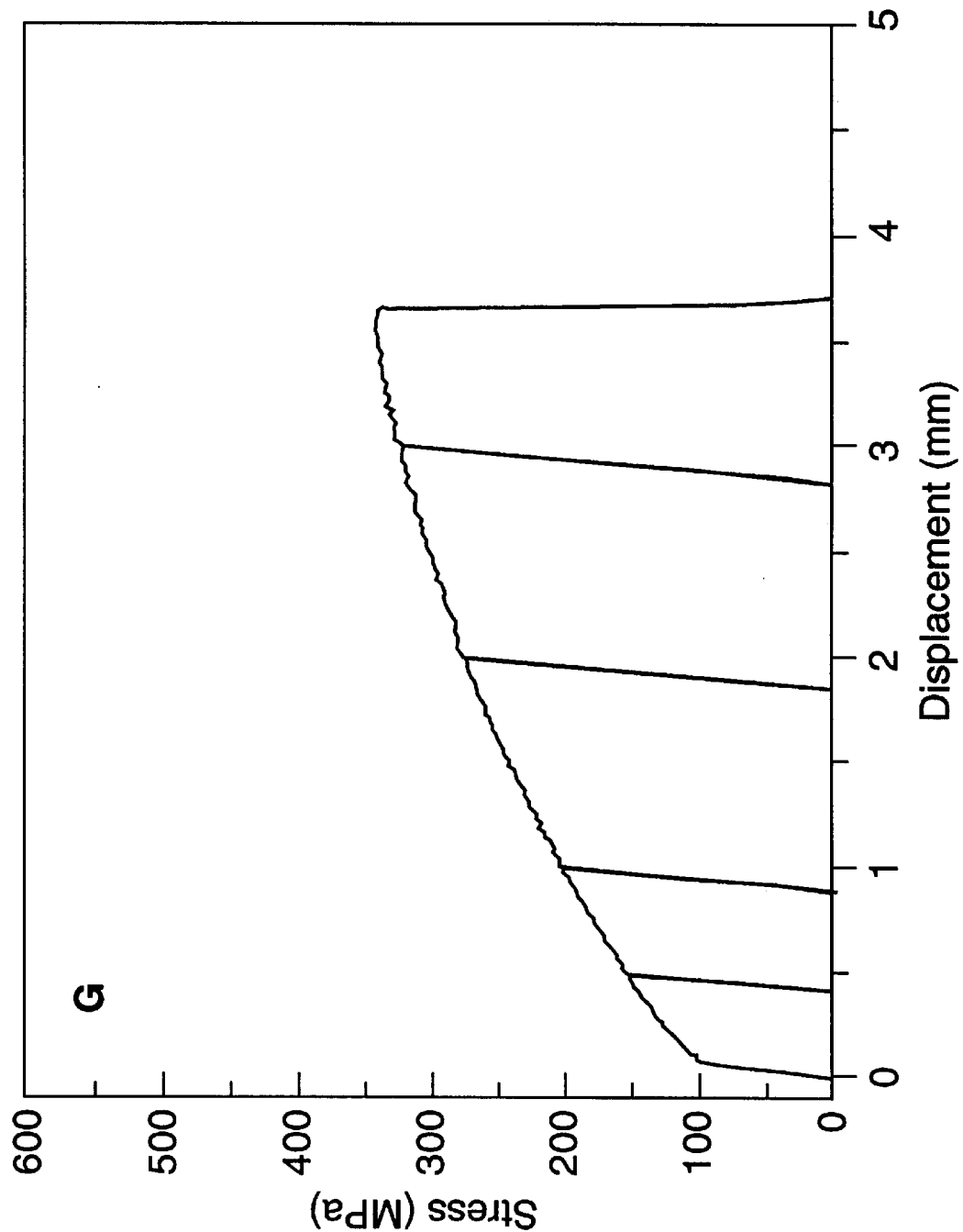
FIG. 26 shows a stress-displacement curve taken in tension on a standard dog bone, tensile, cube textured Ni-7% Cr-2% Al ternary alloy sample. The 0.5% offset yield stress is slightly over 100 MPa and the ultimate tensile stress is 310 MPa.
Figure 27:
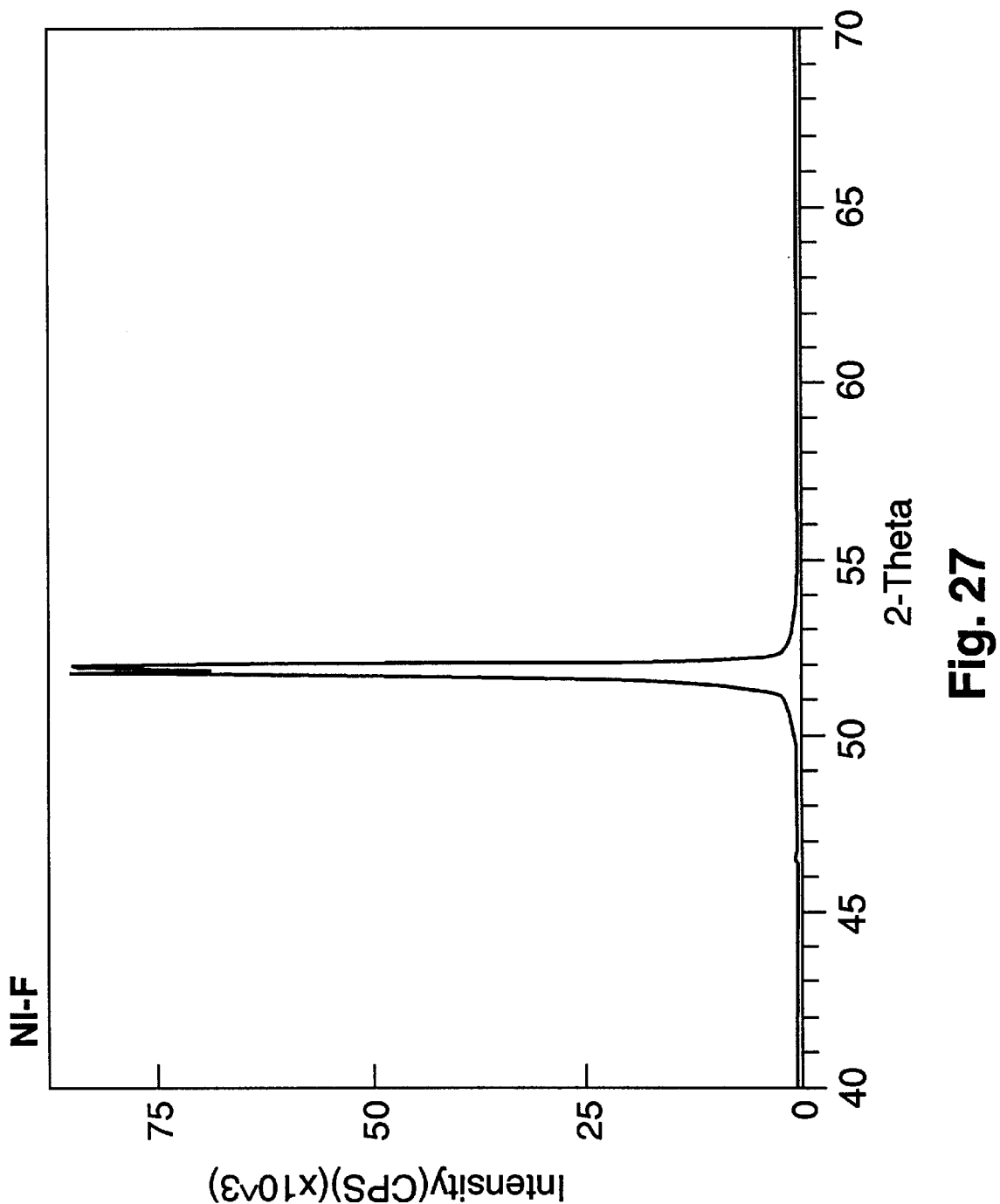
FIG. 27 shows a θ-2θ plot for a Ni-7% Cr-4% Al ternary alloy, rolled to a deformation of ~95% and annealed at 900° C. for 2 hrs. Note that only a (200) reflection is observed indicating a sharp texture.
Figure 28:
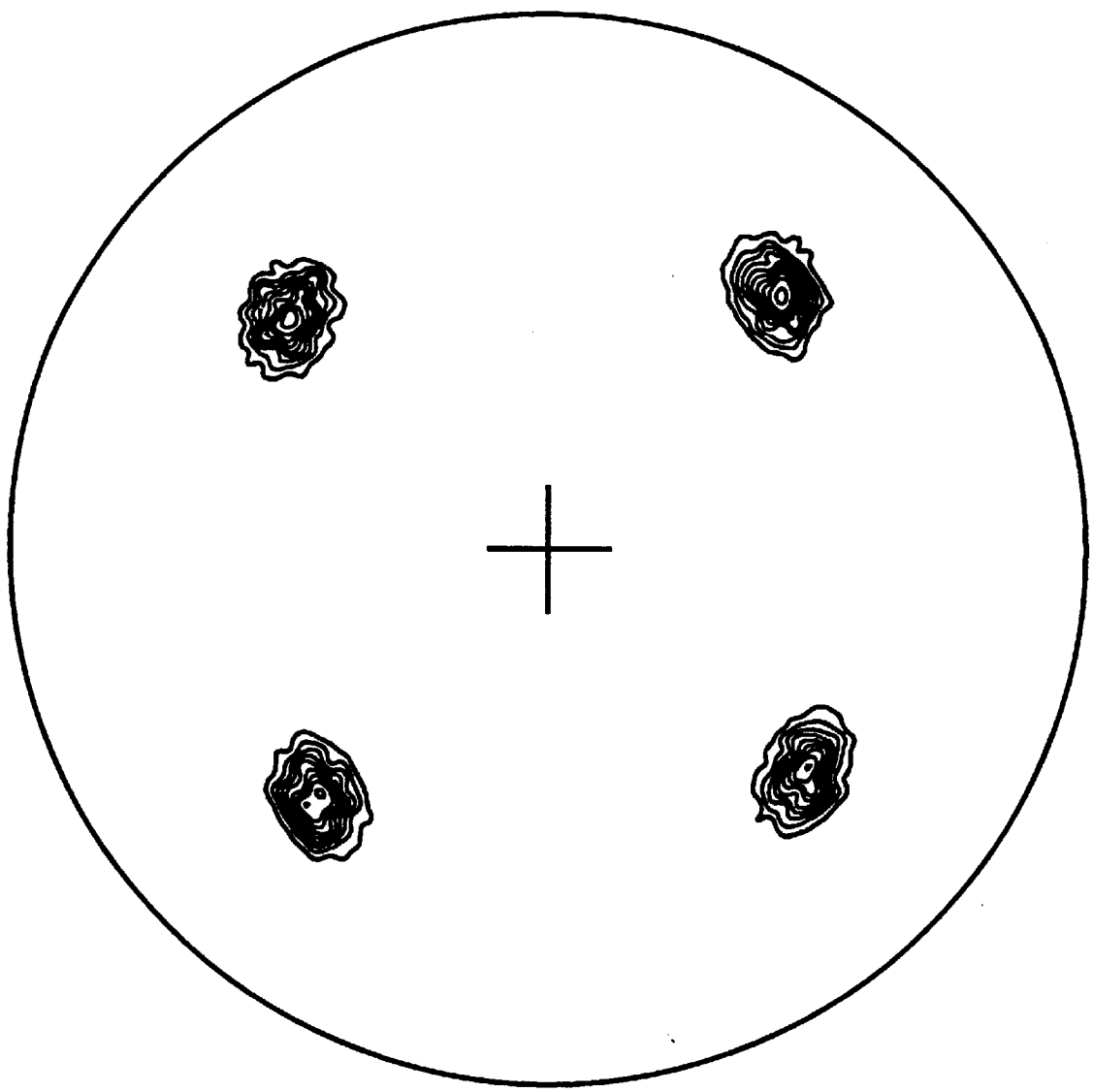
FIG. 28 shows a (111) X-ray pole figure for the sample shown in FIG. 27 indicating a fully developed cube texture of orientation {100}<100>.
Figure 29:
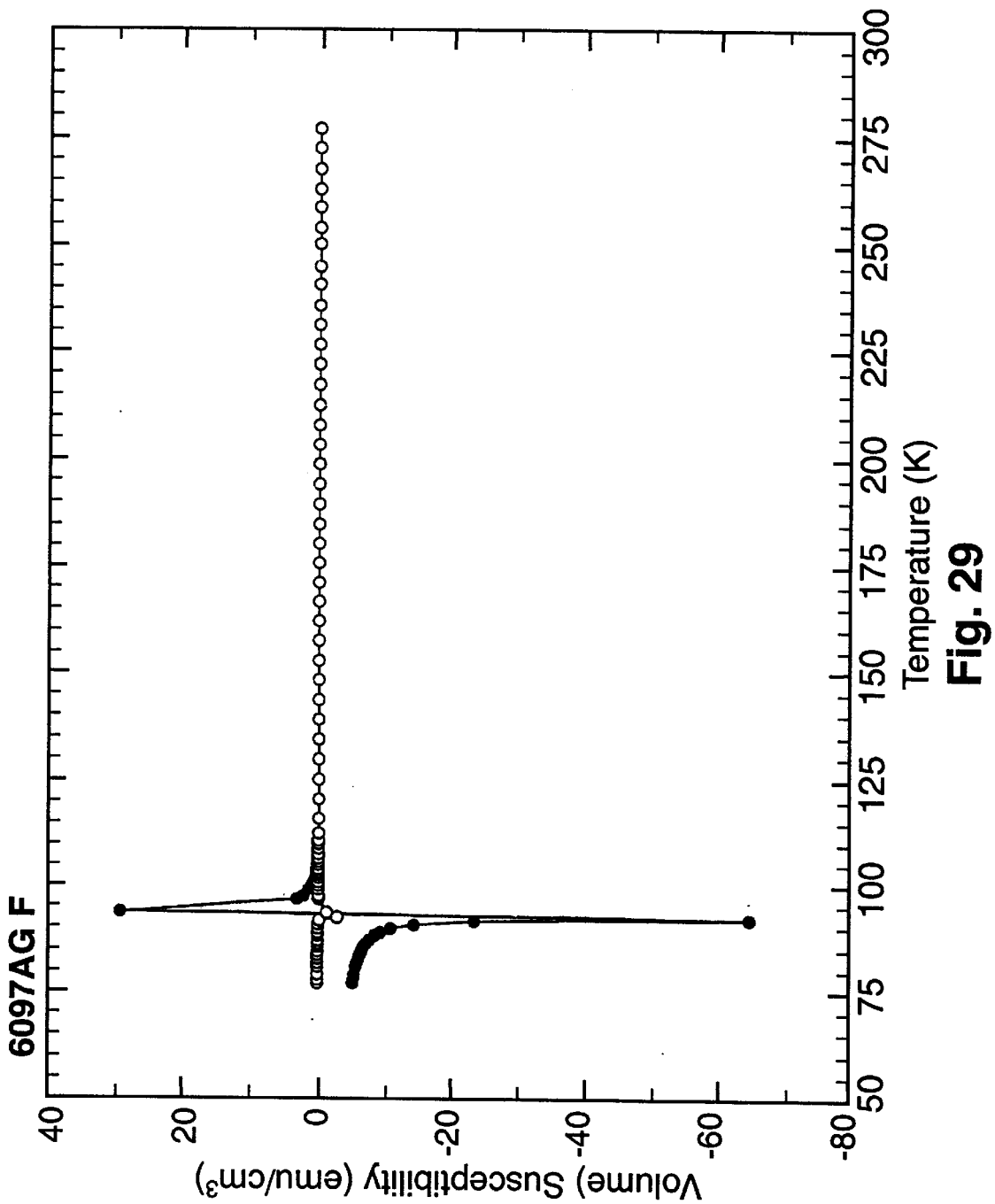
FIG. 29 shows magnetic susceptibility data for a cube textured Ni-7% Cr-2% Al ternary alloy sample. Open circles are imaginary components and closed circles are real components of the susceptibility. The Curie temperature above which the material is ferromagnetic has dropped to ~100 K.
Figure 30:
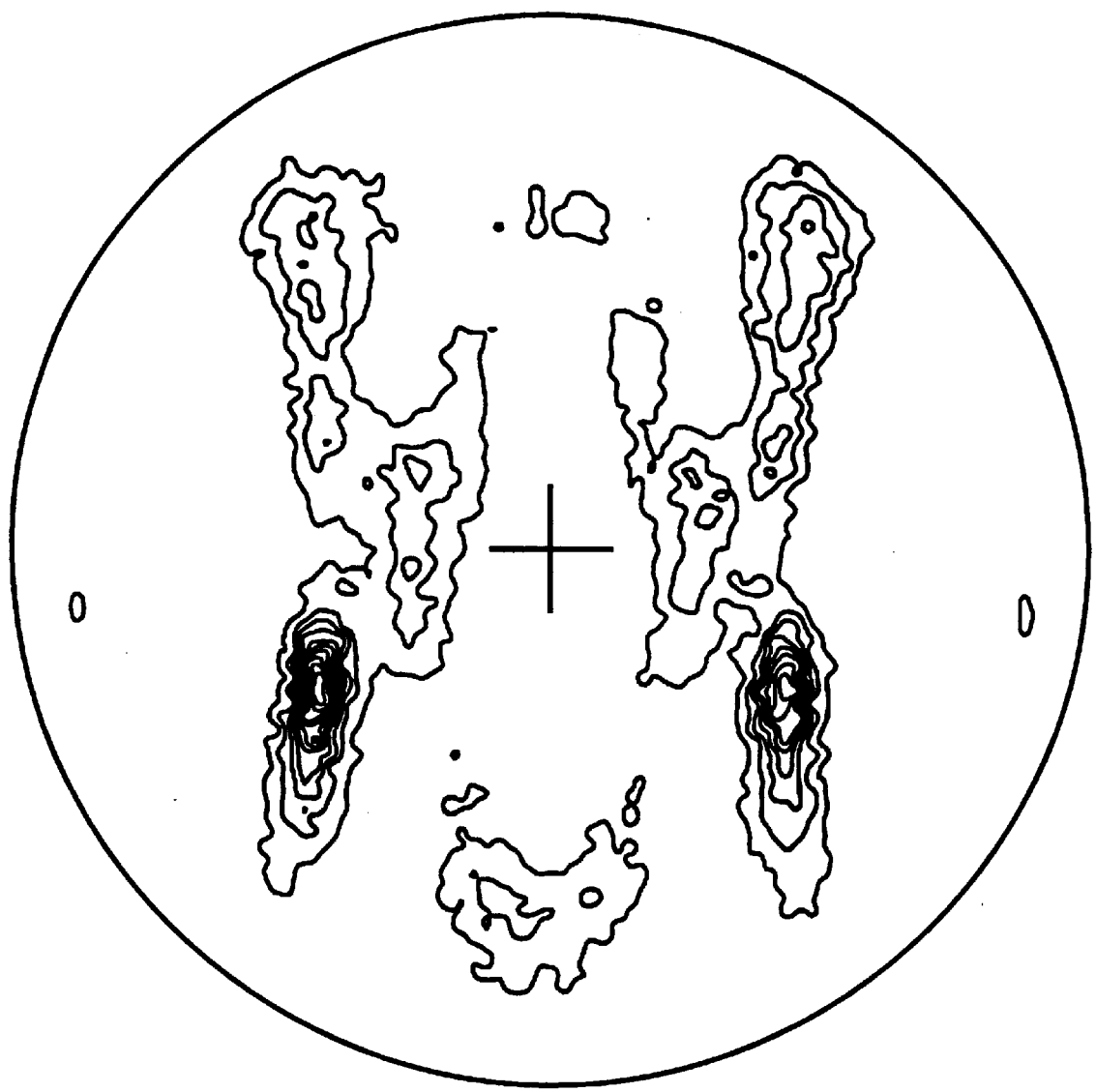
FIG. 30 shows a (111) X-ray pole figure for a Ni-7% Cr-10% Al ternary alloy sample deformed to ~95% deformation by rolling and annealed at 900° C. A fully developed cube texture is not formed.
Figure 31:
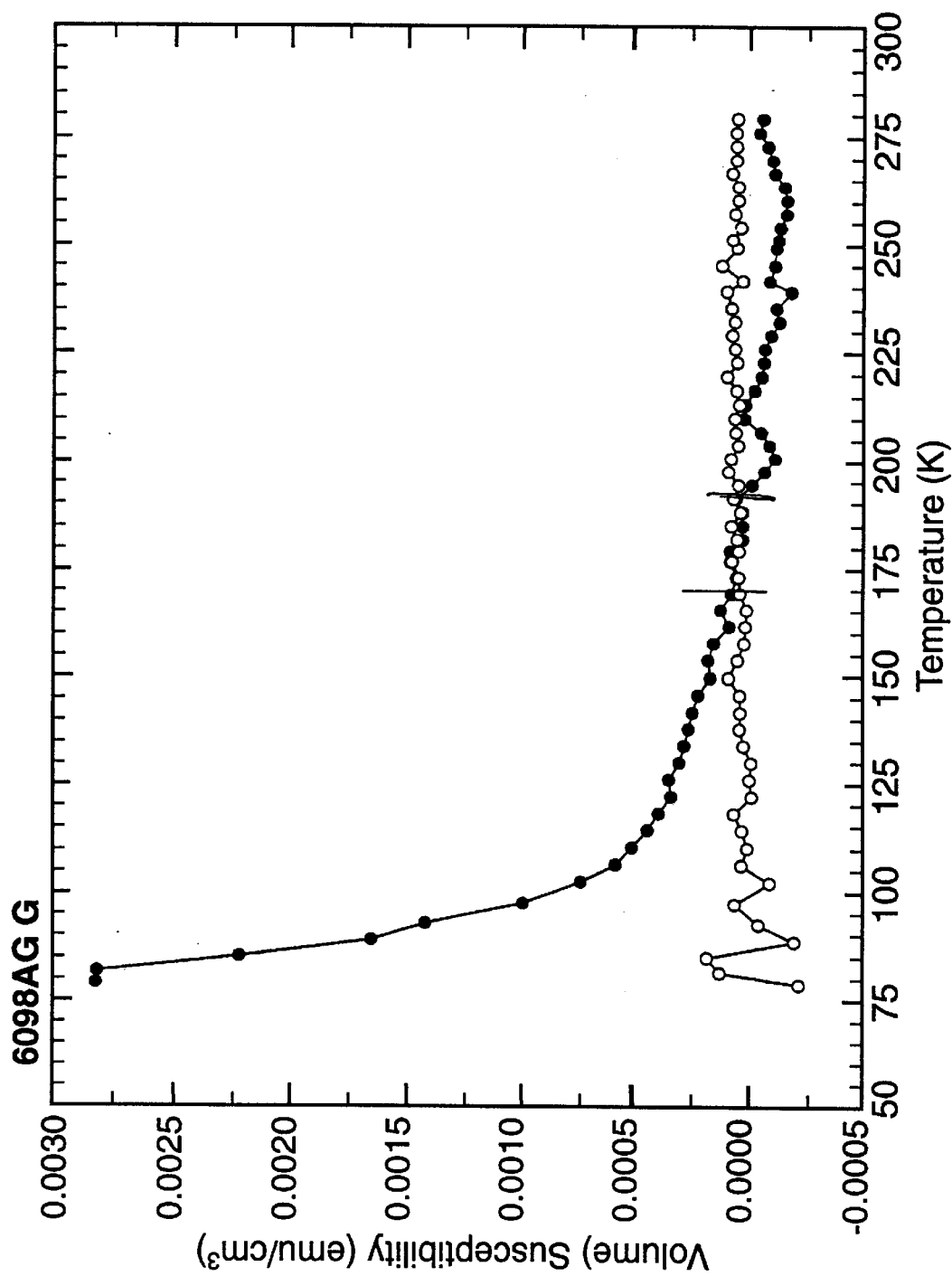
FIG. 31 shows magnetic susceptibility data for a cube textured Ni-7% Cr-10% Al ternary cube textured sample. Open circles are imaginary components and closed circles are real components of the susceptibility. The Curie temperature above which the material is ferromagnetic has dropped to ~175 K. Note that the magnetic moment or signal has practically vanished at all temperatures up to 77 K.

A method of texturing Ni with up to 13% Cr and 4% Al was performed using the following conditions: Grain size <1000 µm, preferably 5 µm; Reverse rolling; Percentage deformation: >95%; Annealing temperature >800° C. FIG. 23 shows a θ-2θ plot for a Ni-7% Cr-2% Al alloy, rolled to a deformation of ~95% and annealed at 900° C. for 2 hrs. FIG. 24 shows a (111) X-ray pole figure for the Ni-7% Cr-2% Al sample annealed at 900° C., indicating a fully developed cube texture of orientation {100}<100>. FIG. 25 shows magnetic susceptibility data for a cube textured, Ni-7% Cr-2% Al alloy. Open circles are imaginary components and closed circles are real components of the susceptibility. The Curie temperature has dropped to ~175 K. FIG. 26 shows a stress-dispacement for a cube textured Ni-7% Cr-2% Al sample. The 0.5% offset yield stress is slightly over 100 MPa and the ultimate tensile stress is 310 MPa. FIG. 27 shows a θ-2θ plot for a Ni-7% Cr-4% Al alloy, rolled to a deformation of ~95% and annealed at 900° C. for 2 hrs. FIG. 28 shows a (111) X-ray pole figure for the Ni-7% Cr-4% Al sample annealed at 900° C., indicating a fully developed cube texture of orientation {100}<100>. FIG. 29 shows magnetic susceptibility data for a cube textured, Ni-7% Cr-4% Al alloy. Open circles are imaginary components and closed circles are real components of the susceptibility. The Curie temperature has dropped to ~100 K. It is clear that increasing the Al additions while keeping the Cr addition to 7%, decreases the Curie point and increases the strength. However, after a certain point the alloy can longer be fully cube textured. FIG. 30 shows a (111) X-ray pole figure for the Ni-7% Cr-10% Al sample annealed at 900° C., indicating that a fully developed cube texture is not obtained. Hence in this ternary Ni alloy containing 7% Cr, the Al additions have to be less than 10% in order to obtain a good cube texture. FIG. 31 shows magnetic susceptibility data for a cube textured, Ni-7% Cr-4% Al alloy indicating that the alloy is almost non-magnetic. An alloy containing Ni-% Cr with Al additions between 4% and 10% is likely to get the Curie point below 77 K (which is the ideal for applications) and the alloy can still be fully cube textured.

Figure 32:
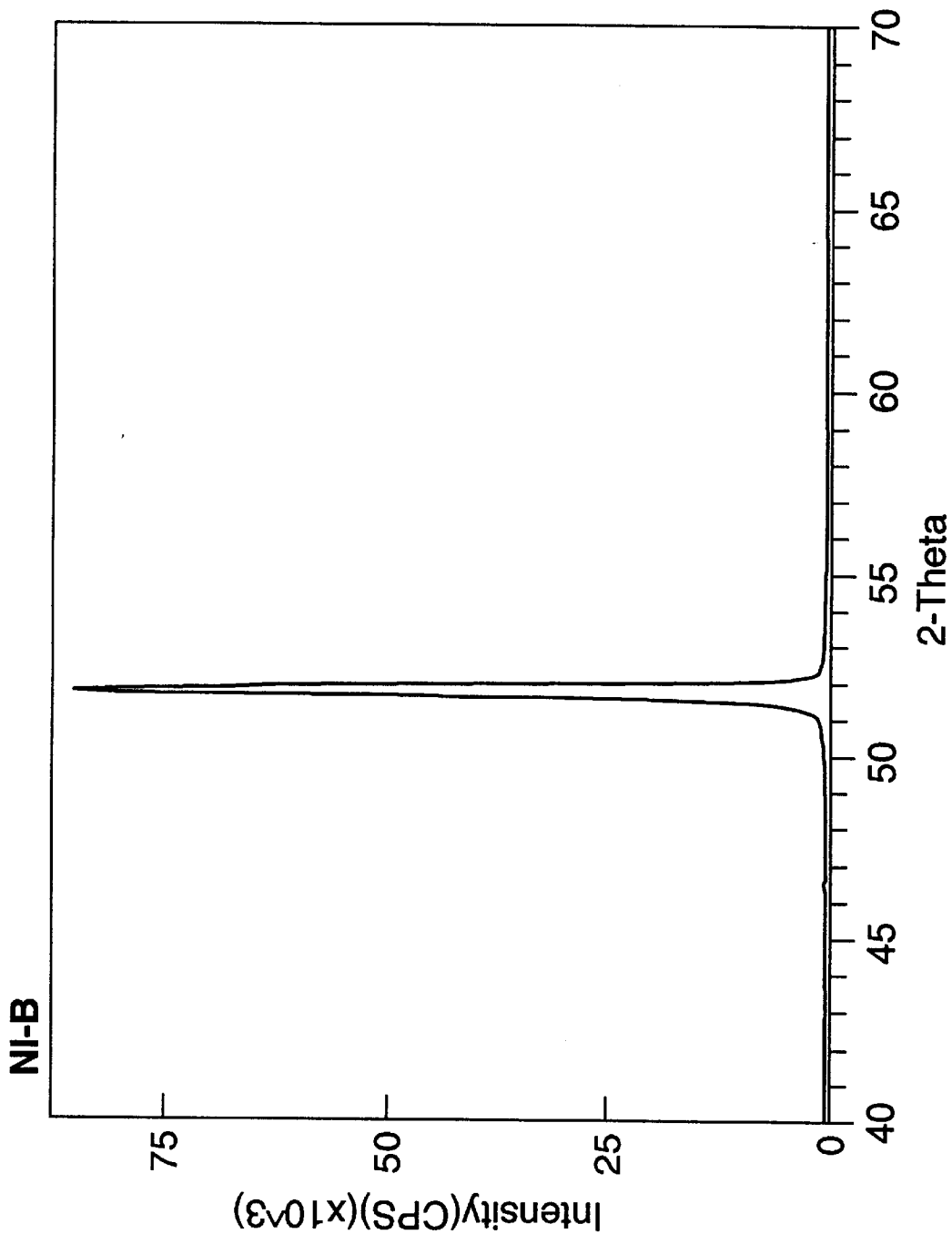
FIG. 32 shows a θ-2θ plot for a Ni-13% Cr-2% Al ternary alloy, rolled to a deformation of ~95% and annealed at 900° C. for 2 hrs. Note that only a (200) reflection is observed indicating a sharp texture.
Figure 33:
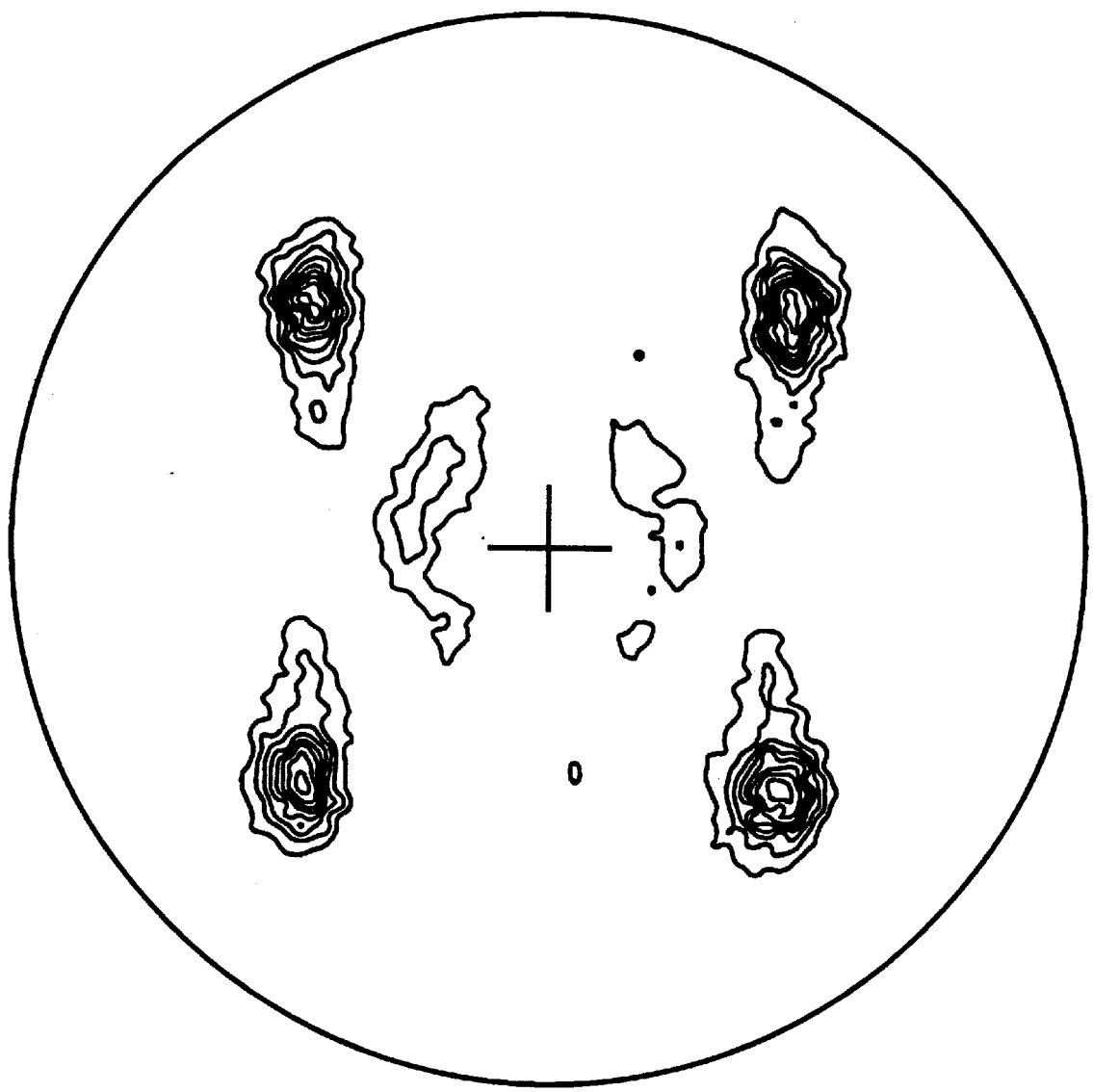
FIG. 33 shows a (111) X-ray pole figure for the sample shown in FIG. 32.
Figure 34:
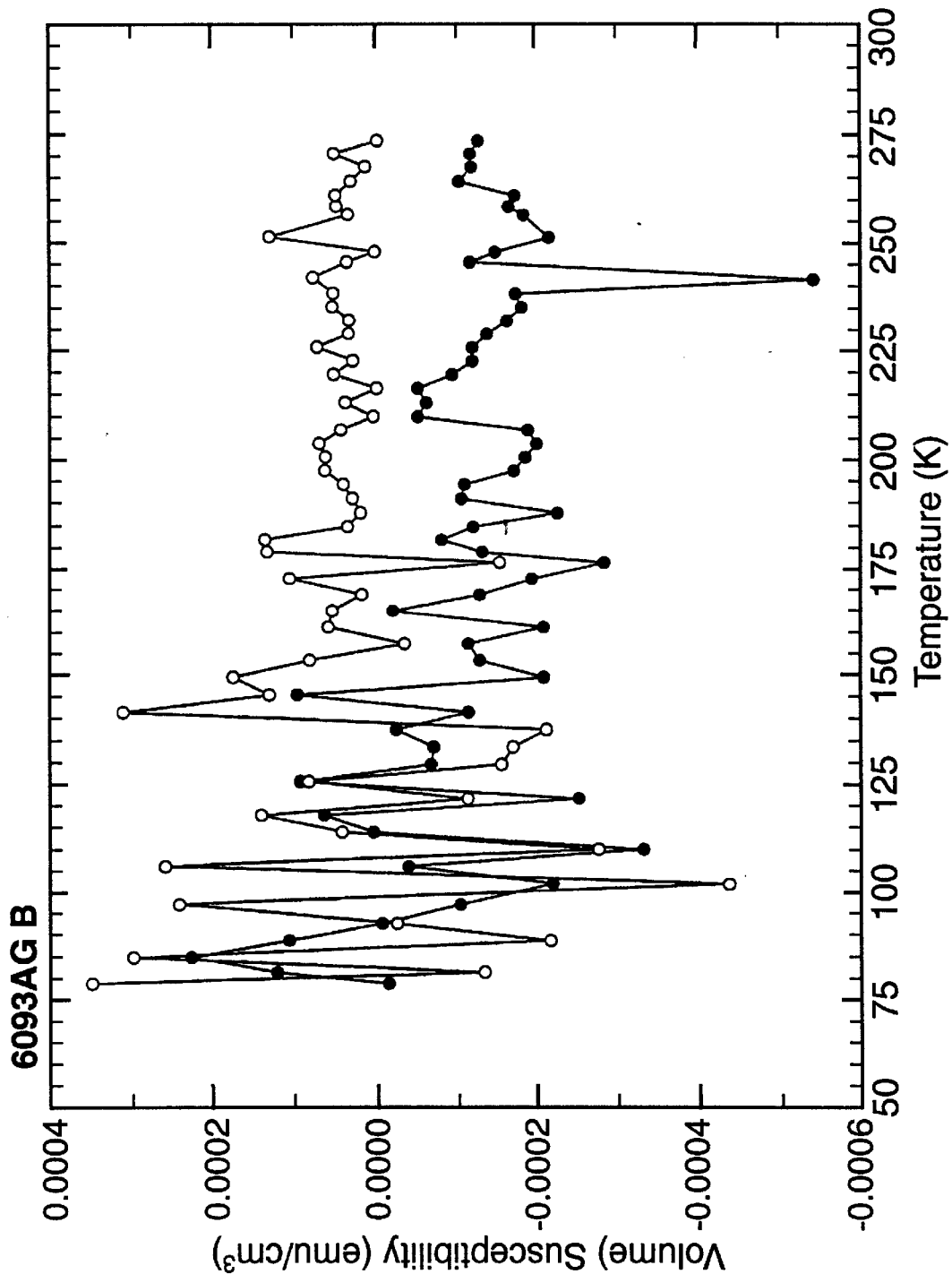
FIG. 34 shows magnetic susceptibility data for a cube textured Ni-13% Cr-2% Al ternary alloy sample. Open circles are imaginary components and closed circles are real components of the susceptibility. The sample is essentially non-magnetic above 77 K.
Figure 35:
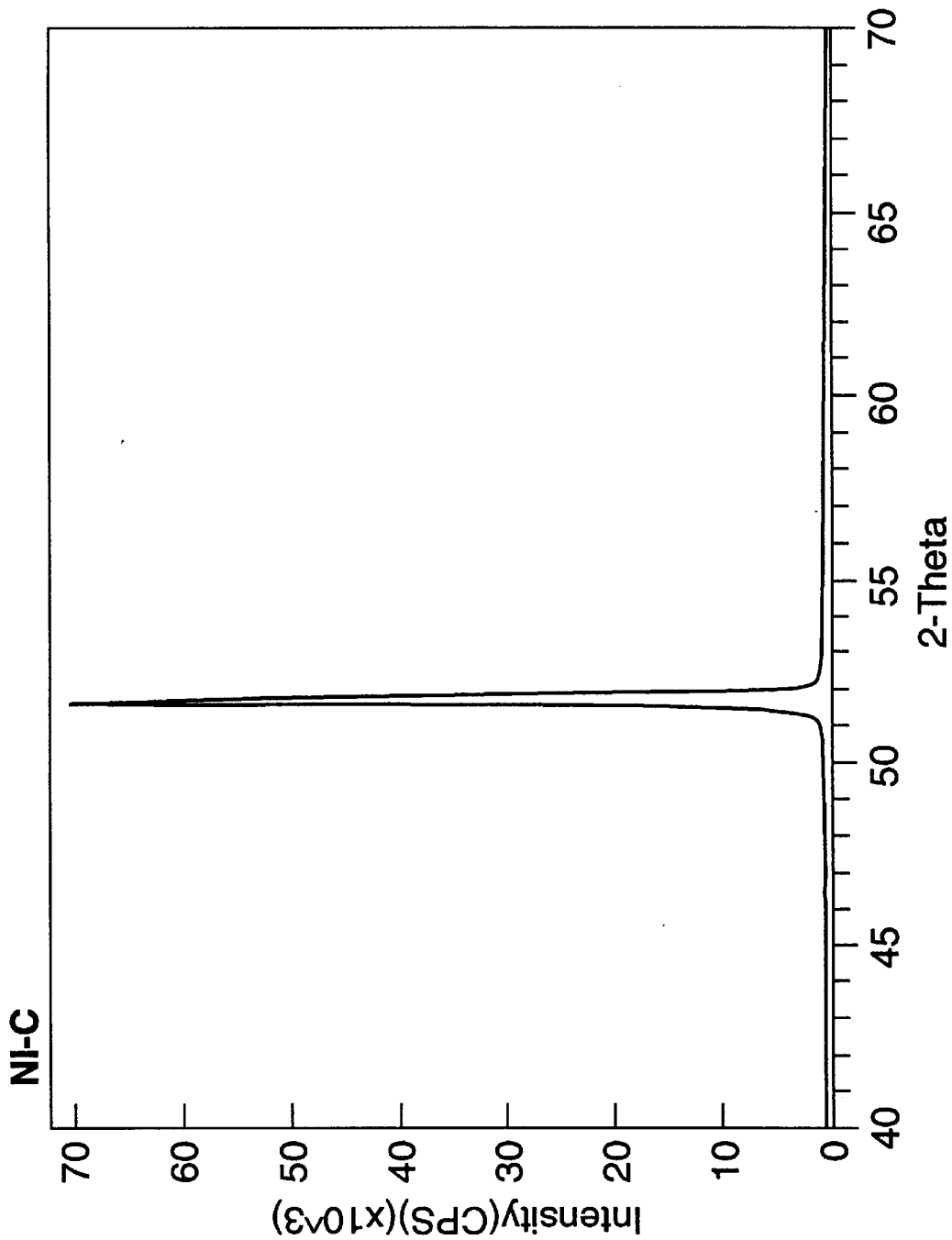
FIG. 35 shows a θ-2θ plot for a Ni-13% Cr-4% Al ternary alloy, rolled to a deformation of ~95% and annealed at 900° C. for 2 hrs. Note that only a (200) reflection is observed indicating a sharp texture.
Figure 36:
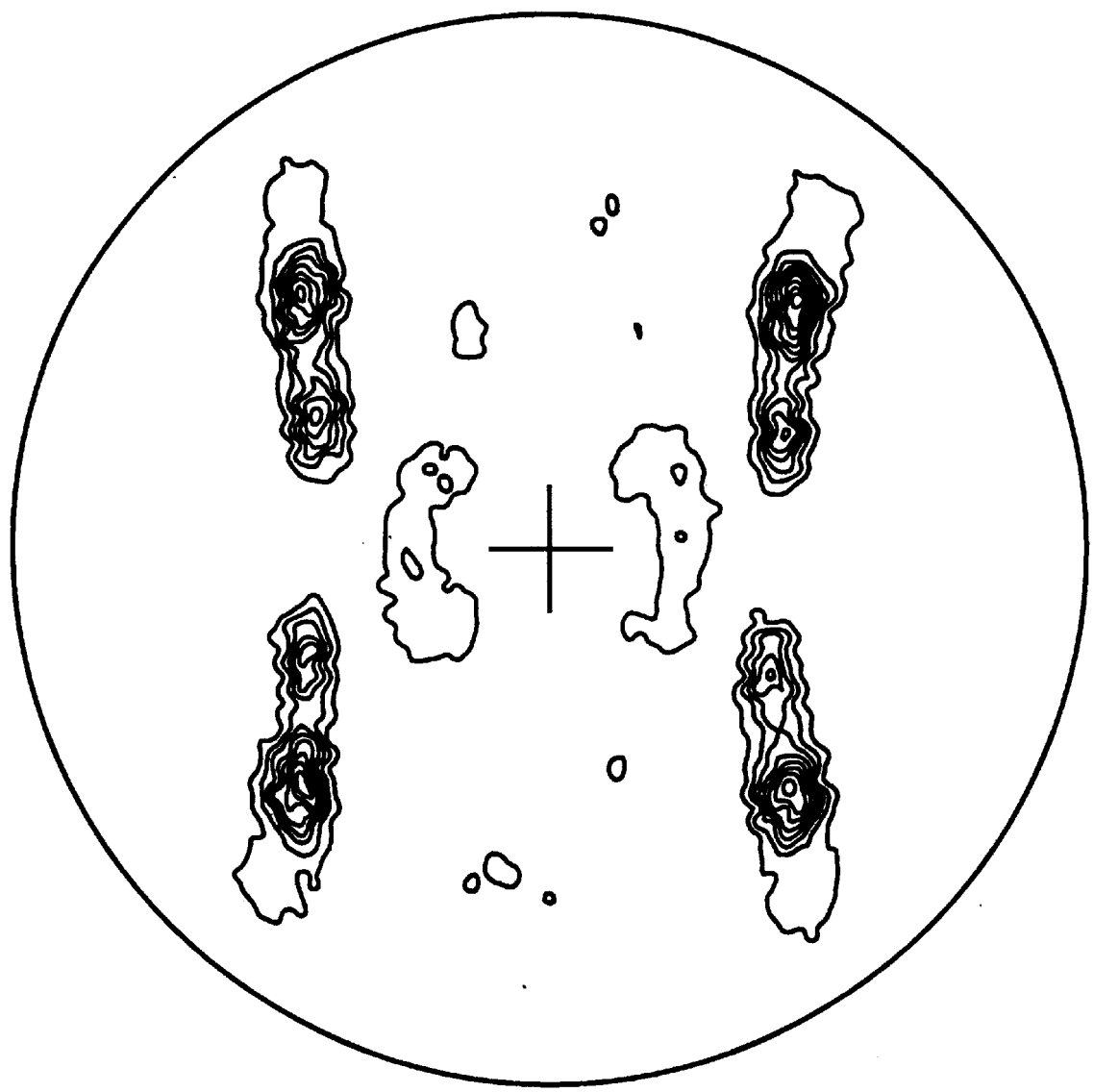
FIG. 36 shows a (111) pole figure for a predominantly cube textured Ni-13% Cr-4% Al ternary alloy, deformed to ~95% reduction by rolling followed by annealing at 900° C. for 2 hours.
Figure 37:
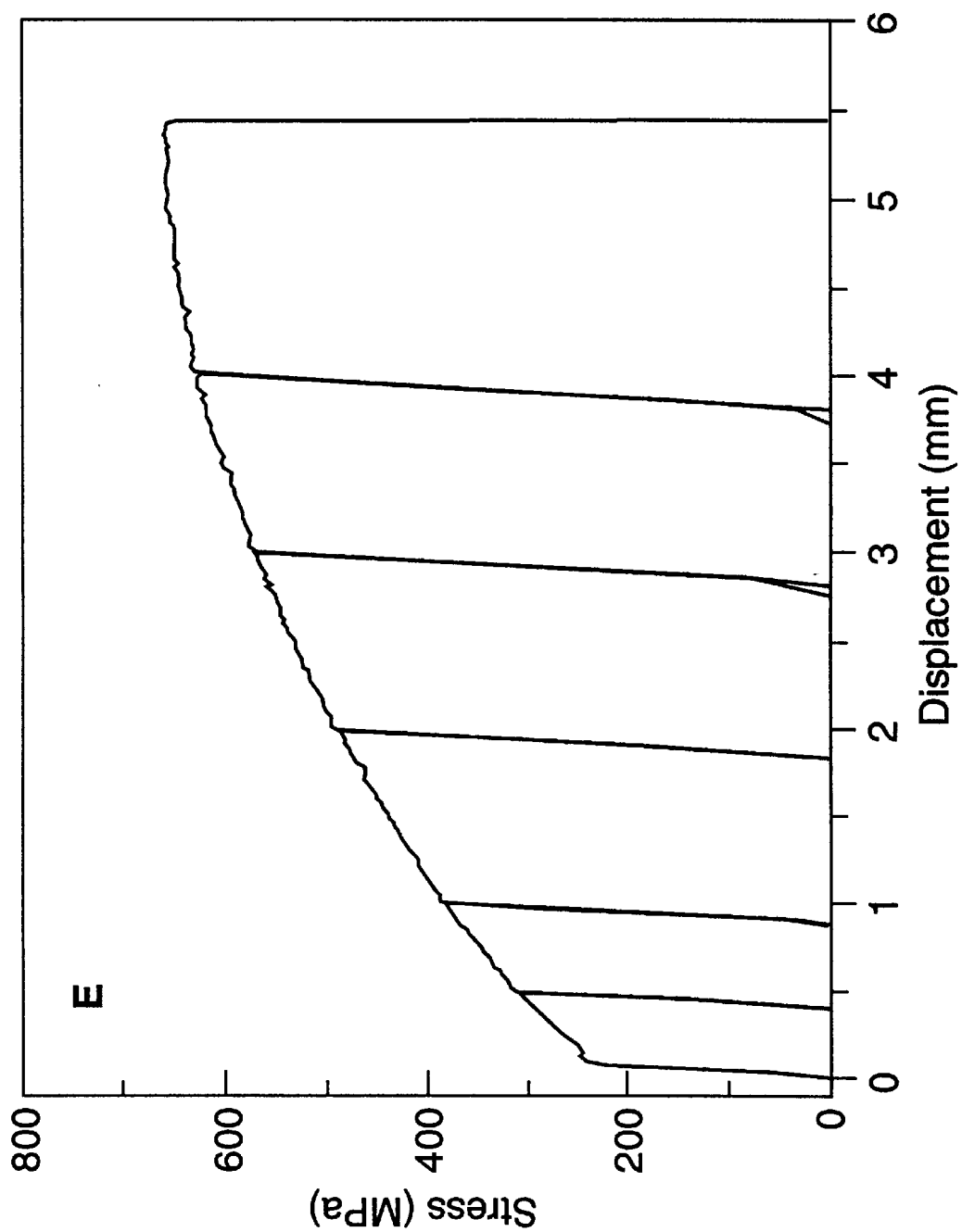
FIG. 37 shows a stress-displacement curve taken in tension on a standard dog bone, tensile, cube textured Ni-13%

FIG. 32 shows a θ-2θ plot for a Ni-13% Cr-2% Al alloy, rolled to a deformation of ~95% and annealed at 900° C. for 2 hrs. FIG. 33 shows a (111) X-ray pole figure for the Ni-7% Cr-2% Al sample annealed at 900° C., indicating a fully developed cube texture of orientation {100}<100>. FIG. 34 shows magnetic susceptibility data for a cube textured, Ni-13% Cr-2% Al alloy. Open circles are imaginary components and closed circles are real components of the susceptibility. The is essentially non-magnetic above 77 K. FIG. 35 shows a θ-2θ plot for a Ni-13% Cr-4% Al alloy, rolled to a deformation of ~95% and annealed at 900° C. for 2 hrs. FIG. 36 shows a (111) X-ray pole figure for the Ni-13% Cr-4% Al sample annealed at 900° C., indicating a cube texture of orientation {100}<100>. FIG. 37 shows a stress-dispacement for a cube textured Ni-13% Cr-4% Al sample. The 0.5% offset yield stress is slightly over 220 MPa and the ultimate tensile stress is 657 MPa. FIG. 38 shows magnetic susceptibility data for a cube textured, Ni-13% Cr-4% Al alloy. Open circles are imaginary components and closed circles are real components of the susceptibility. The sample is essentially non-magnetic above 77 K. It is clear that increasing the Al additions while keeping the Cr addition to 13%, decreases the Curie point and increases the strength. However, after a certain point the alloy can longer be fully cube textured. FIG. 39 shows a θ-2θ plot for a Ni-13% Cr-4% Al alloy, rolled to a deformation of ~95% and annealed at 900° C. for 2 hrs. No cube texture is present. Hence in this ternary Ni alloy containing 13% Cr, the Al additions have to be significantly less than 10% in order to obtain a good cube texture.

Example 5

Ni—W—Al Alloys

A method of texturing Ni with up to 10% W and 4% Al was performed using the following conditions: Grain size <1000 μm, preferably 5 μm; Reverse rolling; Percentage deformation: >95%; Annealing temperature >800° C. FIG. 40 shows a (111) X-ray pole figure for a Ni-5% W-2% Al rolled to a deformation of ~95% and annealed at 900° C. for 2 hrs, indicating a fully developed cube texture of orientation {100}<100>. FIG. 41 shows magnetic susceptibility data for a cube textured, Ni-5% W-2% Al alloy. Open circles are imaginary components and closed circles are real components of the susceptibility. The Curie temperature has dropped to ~260 K. FIG. 42 shows a (111) X-ray pole figure for a Ni-5% W-2% Al rolled to a deformation of ~95% and annealed at 900° C. for 2 hrs, indicating a fully developed cube texture of orientation {100}<100>. FIG. 43 shows magnetic susceptibility data for a cube textured, Ni-5% W-2% Al alloy. Open circles are imaginary components and closed circles are real components of the susceptibility. The Curie temperature has dropped to ~180 K. FIG. 44 and 45 show magnetic susceptibility data for cube textured, Ni-10% W-2% Al and Ni-10% W4% Al alloys. Although both these alloys are essentially non-magnetic at 77 K, a fully developed cube texture is not obtained. Hence a composition in the phase space outlined is the appropriate one to work with as a substrate composition.

Example 6

Ni—Cu Alloys

A method of texturing Ni with up to 55% Cu was performed using the following conditions: Grain size <1000 μm, preferably 5 μm; Reverse rolling; Percentage deformation: >95%; Annealing temperature >800° C. FIG. 46 shows a θ-2θ plot for a Ni-30% Cu alloy, rolled to a deformation of ~95% and annealed at 900° C. for 2 hrs. FIG. 47 shows a (111) X-ray pole figure for the Ni-30% Cu sample annealed at 900° C., indicating a fully developed cube texture of orientation {100}<100>.

Example 7

Epitaxial Buffer Layers On Textured Substrates With Reduced Magnetism and Increased Strength.

FIG. 48 show X-ray phi-scans of buffer layers deposited on a cube textured Ni-13% Cr sample using electron beam evaporation. Conditions used in the deposition are similar to those employed for depositing the same layers on Ni as indicated in reference 15. Note that both the $CeO_2$ as well as the YSZ layers are completely cube textured, indicating that suitable epitaxial oxide layers can be grown on these textured alloy substrates.

Example 8

Epitaxial Superconducting Film On Buffered Layers Textured Substrates With Reduced Magnetism and Increased Strength.

FIG. 49 show X-ray phi-scans of buffer layers and YBCO superconducting films deposited on a cube textured Ni-7% Cr sample using laser ablation as indicated in reference 14. Conditions used in the deposition are similar to those employed for depositing the same layers on Ni previously. Note that all the oxide layers are completely epitaxial with the texture alloy substrate. The in-plane texture for all the layers is ~10 degrees. When a thin layer of $CeO_2$ not indicated in the phi-scans of FIG. 49 was deposited on the YSZ layer. The film is dense and free of cracks and with a well developed morphology. The transport critical current density of this film was 223,000 $A/cm^2$ at 77 K, 0T.

Example 9

Biaxially Textured Substrates of Desired Composition.

FIG. 50 shows a schematic of a process to make substrates with desired physical properties having compositions in which biaxial texture cannot be easily produced by thermomechanical processing. A reel to reel FCC material like Cu, Ni or Al which can be easily cube textured could be used as a starting template to fabricate very highly textured substrates. Epitaxial alloys are then deposited on the textured template. Alloys with many components can be deposited. An important feature is to use a high rate deposition process such as evaporation through high melting refractories. In such a case, deposition of alloys containing many elements can be done easily using a single target. Sputtering processes can also result in the same result. Of course the same can also be done using a co-evaporation approach.

Example 10

Biaxially Textured Substrates of Desired Composition With Very Thin Cross-sections.

FIG. 51 shows a schematic of a process to make biaxially textured substrates with desired compositions which are difficult to fabricate with sharp biaxial textures and in thin enough cross-sections. In a reel to reel configuration, starting with a belt of either textured substrates or a single crystal belt of a metal made using conventional single crystal growth techniques, a thin layer of a material is deposited epitaxially. The alloy of desired composition is subsequently deposited epitaxially on top of this material. The "material" below the alloy is carefully chosen such that it is soluble in some solvent which does not adversely affect either the template belt below or the alloy. After the deposition of the alloy, the solvent is used to dissolve away the "material" below it and the textured alloy is removed. The cross-section of the alloy can be controlled to whatever is desired. In the example shown in FIG. 51, the layer below the alloy is chosen to be a salt like NaCl or KCl. The salt is water soluble, and a water jet is used to dissolve away the salt layer. In the process shown, a single very well textured belt of a metal can be used to continuously produce reels of textured alloys of desired composition and thickness. Again in this process, deposition of an alloy with many components can be done in many ways. Of particular significance is evaporation through high melting point refractory materials like W and Mo. FIG. 52 shows a variation of the process shown in FIG. 51. In this case the salt layer is deposited at the bottom side of the belt and the alloy layer on the top. Many variations of this basic concept are apparent to anyone skilled in the art.

We claim:

1. A biaxially textured alloy wherein said alloy of texture {100}<100> is formed by rolling and annealing a Ni alloy containing at least one member selected from the group consisting of no more than 15 at % of a Group VB element, no more than 20 at % of Group VIB element, no more than 10 at % of tin (Sn), no more than 10 at % of aluminum (Al), no more than 50 at % of copper (Cu), no more than 25 at % of zinc (Zn), and no more than 12 at % of titanium (Ti), said biaxially textured alloy being characterized by an x-ray diffraction phi scan peak of no more than 30 FWHM.

2. A biaxially textured allow wherein said allow of texture {100}<100> is a Ni allow containing at least one member selected from the group consisting of no more than 15 at % of a Group VB element, no more than 20 at % of Group VIB element, no more than 10 at % of tin (Sn), no more than 10 at % of aluminum (Al), no more than 50 at % of copper (Cu), no more than 25 at % of zinc (Zn), and no more than 12 at % of titanium (Ti), said biaxially textured alloy being characterized by an x-ray diffraction phi scan peak of no more than 30 FWHM, said alloy having a stacking fault frequency parameter less than 0.01 when deformed to at least 60% deformation without any intermediate anneals.

3. A biaxially textured alloy wherein said alloy of texture {100}<100> is formed by rolling and annealing a binary nickel (Ni) alloy containing a member selected from the group consisting of tungsten (W), copper (Cu), aluminum (Al), titanium (Ti), molybdenum (Mo), chromium (Cr), vanadium (V), tantalum (Ta), tin (Sn), and zinc (Zn), said biaxially textured alloy being characterized by an x-ray diffraction phi scan peak of no more than 30 FWHM.

4. A biaxially textured allow wherein said allow of texture {100}<100> is a binary nickel (Ni) allow containing a member selected from the group consiting of tungsten (W), copper (Cu), aluminum (Al), titanium (Ti), molybdenum (Mo), chromium (Cr), vanadium (V), tantalum (Ta), tin (Sn), and zinc (Zn), said biaxially textured alloy being characterized by an x-ray diffraction phi scan peak of no more than 30 FWHM, said alloy having a stacking fault frequency parameter less than 0.01 when deformed to at least 60% deformation by rolling without any intermediate anneals.

5. An alloy of claim 3 wherein said alloy comprises Ni and a member selected from the group consisting of not more than 10 at % W, not more than 16 at % Cr, not more than 10 at % Al, not more than 55 at % Cu, not more than 12 at % Mo, not more than 12 at % Ti, not more than 15 at % V, not more than 10 at % Ta, not more than 10 at % Sn, and not more than 25 at % Zn.

6. A biaxially textured alloy of texture {100}<100> formed by rolling and annealing, wherein said alloy is a ternary or quartenary nickel (Ni) alloy containing at least one member selected from the group consisting of tungsten (W), copper (Cu), aluminum (Al), titanium (Ti), molybdenum (Mo), chromium (Cr), vanadium (V), tantalum (Ta), tin (Sn), and zinc (Zn), said biaxially textured alloy being characterized by an x-ray diffraction phi scan peak of no more than 30 FWHM.

7. An alloy of claim 6 having a stacking fault frequency parameter less than 0.01 when deformed to at least 60% deformation without any intermediate anneals.

8. An alloy of claim 6 wherein said alloy comprises Ni and a member selected from the group consisting of not more than 10 at % W, not more than 16 at % Cr, not more than 10 at % Al, not more than 55 at % Cu, not more than 12 at % Mo, not more than 12 at % Ti, not more than 15 at % V, not more than 10 at % Ta, not more than 10 at % Sn, and not more than 25 at % Zn.

9. An alloy of claim 6 Wherein said alloy comprises Ni and not more than 16 at % Cr and not more than 10 at % Al.

10. An alloy of claim 6 wherein said alloy comprises Ni and not more than 10 at % W and not more than 10 at % Al.

11. A method of forming a biaxially textured alloy article of texture {100}<100>, said biaxially textured alloy being characterized by an x-ray diffraction phi scan peak of no more than 30 FWHM, comprising the steps of:

providing a sheet of an alloy having a stacking fault frequency parameter of no more than 0.01 after deformation of at least 60% and a recrystallization temperature;

deforming said alloy to greater than 90% deformation;

annealing said deformed alloy at a temperature of at least said recrystallization temperature of said alloy.

12. A method as in claim 11, wherein said alloy is a Ni alloy.

13. An biaxially textured alloy formed by rolling and annealing containing at least 60 at % of an FCC metal, said alloy having a stacking fault frequency parameter less than 0.01 when deformed to at least 60% deformation without any intermediate anneals.

14. An alloy of claim 13 wherein said FCC metal is Cu.

15. An alloy of claim 13 wherein said FCC metal is Al.

16. An alloy of claim 13 wherein said FCC metal is Ni.

17. An alloy of claim 16 wherein said alloy further comprises at least one member selected from the group consisting of not more than 10 at % W, not more than 16 at % Cr, not more than 10 at % Al, not more than 55 at % Cu, not more than 10 at % Mo, not more than 12 at % Ti, not more than 15 at % V, not more than 10 at % Ta, and not more than 10 at % Sn.

18. A biaxially textured Ni alloy containing a BCC metal, said alloy having a total concentration of any one alloying addition no greater than 20 at %, wherein said texture is formed by rolling and annealing said alloy.

19. A biaxially textured Ni allow containing a BCC metal, said alloy having a total concentration of any one alloying addition no greater than 20 at %, said alloy having a stacking fault frequency parameter less than 0.01 when deformed to 60% deformation by rolling without any intermediate anneals.

20. An alloy of claim 18 wherein said alloy further comprises a member selected from the group consisting of not more than 10 at % W, not more than 16 at % Cr, not more than 10 at % Mo, not more than 10 at % Ta, and not more than 15 at % V.

* * * * *